(12) United States Patent
Yamazaki et al.

(10) Patent No.: US 10,199,394 B2
(45) Date of Patent: Feb. 5, 2019

(54) DISPLAY DEVICE

(71) Applicant: Semiconductor Energy Laboratory Co., Ltd., Kanagawa-ken (JP)

(72) Inventors: Shunpei Yamazaki, Tokyo (JP); Hiroyuki Miyake, Kanagawa (JP); Masahiro Katayama, Tochigi (JP)

(73) Assignee: Semiconductor Energy Laboratory Co., Ltd. (JP)

(*) Notice: Subject to any disclaimer, the term of this patent is extended or adjusted under 35 U.S.C. 154(b) by 324 days.

(21) Appl. No.: 14/519,524

(22) Filed: Oct. 21, 2014

(65) Prior Publication Data

US 2015/0108474 A1    Apr. 23, 2015

(30) Foreign Application Priority Data

Oct. 22, 2013 (JP) ................ 2013-219678
Oct. 22, 2013 (JP) ................ 2013-219685
(Continued)

(51) Int. Cl.
*H01L 29/78* (2006.01)
*H01L 27/12* (2006.01)
*H01L 29/786* (2006.01)

(52) U.S. Cl.
CPC ...... *H01L 27/1225* (2013.01); *H01L 29/7869* (2013.01); *H01L 29/78606* (2013.01); *H01L 29/78648* (2013.01)

(58) Field of Classification Search
CPC .............. H01L 27/1225; H01L 27/124; H01L 27/1255; H01L 27/3248; H01L 27/3293
(Continued)

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

CN    101752390 A    6/2010
CN    103367455 A    10/2013
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Jarrett Stark
(74) *Attorney, Agent, or Firm* — Husch Blackwell LLP

(57) ABSTRACT

Provided is a display device with high display quality. The display device includes a transistor over a substrate, an inorganic insulating film over the transistor, an organic insulating film over the inorganic insulating film, a capacitor electrically connected to the transistor, and a pixel electrode over the organic insulating film. The transistor includes a gate electrode over the substrate, an oxide semiconductor film overlapping with the gate electrode, a gate insulating film in contact with one surface of the oxide semiconductor film, and a pair of conductive films in contact with the oxide semiconductor film. The capacitor includes a metal oxide film over the gate insulating film, the inorganic insulating film, and a first light-transmitting conductive film over the inorganic insulating film. The pixel electrode is formed of a second light-transmitting conductive film and in contact with one of the pair of conductive films and the first light-transmitting conductive film.

12 Claims, 60 Drawing Sheets

(30) Foreign Application Priority Data

Feb. 28, 2014 (JP) ................................ 2014-038564
Feb. 28, 2014 (JP) ................................ 2014-038696

(58) Field of Classification Search
USPC .......................................................... 257/43
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,940,345 B2 | 5/2011 | Yamazaki |
| 8,476,625 B2 | 7/2013 | Kimura |
| 8,502,220 B2 | 8/2013 | Yamazaki et al. |
| 8,592,814 B2 | 11/2013 | Yamazaki et al. |
| 8,686,426 B2 | 4/2014 | Ahn et al. |
| 8,796,683 B2 | 8/2014 | Yamazaki |
| 8,872,751 B2 | 10/2014 | Kimura et al. |
| 8,927,985 B2 | 1/2015 | Matsukura |
| 8,937,307 B2 | 1/2015 | Yamazaki |
| 8,953,112 B2 | 2/2015 | Miyake |
| 8,975,695 B2 | 3/2015 | Yamazaki |
| 8,981,372 B2 | 3/2015 | Yamazaki |
| 8,981,374 B2 | 3/2015 | Kubota et al. |
| 8,987,731 B2 | 3/2015 | Yamazaki |
| 8,994,024 B2 | 3/2015 | Yamazaki et al. |
| 8,999,750 B2 | 4/2015 | Kimura |
| 9,018,624 B2 | 4/2015 | Yamazaki |
| 9,190,424 B2 | 11/2015 | Yamazaki et al. |
| 9,196,639 B2 | 11/2015 | Endo |
| 9,201,280 B2 | 12/2015 | Kimura |
| 9,202,827 B2 | 12/2015 | Koyama et al. |
| 9,230,994 B2 | 1/2016 | Miyake |
| 9,231,002 B2 | 1/2016 | Oikawa et al. |
| 9,246,047 B2 | 1/2016 | Yamazaki |
| 9,268,185 B2 | 2/2016 | Kimura et al. |
| 9,293,480 B2 | 3/2016 | Yamazaki et al. |
| 9,368,541 B2 | 6/2016 | Kurokawa et al. |
| 9,443,888 B2 | 9/2016 | Koyama et al. |
| 9,553,201 B2 | 1/2017 | Ahn et al. |
| 9,576,983 B2 | 2/2017 | Kimura et al. |
| 9,639,211 B2 | 5/2017 | Kurokawa et al. |
| 9,941,310 B2 | 4/2018 | Koyama et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0141203 A1 | 6/2009 | Son et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0310050 A1* | 12/2009 | Shin .................. G02F 1/136213 349/39 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0140613 A1 | 6/2010 | Kimura |
| 2010/0163874 A1* | 7/2010 | Koyama .................. H01L 27/12 257/57 |
| 2010/0165255 A1* | 7/2010 | Ishitani et al. .................. 349/69 |
| 2010/0224880 A1* | 9/2010 | Kimura ............... H01L 27/1225 257/59 |
| 2011/0012116 A1 | 1/2011 | Yamazaki et al. |
| 2013/0256653 A1 | 10/2013 | Ahn et al. |
| 2014/0014948 A1 | 1/2014 | Matsukura |
| 2014/0034954 A1 | 2/2014 | Yamazaki et al. |
| 2014/0061636 A1 | 3/2014 | Miyake et al. |
| 2014/0061654 A1 | 3/2014 | Yamazaki et al. |
| 2014/0063368 A1 | 3/2014 | Yamazaki et al. |
| 2014/0070209 A1 | 3/2014 | Yamazaki et al. |
| 2014/0175432 A1 | 6/2014 | Yamazaki et al. |
| 2014/0175433 A1 | 6/2014 | Yamazaki et al. |

(56) References Cited

U.S. PATENT DOCUMENTS

| | | | |
|---|---|---|---|
| 2014/0175436 | A1 | 6/2014 | Yamazaki |
| 2014/0183528 | A1 | 7/2014 | Endo |
| 2014/0241487 | A1 | 8/2014 | Yamazaki et al. |
| 2014/0299874 | A1 | 10/2014 | Yamazaki |
| 2014/0306219 | A1 | 10/2014 | Yamazaki et al. |
| 2014/0313446 | A1 | 10/2014 | Kubota |
| 2014/0333864 | A1 | 11/2014 | Miyake et al. |
| 2014/0339539 | A1 | 11/2014 | Yamazaki et al. |
| 2014/0357019 | A1 | 12/2014 | Koyama et al. |
| 2014/0362317 | A1 | 12/2014 | Kubota et al. |
| 2014/0362324 | A1 | 12/2014 | Yamazaki et al. |
| 2014/0377893 | A1 | 12/2014 | Ishitani et al. |
| 2015/0014681 | A1 | 1/2015 | Yamazaki |
| 2015/0053973 | A1 | 2/2015 | Yamazaki et al. |
| 2015/0062477 | A1 | 3/2015 | Hatsumi et al. |
| 2015/0076492 | A1 | 3/2015 | Kubota et al. |
| 2015/0109553 | A1 | 4/2015 | Kubota |
| 2015/0115259 | A1 | 4/2015 | Yamazaki et al. |
| 2015/0129865 | A1 | 5/2015 | Miyamoto et al. |
| 2016/0358950 | A1 | 12/2016 | Koyama et al. |
| 2017/0162161 | A1 | 6/2017 | Kimura et al. |
| 2018/0138283 | A1 | 5/2018 | Kimura |

FOREIGN PATENT DOCUMENTS

| | | |
|---|---|---|
| CN | 104170069 A | 11/2014 |
| EP | 1737044 A | 12/2006 |
| EP | 2 202 802 A1 | 6/2010 |
| EP | 2226847 A | 9/2010 |
| EP | 2 515 337 A1 | 10/2012 |
| EP | 2 648 221 A2 | 10/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-96055 | 4/2007 |
| JP | 2007-123861 | 5/2007 |
| JP | 2010-156963 A | 7/2010 |
| JP | 2010-170119 A | 8/2010 |
| JP | 2010-171394 A | 8/2010 |
| JP | 2010-232652 A | 10/2010 |
| JP | 2010-252318 A | 11/2010 |
| JP | 2011-044696 A | 3/2011 |
| JP | 2011-118888 A | 6/2011 |
| JP | 2012-083738 A | 4/2012 |
| JP | 2013-214701 A | 10/2013 |
| KR | 2010-0065110 A | 6/2010 |
| KR | 2013-0111874 A | 10/2013 |
| TW | 201036163 | 10/2010 |
| TW | 201123420 | 7/2011 |
| TW | 201342618 | 10/2013 |
| WO | WO-2004/114391 | 12/2004 |
| WO | WO 2011/010545 A1 | 1/2011 |
| WO | WO 2011/055638 A1 | 5/2011 |
| WO | WO 2013/137045 A1 | 9/2013 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YBFE2O4, and YB2FE3O7 Types of Structures for Compounds in the In2O3 and Sc2O3-A2O3-BO Systems [A; Fe, Ga, Or, Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLEO", IDW '06: Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Dis-

(56) References Cited

OTHER PUBLICATIONS play Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07: SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using Igzo Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashim.M et al., "Theoretical Analysis of Igzo Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Pepers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent $InGaZnO4$", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide $InGaO3(ZnO)m$ (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys.Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS MEeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous Gizo ($Ga2O3$—$In2O3$—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

(56) References Cited

OTHER PUBLICATIONS

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

\* cited by examiner

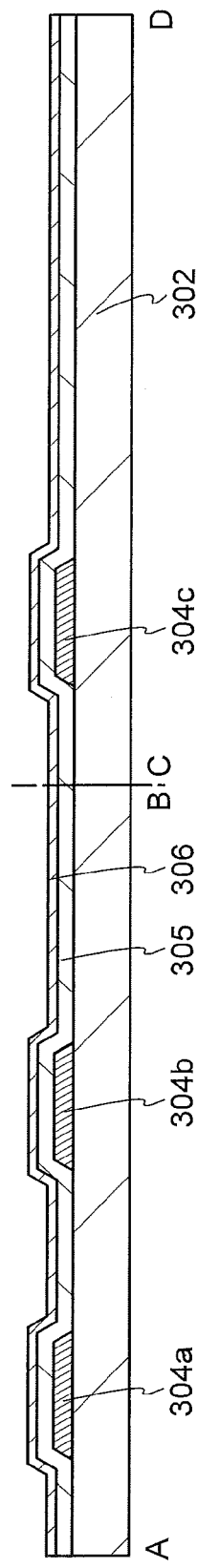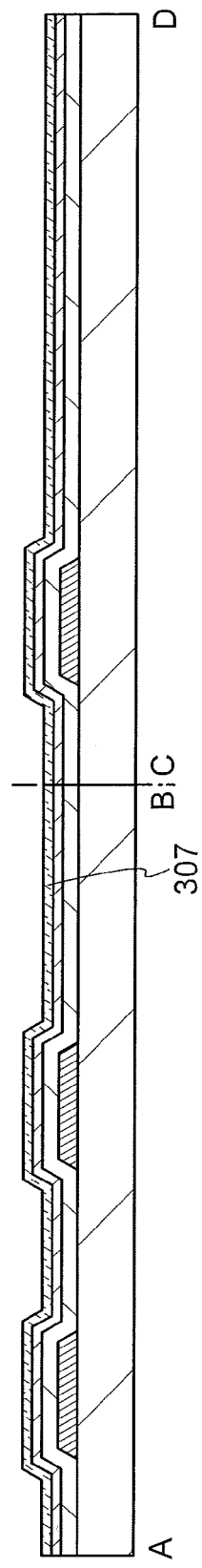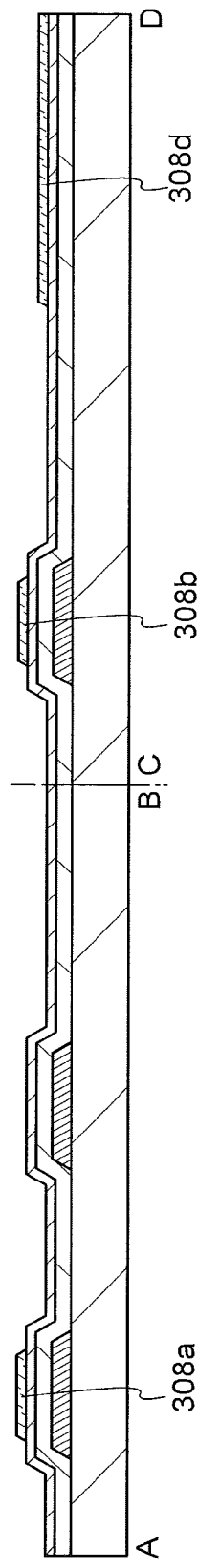

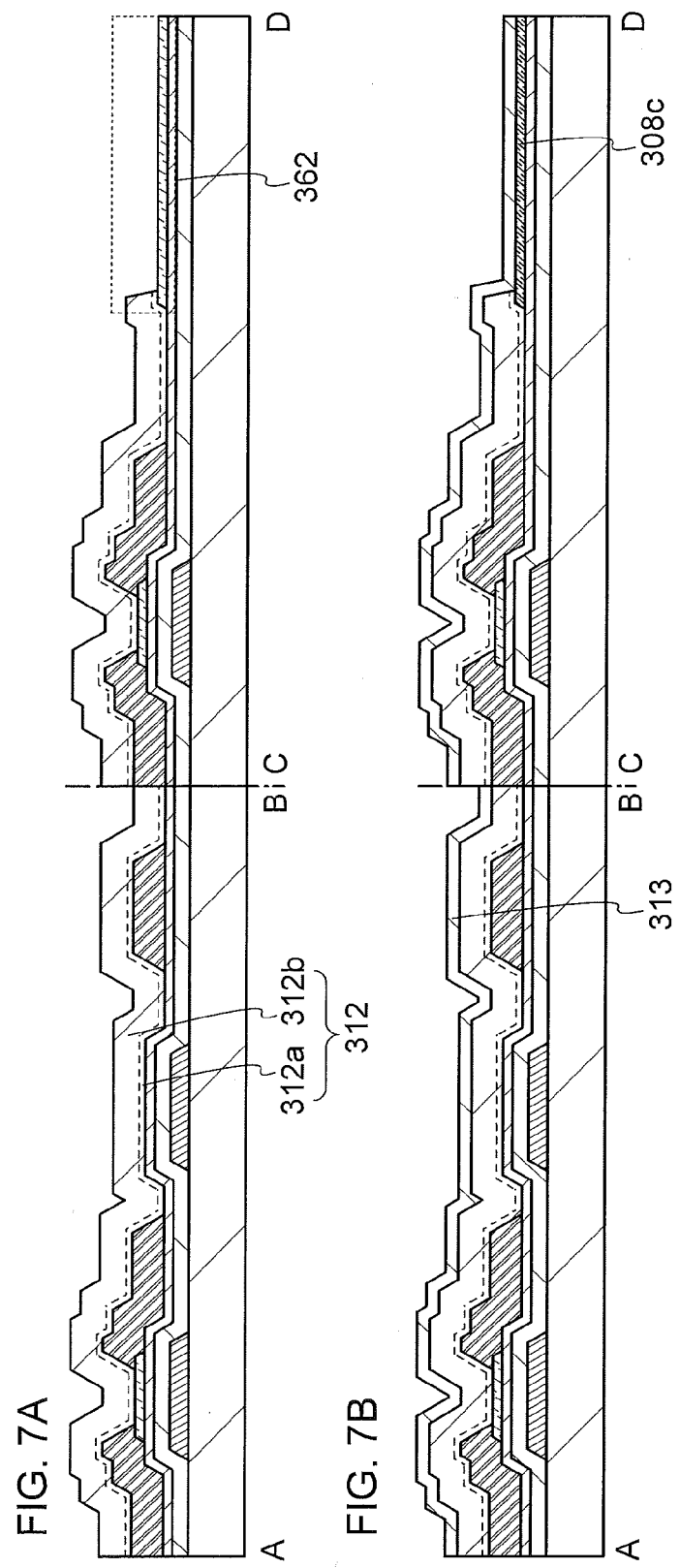

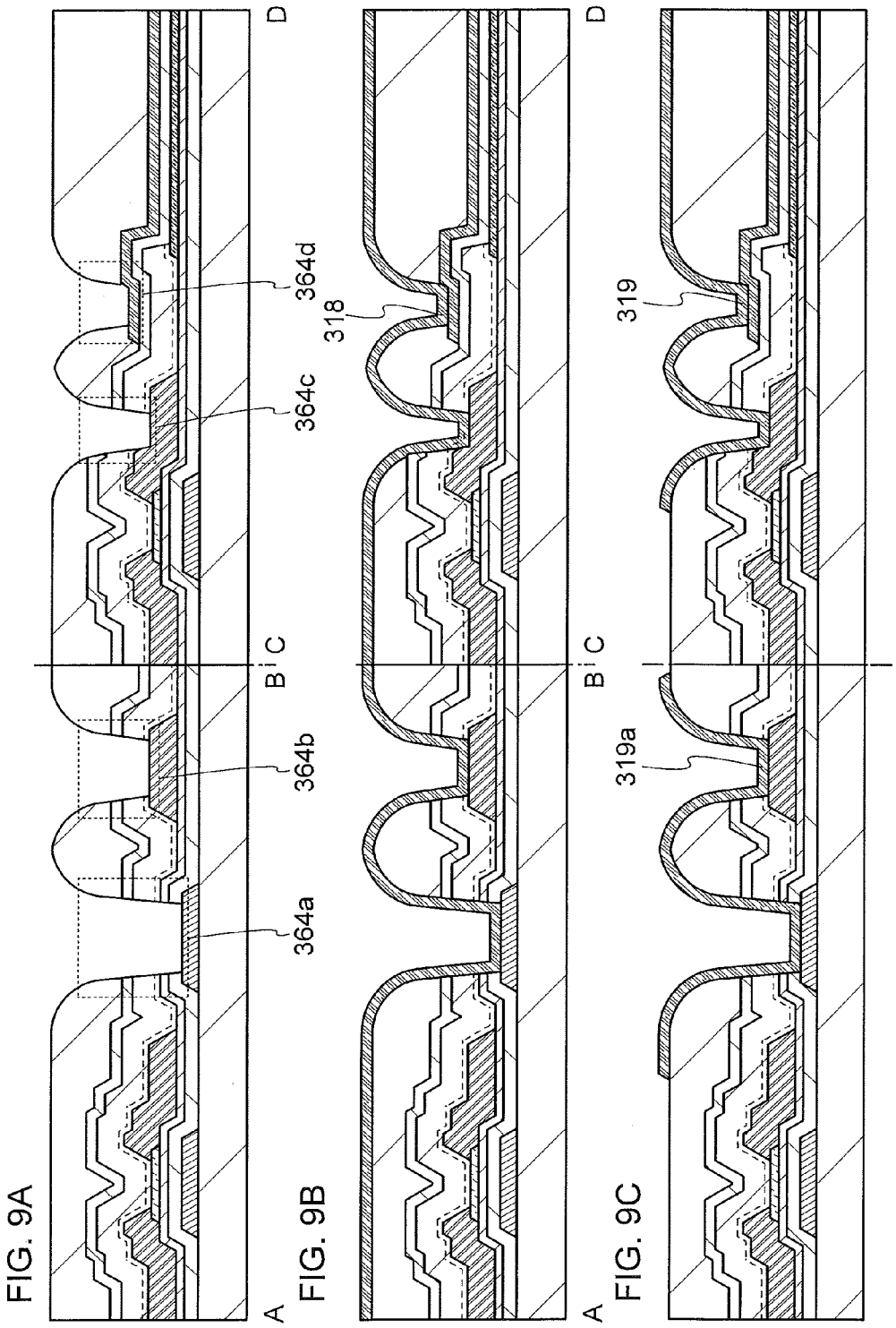

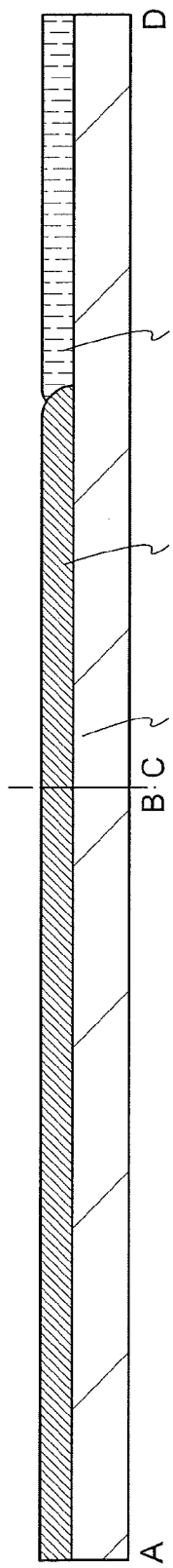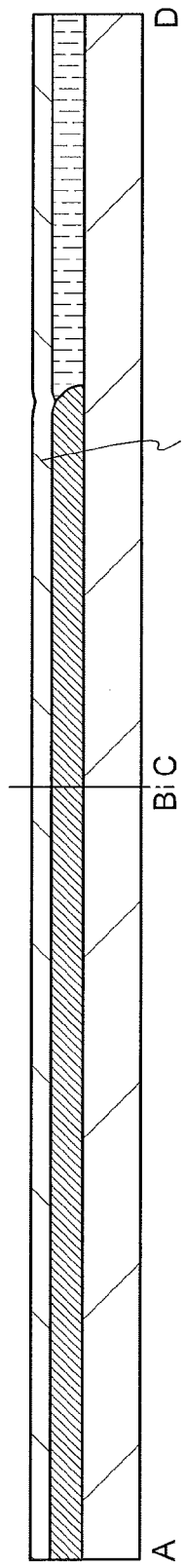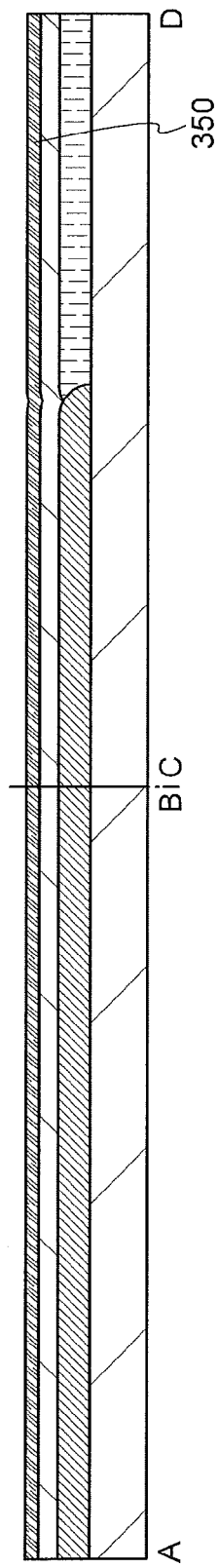

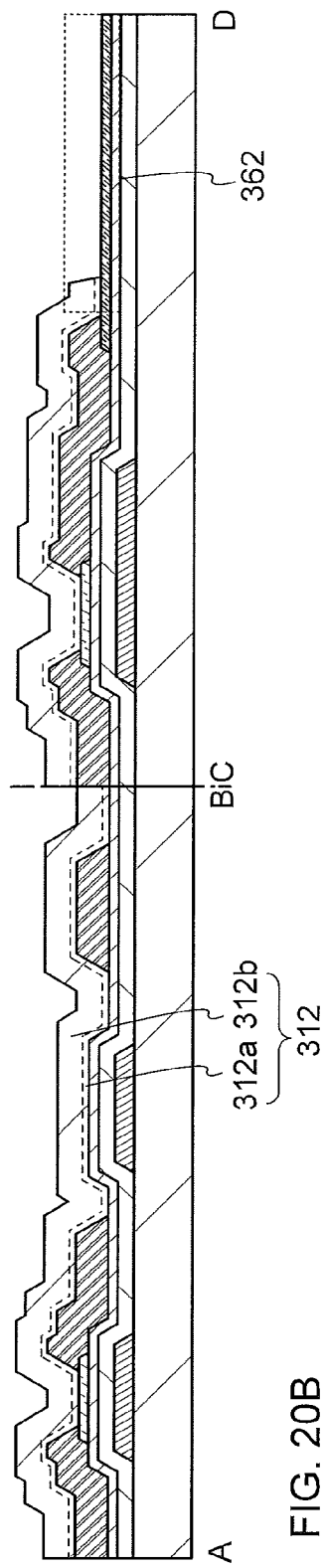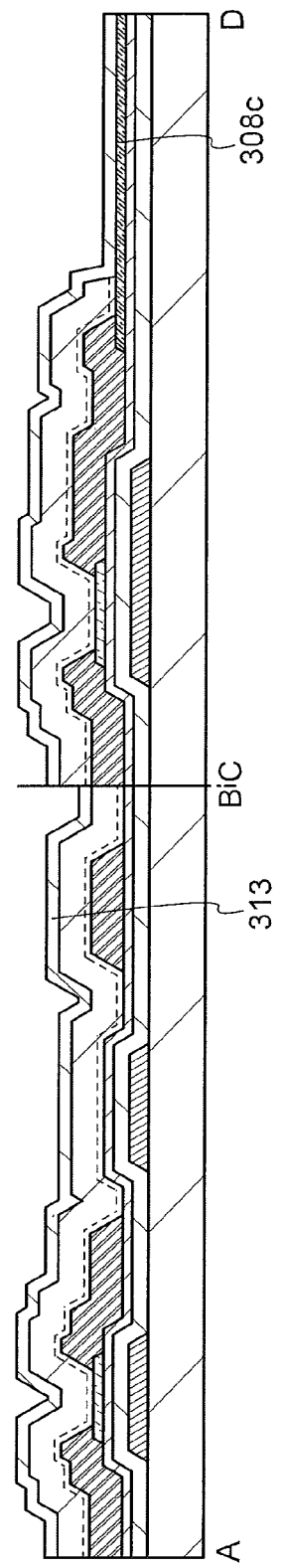

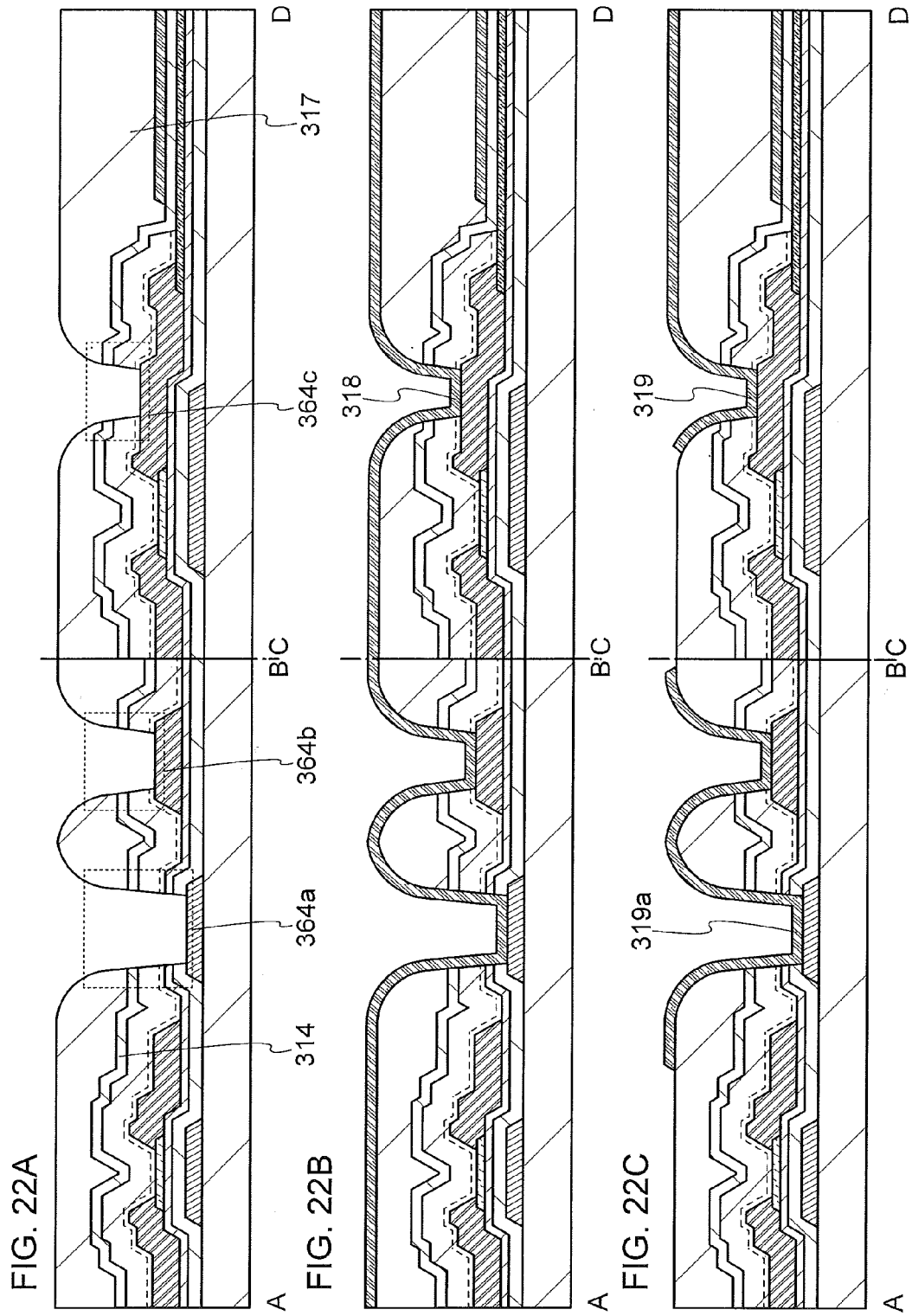

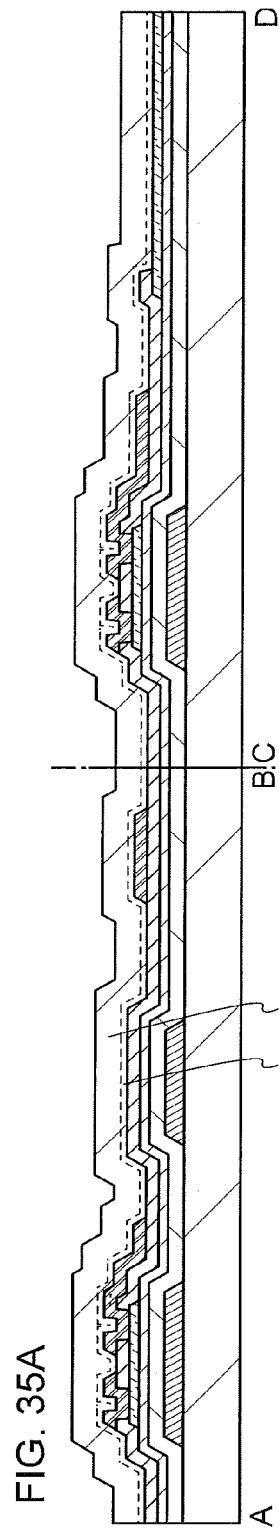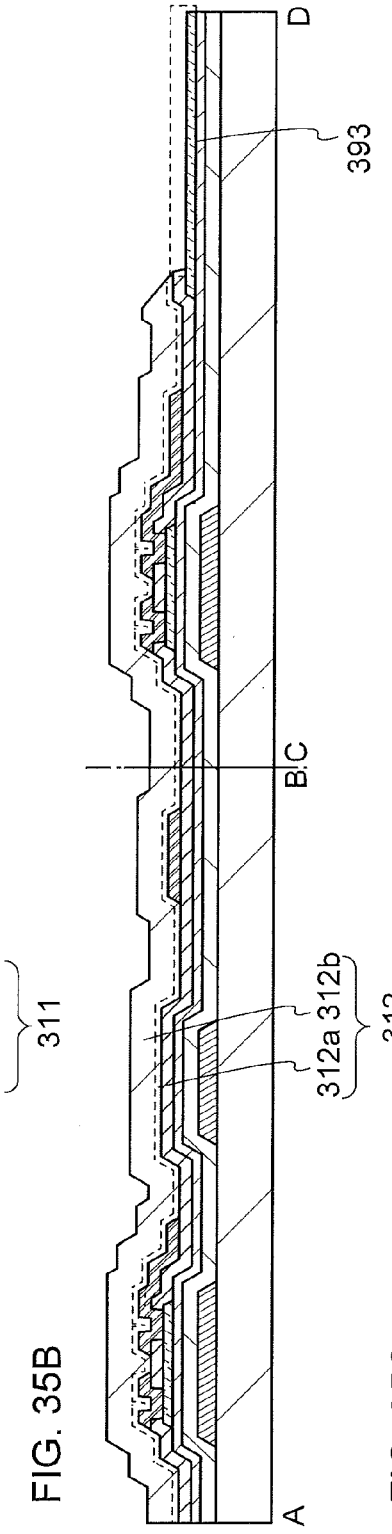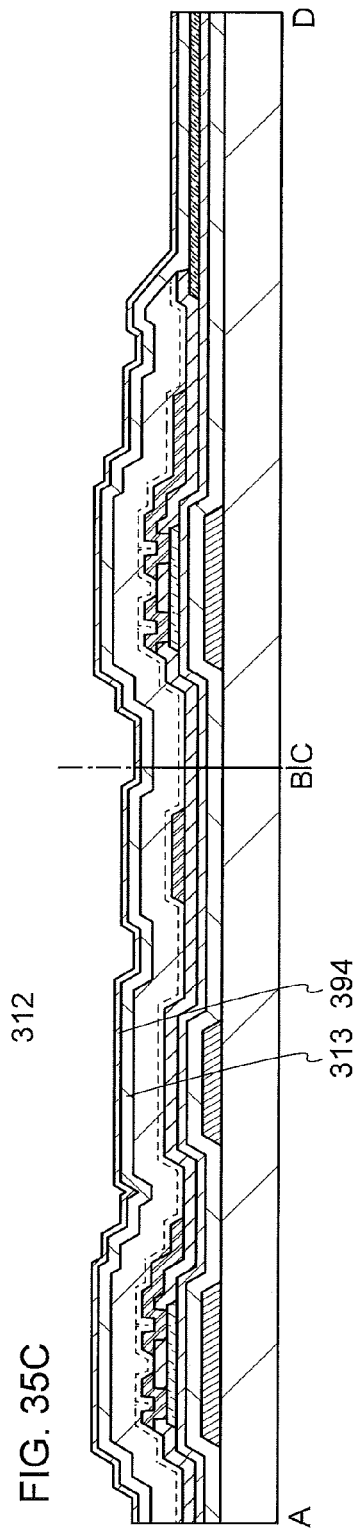

FIG. 45A
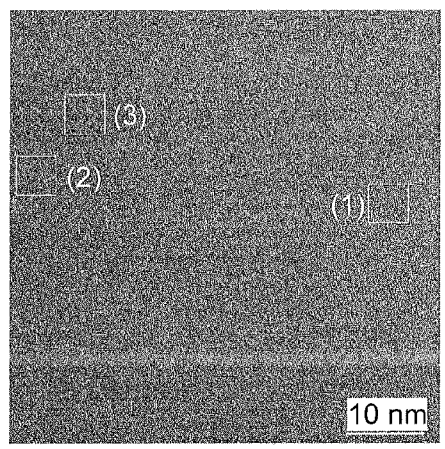
FIG. 45B     FIG. 45C     FIG. 45D
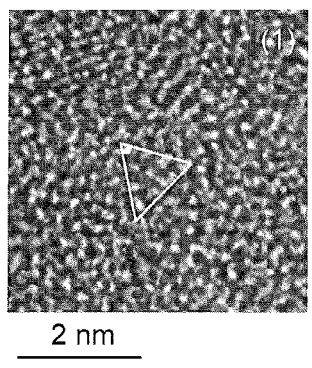 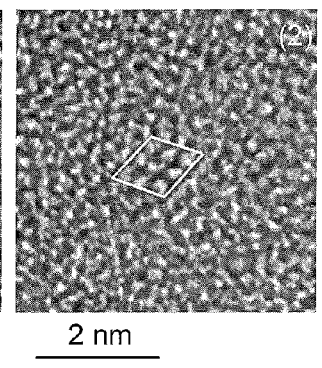 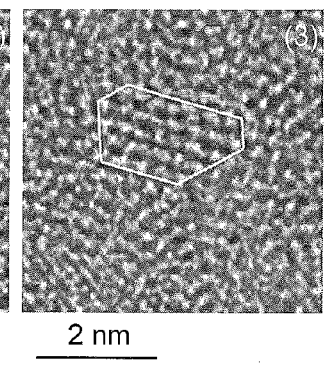

FIG. 47A
FIG. 47B
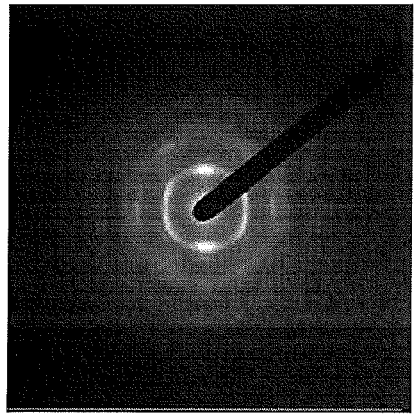
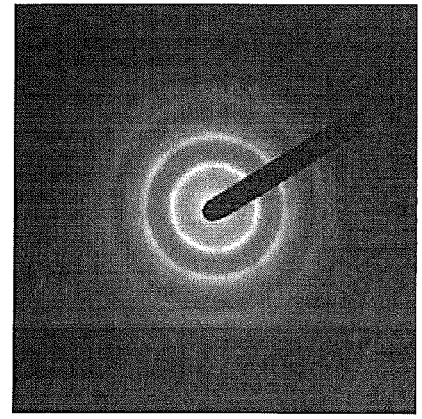

FIG. 52A
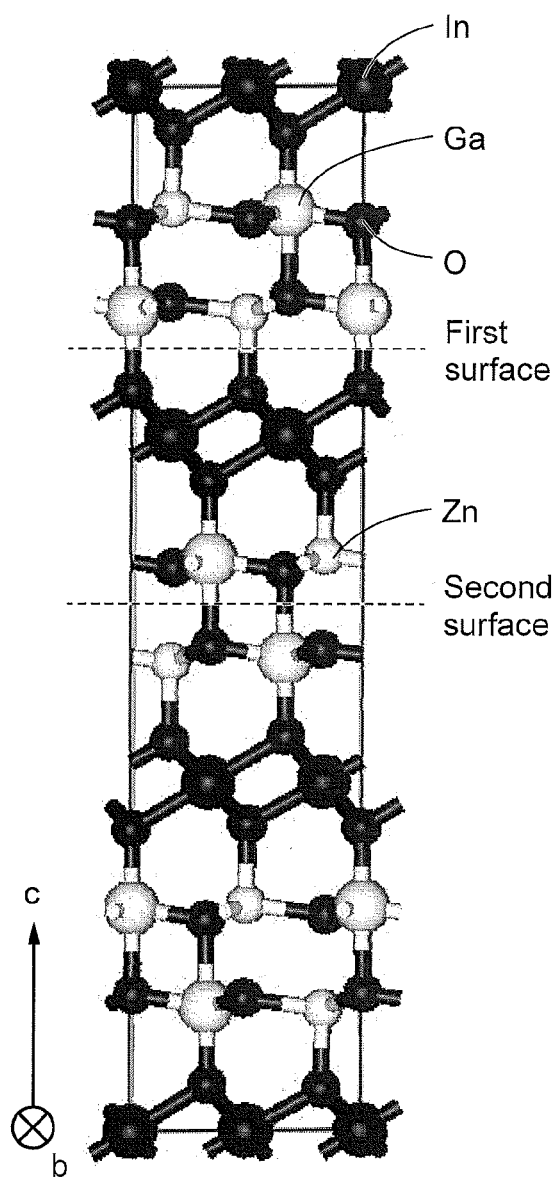
InGaZnO
FIG. 52B
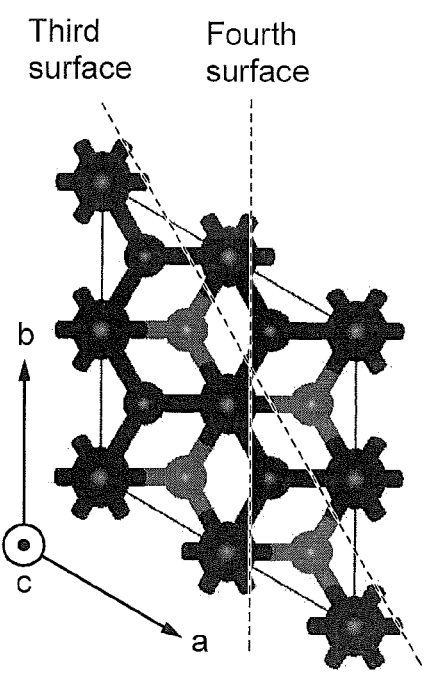

FIG. 53A
FIG. 53B
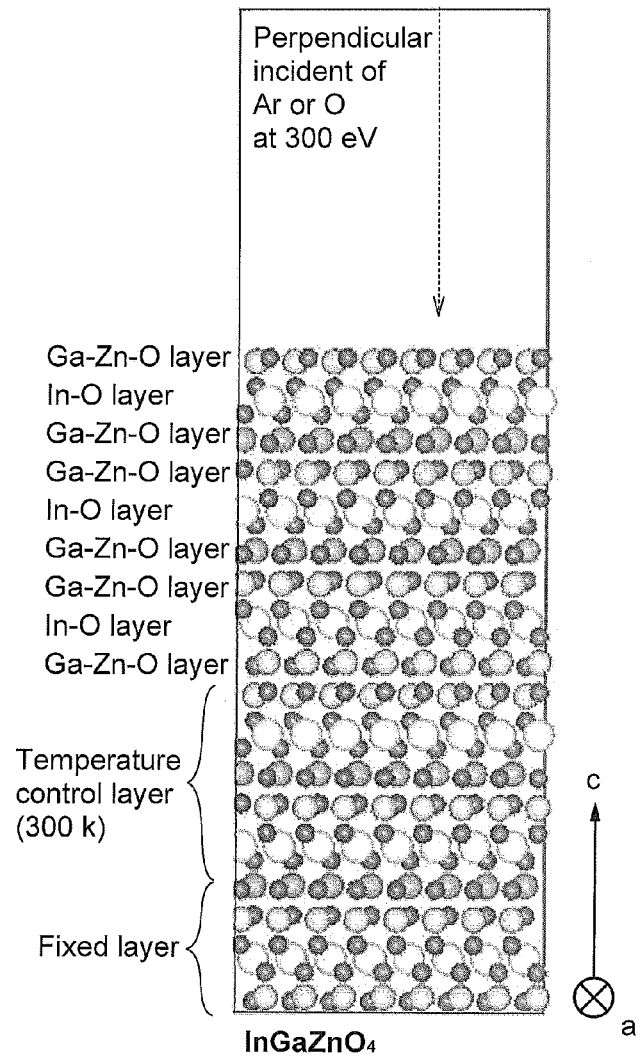
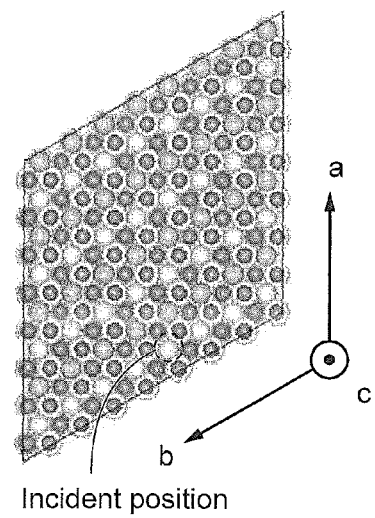

FIG. 54A
FIG. 54B
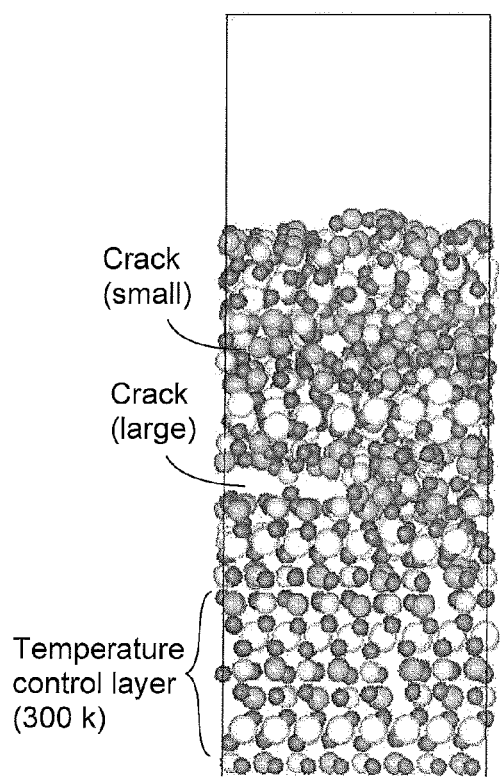
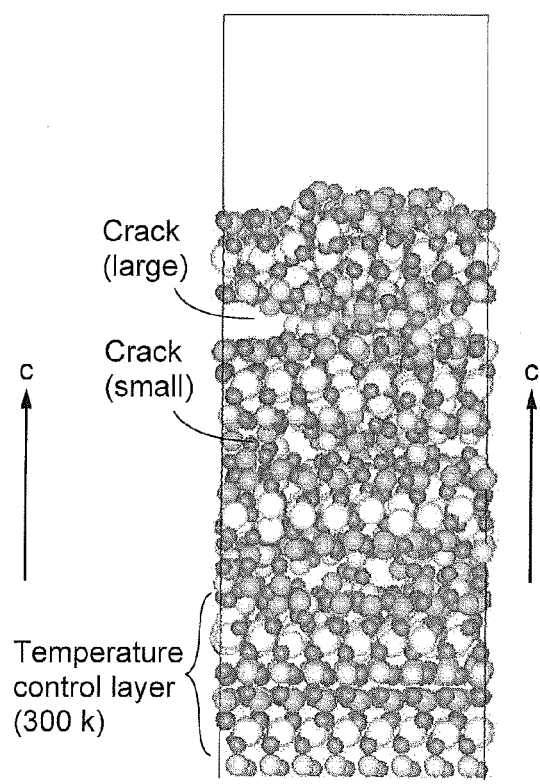

Zinc, originally in the third layer (Zn-O layer), reaches the vicinity of the sixth layer (Zn-O layer)

0 to 0.3 psec.
from incident of Ar

Zinc, originally in the third layer (Zn-O layer), does not exceed the fifth layer (In-O layer)

0 to 0.3 psec.
from incident of O

CAAC-OS film    1 nm

Target    1 nm

DISPLAY DEVICE

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a display device, a light-emitting device, a power storage device, a driving method thereof, and a manufacturing method thereof. In particular, one embodiment of the present invention relates to a semiconductor device or a display device each including an oxide semiconductor.

2. Description of the Related Art

Transistors used for most flat panel displays typified by a liquid crystal display device or a light-emitting display device are formed using a silicon semiconductor such as amorphous silicon, single crystal silicon, or polycrystalline silicon provided over a glass substrate. Furthermore, transistors formed using such silicon semiconductors are used in integrated circuits (IC) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor.

For example, a technique is disclosed in which a transistor is formed using zinc oxide or an In—Ga—Zn-based oxide as an oxide semiconductor and the transistor is used as a switching element or the like of a pixel of a display device (see Patent Documents 1 and 2).

REFERENCE

Patent Document

[Patent Document 1] Japanese Published Patent Application No. 2007-123861

[Patent Document 2] Japanese Published Patent Application No. 2007-096055

SUMMARY OF THE INVENTION

In a capacitor, a dielectric film is provided between a pair of electrodes at least one of which is formed, in many cases, using a light-blocking film partly serving as a gate electrode, a source electrode, a drain electrode, or the like of a transistor.

In a liquid crystal display device, with an increase in the capacitance value of a capacitor, the alignment of liquid crystal molecules of a liquid crystal element can be kept constant for a longer period in the state where an electric field is applied. When the period can be made longer in a display device which displays a still image, the number of times of rewriting image data can be reduced, leading to a reduction in power consumption.

One of methods for increasing the capacity value of a capacitor is to increase the area occupied by the capacitor, specifically, to increase the area of a region where a pair of electrodes of the capacitor overlap with each other. However, in a liquid crystal display device, when the area of a light-blocking conductive film is increased to increase the area of a region where a pair of electrodes overlaps with each other, the aperture ratio of a pixel is lowered and thus display quality of an image is degraded. Such a problem is significant particularly in a liquid crystal display device with high resolution.

A transistor including an oxide semiconductor film has a problem in that the amount of change in electrical characteristics, typically threshold voltage, due to change over time or a stress test is increased. A transistor having normally-on characteristics causes various problems in that malfunction is likely to occur when the transistor is in operation, that power consumption is increased when the transistor is not in operation, or that contrast of a display device is decreased, for example. Therefore, display quality is reduced.

One embodiment of the present invention provides a display device with high display quality. One embodiment of the present invention provides a display device having a high aperture ratio and including a capacitor that can increase capacitance. One embodiment of the present invention provides a low-power display device. One embodiment of the present invention provides a display device including a transistor having excellent electrical characteristics. One embodiment of the present invention provides a novel display device. One embodiment of the present invention provides a method for manufacturing a display device having a high aperture ratio and a wide viewing angle in fewer steps. One embodiment of the present invention provides a novel method for manufacturing a display device.

Note that the description of these objects does not impede the existence of other objects. In one embodiment of the present invention, there is no need to achieve all the objects. Other objects will be apparent from and can be derived from the description of the specification, the drawings, the claims, and the like.

One embodiment of the present invention is a display device including a transistor over a substrate, an inorganic insulating film over the transistor, an organic insulating film over the inorganic insulating film, a capacitor electrically connected to the transistor, and a pixel electrode being over the organic insulating film and electrically connected to the transistor. The transistor includes a gate electrode over the substrate, an oxide semiconductor film overlapping with the gate electrode, a gate insulating film in contact with one surface of the oxide semiconductor film, and a pair of conductive films in contact with the oxide semiconductor film. The capacitor includes a metal oxide film over the gate insulating film, the inorganic insulating film, and a first light-transmitting conductive film over the inorganic insulating film. The pixel electrode is formed of a second light-transmitting conductive film and in contact with one of the pair of conductive films and the first light-transmitting conductive film.

One embodiment of the present invention is a display device including a transistor over a substrate, an inorganic insulating film in contact with the transistor, an organic insulating film in contact with the inorganic insulating film, a capacitor electrically connected to the transistor, and a pixel electrode being over the organic insulating film and electrically connected to the transistor. The transistor includes a gate electrode over the substrate, an oxide semiconductor film overlapping with the gate electrode, a gate insulating film in contact with one surface of the oxide semiconductor film, and a pair of conductive films in contact with the oxide semiconductor film. The capacitor includes a metal oxide film being over the gate insulating film and in contact with one of the pair of conductive films, the inorganic insulating film, and a first light-transmitting conductive film over the inorganic insulating film. The pixel electrode is formed with a second light-transmitting conductive film and in contact with one of the pair of conductive films.

The transistor may include another gate electrode overlapping with the oxide semiconductor film with the inorganic insulating film positioned therebetween, that is, the transistor may have a dual-gate structure. The gate electrode may be connected to the gate electrode overlapping with the oxide semiconductor film with the gate insulating film positioned therebetween.

Note that the inorganic insulating film may include an oxide insulating film in contact with the other surface of the oxide semiconductor film and a nitride insulating film in contact with the oxide insulating film.

The metal oxide film may be in contact with the nitride insulating film and may contain a metal element the same as a metal element contained in the oxide semiconductor film.

The oxide semiconductor film contains an In—Ga oxide, an In—Zn oxide, or an In-M-Zn oxide (M is Al, Ti, Ga, Y, Zr, Sn, La, Ce, Nd, Sn, or Hf).

The oxide semiconductor film has a multilayer structure including a first film and a second film. The atomic ratio of metal elements in the first film may be different from that of metal elements in the second film.

One embodiment of the present invention can provide a display device with high display quality. One embodiment of the present invention can provide a display device having a high aperture ratio and including a capacitor that can increase capacity value. One embodiment of the present invention can provide a low-power display device. One embodiment of the present invention can provide a display device including a transistor having excellent electrical characteristics. One embodiment of the present invention can provide a method for manufacturing a display device having a high aperture ratio and a wide viewing angle in fewer steps. One embodiment of the present invention can provide a novel display device. Note that the description of these effects does not disturb the existence of other effects. In one embodiment of the present invention, there is no need to obtain all the effects. Other effects will be apparent from and can be derived from the description of the specification, the drawings, the claims, and the like.

BRIEF DESCRIPTION OF THE DRAWINGS

FIGS. 5A to 5C are cross-sectional views illustrating one embodiment of a method of manufacturing a semiconductor device.

FIGS. 7A and 7B are cross-sectional views illustrating one embodiment of a method of manufacturing a semiconductor device.

FIGS. 9A to 9C are cross-sectional views illustrating one embodiment of a method of manufacturing a semiconductor device.

FIGS. 10A to 10C are cross-sectional views illustrating one embodiment of a method of manufacturing a semiconductor device.

FIGS. 20A and 20B are cross-sectional views illustrating one embodiment of a method of manufacturing a semiconductor device.

FIGS. 22A to 22C are cross-sectional views illustrating one embodiment of a method of manufacturing a semiconductor device.

FIGS. 35A to 35C are cross-sectional views illustrating one embodiment of a method of manufacturing a semiconductor device.

FIGS. 45A to 45D are Cs-corrected high-resolution TEM images of a plane of a CAAC-OS.

FIGS. 47A and 47B show electron diffraction patterns of a CAAC-OS.

FIGS. 52A and 52B illustrate an $InGaZnO_4$ crystal.

FIGS. 53A and 53B illustrate a structure and the like of $InGaZnO_4$ before collision of an atom.

FIGS. 54A and 54B illustrate a structure and the like of $InGaZnO_4$ after collision of an atom.

DETAILED DESCRIPTION OF THE INVENTION

Figure 1A:
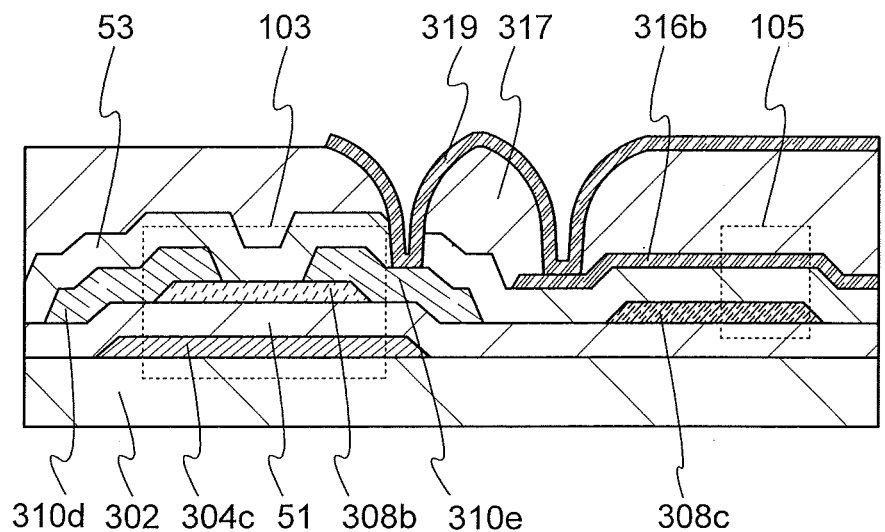
FIGS. 1A and 1B are cross-sectional views illustrating embodiments of a semiconductor device.

Embodiments of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments. In addition, in the following embodiments, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments of the present invention are not limited to such a scale.

In addition, terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be replaced with each other in this specification.

Note that a voltage refers to a difference between potentials of two points, and a potential refers to electrostatic energy (electric potential energy) of a unit charge at a given point in an electrostatic field. In general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

In this specification, in the case where an etching step is performed after a photolithography process, a mask formed in the photolithography process is removed after the etching step.

In this specification, the term "parallel" indicates that the angle formed between two straight lines is greater than or equal to −10° and less than or equal to 10°, and accordingly includes the case where the angle is greater than or equal to −5° and less than or equal to 5°. In addition, the term "perpendicular" indicates that the angle formed between two straight lines is greater than or equal to 80 and less than or equal to 100°, and accordingly includes the case where the angle is greater than or equal to 85 and less than or equal to 95°.

In this specification, trigonal and rhombohedral crystal systems are included in a hexagonal crystal system.

(Embodiment 1)

In the present embodiment, a semiconductor device of one embodiment of the present invention is described with reference to drawings.

Figure 1B:
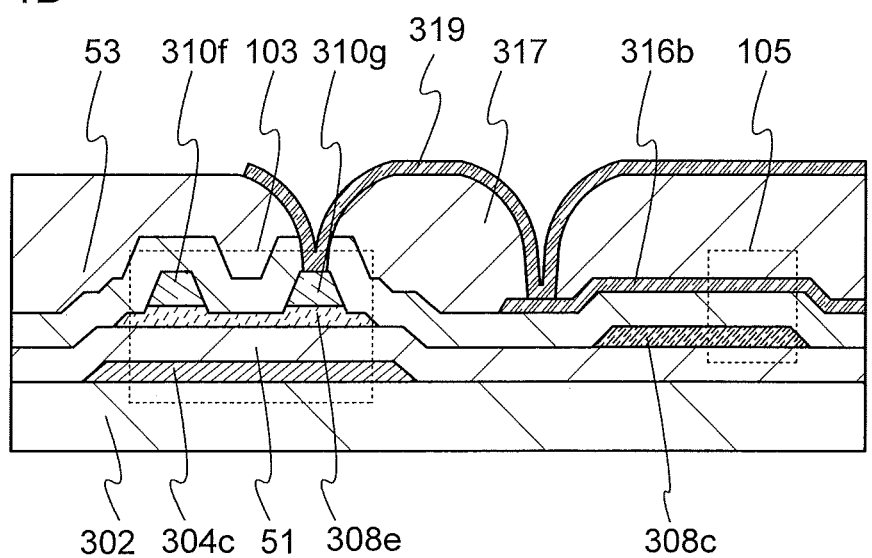

FIGS. 1A and 1B are cross-sectional views illustrating a transistor 103 and a capacitor 105 included in a semiconductor device.

The transistor 103 illustrated in FIG. 1A includes a conductive film 304c which functions as a gate electrode and is provided over a substrate 302; a gate insulating film 51 framed over the substrate 302 and the conductive film 304c; an oxide semiconductor film 308b which overlaps with the conductive film 304c with the gate insulating film 51 positioned therebetween; and a pair of conductive films 310d and 310e which are in contact with the oxide semiconductor film 308b and function as a source electrode and a drain electrode.

A metal oxide film 308c is provided over the gate insulating film 51. An inorganic insulating film 53 is provided over the transistor 102 and the metal oxide film 308c. A conductive film 316b is provided over the inorganic insulating film 53. The metal oxide film 308c, the inorganic insulating film 53, and the conductive film 316b constitute the capacitor 105.

An organic insulating film 317 is provided over the inorganic insulating film 53 and the conductive film 316b. A conductive film 319 is provided over the organic insulating film 317 to be connected to the conductive film 310e and the conductive film 316b in openings formed in the inorganic insulating film 53 and the organic insulating film 317. The conductive film 319 functions as a pixel electrode.

The metal oxide film 308c is formed by adding hydrogen, boron, phosphorus, nitrogen, tin, antimony, a rare gas element, an alkali metal, an alkaline earth metal, or the like which serves as an impurity to an oxide semiconductor film that is formed at the same time as the oxide semiconductor film 308b or by forming an oxygen vacancy in the oxide semiconductor film; thus, the conductivity of the metal oxide film 308c is increased and the metal oxide film 308c has conductivity. Note that an oxide semiconductor film has a light-transmitting property, and thus the metal oxide film 308c also has a light-transmitting property.

The conductive film 316b and the conductive film 319 are formed using light-transmitting conductive films Therefore, the capacitor 105 has a light-transmitting property. Accordingly, the area of the capacitor can be increased in a pixel, and the capacity value of the capacitor and the aperture ratio of a pixel can be increased.

The inorganic insulating film 53 includes at least an oxide insulating film, preferably has a stacked structure of an oxide insulating film and a nitride insulating film. An oxide insulating film is formed in a region of the inorganic insulating film 53 which is in contact with the oxide semiconductor film 308b, the amount of defects at the interface between the oxide semiconductor film 308b and the inorganic insulating film 53 can be reduced.

The nitride insulating film functions as a barrier film against water, hydrogen, and the like. When water, hydrogen, or the like enters the oxide semiconductor film 308b, it reacts with oxygen contained in the oxide semiconductor film 308b. As a result, oxygen vacancies are formed in the oxide semiconductor film 308b. The oxygen vacancies cause carriers in the oxide semiconductor film 308b, so that the threshold voltage of the transistor is negatively shifted and the transistor becomes a normally-on transistor. By providing the nitride insulating film as the inorganic insulating film 53, the amount of water, hydrogen, and the like diffused from the outside into the oxide semiconductor film 308b can be reduced; thus, the amount of defects in the oxide semiconductor film 308b can be reduced. In the inorganic insulating film 53, the oxide insulating film and the nitride insulating film are stacked in this order from the oxide semiconductor film 308b side. With this structure, the amount of defects at the interface between the oxide semiconductor film 308b and the inorganic insulating film 53 and the amount of oxygen vacancies in the oxide semiconductor film 308b can be reduced. Therefore, a transistor having normally-off characteristics can be manufactured.

The organic insulating film 317 has high planarity because it is formed with an organic resin such as an acrylic resin, a polyimide resin, or an epoxy resin. The thickness of the organic insulating film 317 is greater than or equal to 500 nm and less than or equal to 5000 nm, preferably greater than or equal to 1000 nm and less than or equal to 3000 nm.

The conductive film 319 formed over the organic insulating film 317 is connected to the transistor 103 and the capacitor 105. The conductive film 319 functions as a pixel electrode, and is connected to the transistor 103 through the opening in the inorganic insulating film 53 and the organic insulating film 317. Since the conductive film 319 is apart from the transistor 103, the conductive film 319 is less likely to be affected by the potential of the conductive film 310d of the transistor 103. Accordingly, it is possible to provide the conductive film 319 to overlap with the transistor 103. Thus, the aperture ratio of a pixel can be increased.

Here, a semiconductor device including the transistor 103 in which the organic insulating film 317 is not provided over the inorganic insulating film 53 is regarded as a comparative semiconductor device. The case where a negative voltage is applied to the conductive film 304c that functions as a gate electrode of the transistor 103 in the comparative semiconductor device is described.

When a negative voltage is applied to the conductive film 304c that functions as a gate electrode, an electric field is generated. The electric field is not blocked by the oxide semiconductor film 308b and affects the inorganic insulating film 53, so that a surface of the inorganic insulating film 53 is weakly positively charged. In addition, when a negative voltage is applied to the conductive film 304c that functions as a gate electrode, positively charged particles in the air are adsorbed on the surface of the inorganic insulating film 53, so that the surface of the inorganic insulating film 53 is weakly positively charged.

The positively charged surface of the inorganic insulating film 53 causes an electric field, and the electric field affects the interface between the oxide semiconductor film 308b and the inorganic insulating film 53. As a result, a state at the interface between the oxide semiconductor film 308b and the inorganic insulating film 53 becomes similar to the state when a positive bias is applied, and the threshold voltage of the transistor is negatively shifted.

In contrast, the transistor 103 of this embodiment illustrated in FIGS. 1A and 1B includes the organic insulating film 317 over the inorganic insulating film 53. Since the organic insulating film 317 has a large thickness of greater than or equal to 500 nm, an electric field caused by application of a negative voltage to the conductive film 304c that functions as a gate electrode does not affect the surface of the organic insulating film 317; thus, the surface of the organic insulating film 317 is less likely to be positively charged. Since the thickness of the organic insulating film 317 is as large as 500 nm or more, even when positively charged particles in the air are adsorbed on the surface of the organic insulating film 317, an electric field of the positively charged particles on the surface of the organic insulating film 317 is less likely to affect the interface between the oxide semiconductor film 308b and the inorganic insulating film 53. As a result, the state at the interface between the oxide semiconductor film 308b and the inorganic insulating film 53 does not become similar to the state when a positive bias is applied; accordingly, change in threshold voltage of the transistor is small.

Although water and the like are easily diffused in the organic insulating film 317, the nitride insulating film included in the inorganic insulating film 53 functions as a barrier film against water. Therefore, water diffused in the organic insulating film 317 can be prevented from diffusing into the oxide semiconductor film 308b.

As described above, change in electric characteristics of transistors can be reduced by providing the organic insulating film 317 over the transistor. Moreover, a highly reliable transistor having normally-off characteristics can be manufactured. Since the organic insulating film can be formed by a printing method, a coating method, or the like, the manufacturing time can be shortened. Furthermore, by providing the conductive film that functions as a pixel electrode over the organic insulating film 317, the aperture ratio of a pixel can be increased.

<Modification Example 1>

A modification example of the transistor of this embodiment is described with reference to FIG. 1B. The transistor 103 of this modification example includes an oxide semiconductor film 308e and a pair of conductive films 310f and 310g which are formed using a multi-tone mask.

With the use of the multi-tone mask, a resist mask having plural thicknesses can be formed. After the oxide semiconductor film 308e is formed using the resist mask, the resist mask is exposed to oxygen plasma or the like; thus, the resist mask is partly removed to be a resist mask used for forming the pair of electrodes. As a result, the number of steps in photolithography in a process of forming the oxide semiconductor film 308e and the pair of conductive films 310f and 310g can be reduced.

Note that outside the pair of conductive films 310f and 310g, the oxide semiconductor film 308e formed with a multi-tone mask is partly exposed in the planar shape.

<Modification Example 2>

In the display device described in Embodiment 1, depending on circumstances or conditions, a conductive an having a function of reflecting light may be formed as the conductive film 319, for example. Alternatively, stacked films in which at least one of the films is a conductive film having a function of reflecting light may be formed as the conductive film 319. Examples of a material of the conductive film having a function of reflecting light include silver, aluminum, chromium, copper, tantalum, titanium, molybdenum, and tungsten. Alternatively, stacked films in which a film formed using silver is sandwiched between indium tin oxide (hereinafter referred to as ITO) films may be formed as the conductive film 319. In this case, this embodiment can be applied to a reflective display device, a semi-transmissive display device, a top emission type light-emitting device, and the like.

Note that the structures, methods, and the like described in this embodiment can be used as appropriate in combination with any of the structures, methods, and the like described in the other embodiments.

(Embodiment 2)

In this embodiment, a semiconductor device of one embodiment of the present invention and a manufacturing method thereof are described with reference to drawings.

Figure 2A:
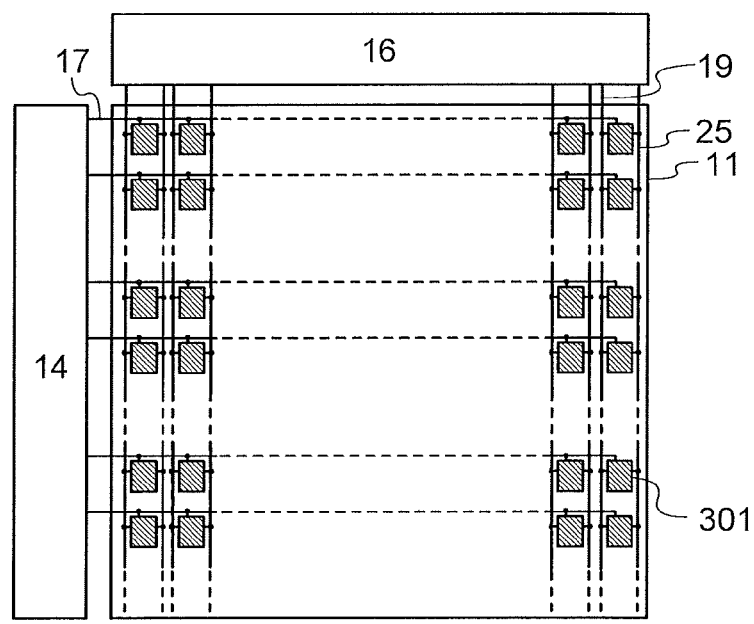
FIGS. 2A to 2C are a block diagram and circuit diagrams illustrating one embodiment of a semiconductor device.

FIG. 2A illustrates a display device as an example of a semiconductor device. A display device illustrated in FIG. 2A includes a pixel portion 11; a scan line driver circuit 14; a signal line driver circuit 16; in scan lines 17 which are arranged parallel or substantially parallel to each other and whose potentials are controlled by the scan line driver circuit 14; and n signal lines 19 which are arranged parallel or substantially parallel to each other and whose potentials are controlled by the signal line driver circuit 16. The pixel portion 11 further includes a plurality of pixels 301 arranged in a matrix. Furthermore, capacitor lines 25 arranged parallel or substantially parallel are provided along the signal lines 19. Note that the capacitor lines 25 may be arranged parallel or substantially parallel along the scan lines 17. The scan line driver circuit 14 and the signal line driver circuit 16 are collectively referred to as a driver circuit portion in some cases.

In addition, the display device also includes a driver circuit for driving a plurality of pixels, and the like. The display device may also be referred to as a liquid crystal module including a control circuit, a power supply circuit, a signal generation circuit, a backlight module, and the like provided over another substrate.

Each scan line 17 is electrically connected to the n pixels 301 in the corresponding row among the pixels 301 arranged in m rows and n columns in the pixel portion 11. Each signal line 19 is electrically connected to the in pixels 301 in the corresponding column among the pixels 301 arranged in m rows and n columns. Note that m and n are each an integer of 1 or more. Each capacitor line 25 is electrically connected to the in pixels 301 in the corresponding columns among the pixels 301 arranged in m rows and n columns Note that in the case where the capacitor lines 25 are arranged parallel or substantially parallel along the signal lines 19, each capacitor line 25 is electrically connected to the n pixels 301 in the corresponding rows among the pixels 301 arranged in m rows and n columns.

Note that here, a pixel refers to a region surrounded by scan lines and signal lines and exhibiting one color. Therefore, in the case of a color display device having color elements of R (red), G (green), and B (blue), a minimum unit of an image is composed of three pixels of an R pixel, a G pixel, and a B pixel. Note that color reproducibility can be improved by adding a yellow pixel, a cyan pixel, a magenta pixel, or the like to the R pixel, the G pixel, and the B pixel. Moreover, power consumption of the display device can be reduced by adding a W (white) pixel to the R pixel, the G pixel, and the B pixel. In the case of a liquid crystal display device, brightness of the liquid crystal display device can be improved by adding a W pixel to each of the R pixel, the G pixel, and the B pixel. As a result, the power consumption of the liquid crystal display device can be reduced.

Figure 2B:
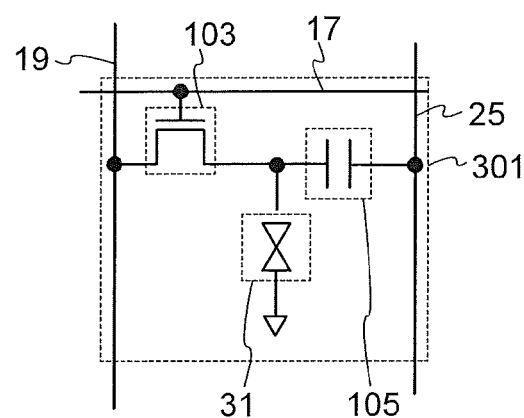
Figure 2C:
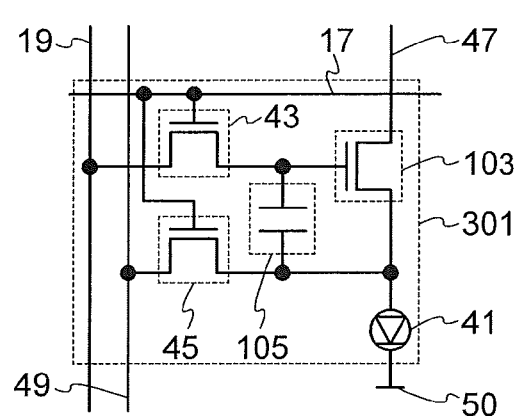

FIGS. 2B and 2C illustrate examples of a circuit configuration that can be used for the pixels 301 in the display device illustrated in FIG. 2A.

The pixel 301 in FIG. 2B includes a liquid crystal element 31, a transistor 103, and a capacitor 105.

The potential of one of a pair of electrodes of the liquid crystal element 31 is set as appropriate according to the specifications of the pixel 301. The alignment state of the liquid crystal element 31 depends on written data. A common potential may be supplied to one of the pair of electrodes of the liquid crystal element 31 included in each of a plurality of pixels 301. Furthermore, the potential supplied to the one of the pair of electrodes of the liquid crystal element 31 in the pixel 301 in one row may be different from the potential supplied to the one of the pair of electrodes of the liquid crystal element 31 in the pixel 301 in another row.

The liquid crystal element 31 is an element that controls transmission or non-transmission of light utilizing an optical modulation action of liquid crystal. Note that the optical modulation action of the liquid crystal is controlled by an electric field applied to the liquid crystal (including a horizontal electric field, a vertical electric field, and a diagonal electric field). Examples of the liquid crystal element 31 are a nematic liquid crystal, a cholesteric liquid crystal, a smectic liquid crystal, a thermotropic liquid crystal, a lyotropic liquid crystal, a ferroelectric liquid crystal, and an anti-ferroelectric liquid crystal.

As examples of a driving method of the display device including the liquid crystal element 31, any of the following modes can be given: a TN mode, a VA mode, an ASM (axially symmetric aligned micro-cell) mode, an OCB (optically compensated birefringence) mode, an MVA mode, a PVA (patterned vertical alignment) mode, an IPS mode, an FFS mode, a IBA (transverse bend alignment) mode, and the like. Note that one embodiment of the present invention is not limited to this, and various liquid crystal elements and driving methods can be used as a liquid crystal element and a driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the structure of the pixel 301 illustrated in FIG. 2B, one of a source electrode and a drain electrode of the transistor 103 is electrically connected to the signal line 19, and the other is electrically connected to the other of the pair of electrodes of the liquid crystal element 31. A gate electrode of the transistor 103 is electrically connected to the scan line 17. The transistor 103 has a function of controlling whether to write a data signal by being turned on or off.

In the pixel 301 in FIG. 2B, one of a pair of electrodes of the capacitor 105 is electrically connected to the capacitor line 25 to which a potential is supplied, and the other thereof is electrically connected to the other of the pair of electrodes of the liquid crystal element 31. The potential of the capacitor line 25 is set as appropriate in accordance with the specifications of the pixel 301. The capacitor 105 functions as a storage capacitor for storing written data.

For example, in the display device including the pixel 301 in FIG. 2B, the pixels 301 are sequentially selected row by row by the scan line driver circuit 14, whereby the transistors 103 are turned on and data of a data signal is written.

When the transistors 103 are turned off, the pixels 301 in which the data has been written are brought into a holding state. This operation is sequentially performed row by row; thus, an image is displayed.

The pixel 301 in FIG. 2C includes a transistor 43 performing switching of a display element, the transistor 103 controlling pixel driving, a transistor 45, the capacitor 105, and a light-emitting element 41.

One of a source electrode and a drain electrode of the transistor 43 is electrically connected to the signal line 19 to which a data signal is supplied. A gate electrode of the transistor 43 is electrically connected to a scan line 17 to which a gate signal is supplied.

The transistor 43 has a function of controlling whether to write a data signal by being turned on or off.

One of a source electrode and a drain electrode of the transistor 103 is electrically connected to a wiring 47 serving as an anode line, and the other is electrically connected to one electrode of the light-emitting element 41. The gate electrode of the transistor 103 is electrically connected to the other of the source electrode and the drain electrode of the transistor 43 and one electrode of the capacitor 105.

The transistor 103 has a function of controlling current flowing through the light-emitting element 41 by being turned on or off.

One of a source electrode and a drain electrode of the transistor 45 is connected to a wiring 49 to which a reference potential of data is supplied, and the other thereof is electrically connected to the one electrode of the light-emitting element 41 and the other electrode of the capacitor 105. Moreover, a gate electrode of the transistor 45 is electrically connected to the scan line 17 to which the gate signal is supplied.

The transistor 45 has a function of adjusting the current flowing through the light-emitting element 41. For example, when the internal resistance of the light-emitting element 41 increases because of deterioration or the like of the light-emitting element 41, the current flowing through the light-emitting element 41 can be corrected by monitoring current flowing through the wiring 49 to which the one of the source electrode and the drain electrode of the transistor 45 is connected. The potential supplied to the wiring 49 can be set to 0 V, for example.

The one electrode of the capacitor 105 is electrically connected to the gate electrode of the transistor 103 and the other of the source electrode and the drain electrode of the transistor 43, and the other electrode of the capacitor 105 is electrically connected to the other of the source electrode and the drain electrode of the transistor 45 and the one electrode of the light-emitting element 41.

In the pixel 301 in FIG. 2C, the capacitor 105 functions as a storage capacitor for storing written data.

The one electrode of the light-emitting element 41 is electrically connected to the other of the source electrode and the drain electrode of the transistor 45, the other electrode of the capacitor 105, and the other of the source electrode and the drain electrode of the transistor 103. Furthermore, the other electrode of the light-emitting element 41 is electrically connected to a wiring 50 serving as a cathode.

As the light-emitting element 41, an organic electroluminescent element (also referred to as an organic EL element) or the like can be used, for example. Note that the light-emitting element 41 is not limited to an organic EL element; an inorganic EL element including an inorganic material may be used.

A high power supply potential VDD is supplied to one of the wiring 47 and the wiring 50, and a low power supply potential VSS is supplied to the other. In the structure of FIG. 2C, the high power supply potential VDD is supplied to the wiring 47, and the low power supply potential VSS is supplied to the wiring 50.

For example, in the display device including the pixel 301 in FIG. 2C, the pixels 301 are sequentially selected row by row by the scan line driver circuit 14, whereby the transistors 43 are turned on and data of a data signal is written.

When the transistors 43 are turned off, the pixels 301 in which the data has been written are brought into a holding state. The transistor 43 is connected to the capacitor 105, and thus written data can be stored for a long period. The amount of current flowing between the source and drain electrodes of the transistor 103 is controlled by the transistor 43. The light-emitting element 41 emits light with a luminance corresponding to the amount of flowing current. This operation is sequentially performed row by row; thus, an image is displayed.

Note that although FIGS. 2B and 2C each illustrate an example where the liquid crystal element 31 and the light-emitting element 41 are used as a display element, one embodiment of the present invention is not limited thereto. Any of a variety of display elements may be used. Examples of display elements include elements including a display medium whose contrast, luminance, reflectance, transmittance, or the like is changed by electromagnetic action, such as an EL (electroluminescent) element (e.g., an EL element including organic and inorganic materials, an organic EL element, and an inorganic EL element), an LED (e.g., a white LED, a red LED, a green LED, and a blue LED), a transistor (a transistor that emits light depending on a current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), an interferometric modulator display (IMOD), an electrowetting element, a piezoelectric ceramic display, and a carbon nanotube. Note that examples of display devices including EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display) and the like. An example of a display device including electronic ink or electrophoretic elements is electronic paper.

Next, a specific structure of an element substrate included in the display device is described. Here, a liquid crystal display device driven in a VA mode is used as the display device, and FIG. 3 is a top view of the pixel 301 included in the liquid crystal display device.

Figure 3:
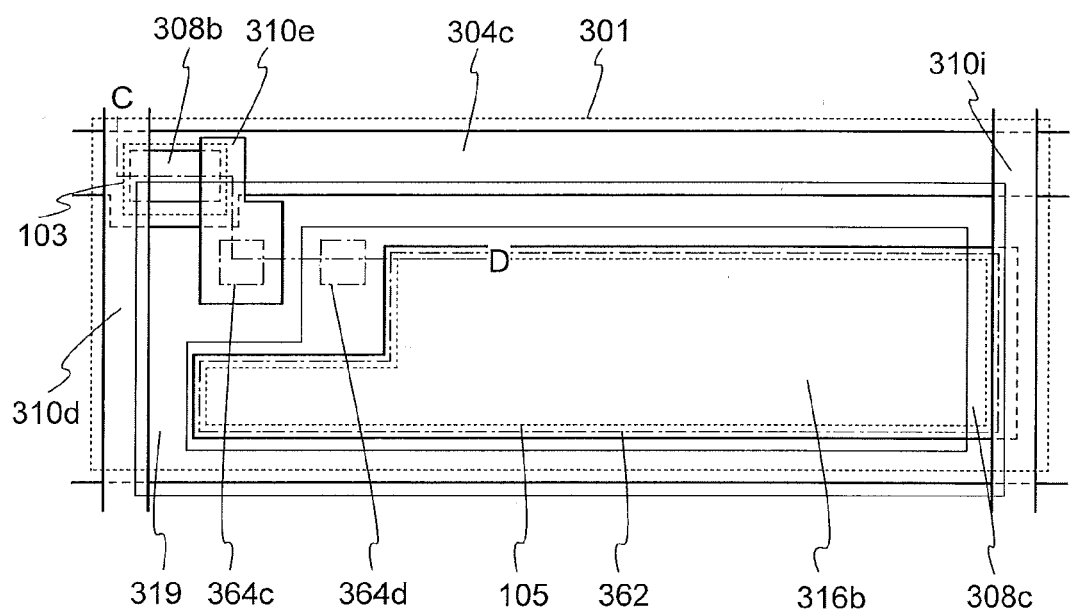
FIG. 3 is a top view illustrating one embodiment of a semiconductor device.

In FIG. 3, a conductive film 304c functioning as a scan line extends in a direction substantially perpendicularly to a conductive film functioning as a signal line (in the lateral direction in the drawing). The conductive film 310d functioning as a signal line and the capacitor line 310i extend in a direction substantially perpendicularly to the conductive film functioning as a scan line (in the vertical direction in the drawing). Note that the conductive film 304c functioning as a scan line is electrically connected to the scan line driver circuit 14 (see FIGS. 2A to 2C), and the conductive film 310d functioning as a signal line is electrically connected to the signal line driver circuit 16 (see FIGS. 2A to 2C).

The transistor 103 is provided in a region where the conductive film functioning as a scan line and the conductive film functioning as a signal line intersect with each other. The transistor 103 includes the conductive film 403c functioning as a gate electrode; a gate insulating film (not illustrated in FIG. 3); the oxide semiconductor film 308b where a channel region is formed, over the gate insulating film; and the pair of conductive films 310d and 310e functioning as a source electrode and a drain electrode. The conductive film 304c also functions as a conductive film functioning as a scan line, and a region of the conductive film 304c that overlaps with the oxide semiconductor film 308b serves as the gate electrode of the transistor 103. Furthermore, in the top view of FIG. 3, an end portion of the conductive film functioning as a scan line is positioned on an outer side of an end portion of the oxide semiconductor film 308b. Thus, the conductive film functioning as a scan line functions as a light-blocking film for blocking light from a light source such as a backlight. For this reason, the oxide semiconductor film 308b included in the transistor is not irradiated with light, so that a variation in the electrical characteristics of the transistor can be suppressed.

The conductive film 316b is formed over the metal oxide film 308c with an insulating film positioned therebetween. Note that an opening 362 is formed in the insulating film provided over the metal oxide film 308c, and is indicated by a dashed-dotted line. In the opening 362, the metal oxide film 308c is in contact with the nitride insulating film included in the insulating film (not illustrated in FIG. 3).

The capacitor 105 is formed in a region where the metal oxide film 308c and the conductive film 316b overlap with each other. The metal oxide film 308c and the conductive film 316b have light-transmitting properties. Therefore, the capacitor 105 has a light-transmitting property.

The conductive film 319 that functions as a pixel electrode is provided over the conductive film 310e and the conductive film 316b with an organic insulating film (not illustrated in FIG. 3) positioned therebetween. The conductive film 319 is connected to the conductive film 310e in an opening 364c and connected to the conductive film 316b in an opening 364d. That is, the transistor 103, the capacitor 105, and the conductive film 319 are electrically to one another.

Owing to the light-transmitting property of the capacitor 105, the capacitor 105 can be formed large (in a large area) in the pixel 301. Thus, a display device with a large-capacitance capacitor as well as an aperture ratio increased to typically 50% or more, preferably 60% or more can be provided. For example, in a high-resolution display device such as a liquid crystal display device, the area of a pixel is small and accordingly the area of a capacitor is also small. For this reason, the amount of charges accumulated in the capacitor is small in the high-resolution display device. However, since the capacitor 105 of this embodiment has a light-transmitting property, when the capacitor 105 is provided in a pixel, sufficient capacitance can be obtained in the pixel and the aperture ratio can be improved. Typically, the capacitor 105 can be favorably used for a high-resolution display device with a pixel density of 200 pixels per inch (ppi) or more, 300 ppi or more, or furthermore, 500 ppi or more.

In a liquid crystal display device, as the capacitance value of a capacitor is increased, a period during which the alignment of liquid crystal molecules of a liquid crystal element can be kept constant in the state where an electric field is applied can be made longer. When the period can be made longer in a display device which displays a still image, the number of times of rewriting image data can be reduced, leading to a reduction in power consumption. Furthermore, according to the structure of this embodiment, the aperture ratio can be improved even in a high-resolution display device, which makes it possible to use light from a light source such as a backlight efficiently, so that power consumption of the display device can be reduced.

Figure 4:
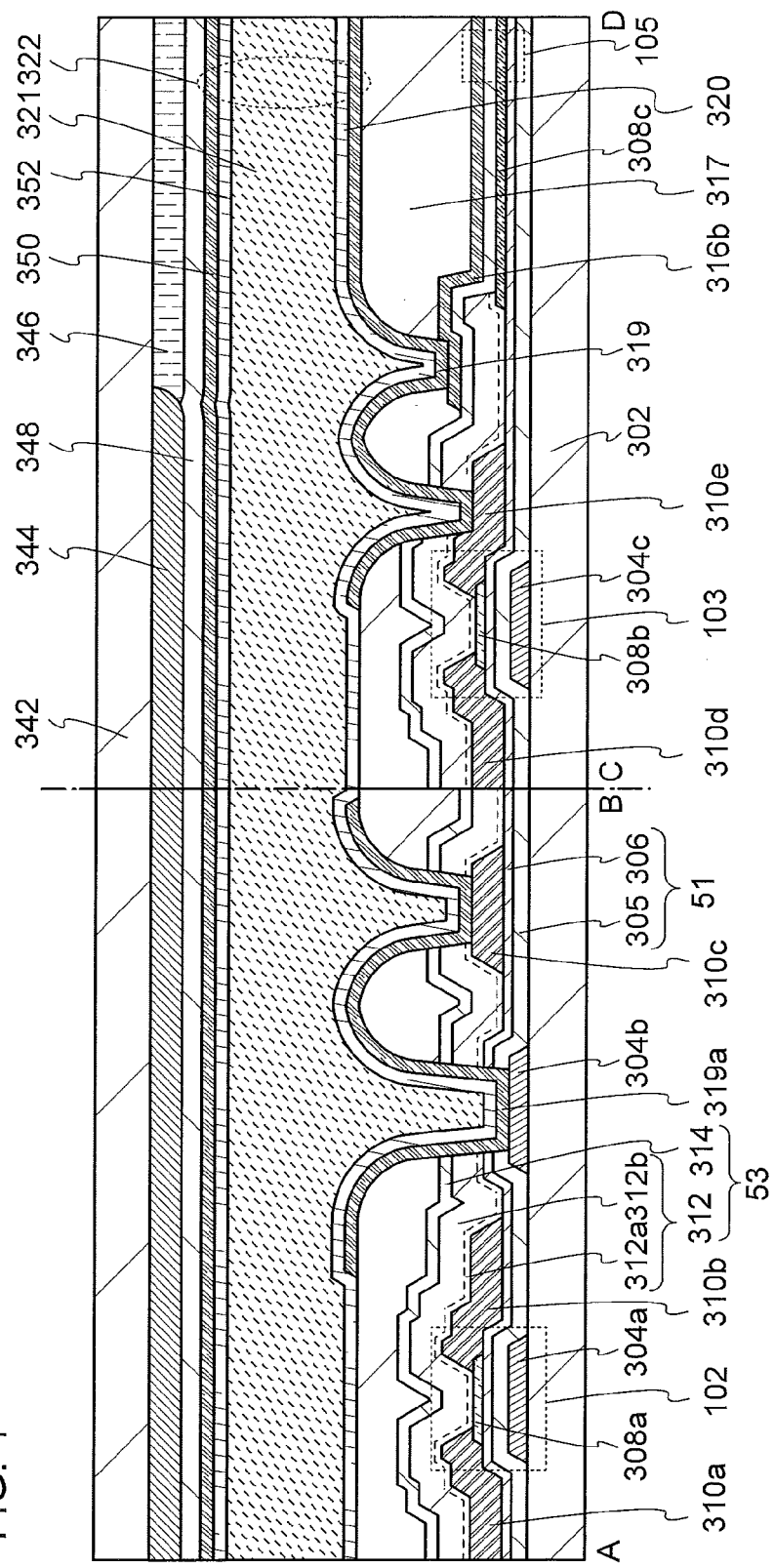
FIG. 4 is a cross-sectional view illustrating one embodiment of a semiconductor device.

Next, FIG. 4 shows a cross section taken along dashed-dotted line C-D in FIG. 3. Note that a cross section A-B in FIG. 4 is a cross-sectional view of a driver circuit portion (a top view thereof is omitted) including the scan line driver circuit 14 and the signal line driver circuit 16. In this embodiment, as a semiconductor device, a liquid crystal display device of a VA mode is described.

In the liquid crystal display device described in this embodiment, a liquid crystal element 322 is provided between a pair of substrates (a substrate 302 and a substrate 342).

The liquid crystal element 322 includes the conductive film 316b over the substrate 302, films controlling alignment (hereinafter referred to as alignment films 320 and 352), a liquid crystal layer 321, and a conductive film 350. Note that the conductive film 316b functions as one electrode of the liquid crystal element 322, and the conductive film 350 functions as the other electrode of the liquid crystal element 322.

Thus, a "liquid crystal display device" refers to a device including a liquid crystal element. Note that the liquid crystal display device includes a driver circuit for driving a plurality of pixels and the like. The liquid crystal display device may also be referred to as a liquid crystal module including a control circuit, a power supply circuit, a signal generation circuit, a backlight module, and the like provided over another substrate.

In the driver circuit portion, the transistor 102 includes the conductive film 304a functioning as a gate electrode, insulating films 305 and 306 collectively functioning as the gate insulating film 51, the oxide semiconductor film 308a in which a channel region is formed, and the conductive films 310a and 310b functioning as a source electrode and a drain electrode. The oxide semiconductor film 308a is provided over the gate insulating film 51.

In the pixel portion, the transistor 103 includes the conductive film 304c functioning as a gate electrode, the insulating films 305 and 306 collectively functioning as the gate insulating film 51, the oxide semiconductor film 308b which is formed over the gate insulating film 51 and in which a channel region is formed, and the conductive films 310d and 310e functioning as a source electrode and a drain electrode. The oxide semiconductor film 308b is provided over the gate insulating film 51. Further, an insulating film 312 included in the inorganic insulating film 53 and an insulating film 314 are provided as protective films over the conductive films 310d and 310e.

Further, the capacitor 105 includes the metal oxide film 308c functioning as one electrode, the insulating film 314 functioning as a dielectric film, and the conductive film 316b functioning as the other electrode. The metal oxide film 308c is provided over the gate insulating film 51.

The organic insulating film 317 is formed over the inorganic insulating film 53. The conductive film 319 that functions as a pixel electrode is formed over the organic insulating film 317. The conductive film 310e and the conductive film 316b are connected to each other by the conductive film 319.

In the driver circuit portion, the conductive film 304b formed at the same time as the conductive films 304a and 304c and the conductive film 310c formed at the same time as the conductive films 310a, 310b, 310d, and 310e are connected to each other via the light-transmitting conductive film 319a formed at the same time as the conductive film 319.

The conductive film 304a and the light-transmitting conductive film 319a are connected to each other through an opening provided in the insulating film 305, the insulating film 306, the insulating film 312, and the organic insulating film 317. Further, the conductive film 310c and the conductive film 319a are connected to each other through an opening provided in the insulating film 312, the insulating film 314, and the organic insulating film 317.

Here, components of the display device illustrated in FIG. 4 are described below.

The conductive films 304a, 304b, and 304c are formed over the substrate 302. The conductive film 304a functions as a gate electrode of the transistor in the driver circuit portion. The conductive film 304b is formed in the driver circuit portion and connected to the conductive film 310c. The conductive film 304c is formed in the pixel portion 11 and functions as a gate electrode of the transistor in the pixel portion.

There is no particular limitation on a material and the like of the substrate 302 as long as the material has heat resistance high enough to withstand at least heat treatment performed later. For example, a glass substrate, a ceramic substrate, a quartz substrate, or a sapphire substrate may be used as the substrate 302. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used. Still alternatively, any of these substrates provided with a semiconductor element may be used as the substrate 302. In the case where a glass substrate is used as the substrate 302, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized liquid crystal display device can be manufactured.

Alternatively, a flexible substrate may be used as the substrate 302, and the transistor may be provided directly on the flexible substrate. Alternatively, a separation layer may be provided between the substrate 302 and the transistor. The separation layer can be used when part or the whole of an element portion formed over the separation layer is completed and separated from the substrate 302 and transferred to another substrate. In such a case, the transistor can be transferred to a substrate having low heat resistance or a flexible substrate as well.

The conductive films 304a, 304b, and 304c each can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese or zirconium may be used. The conductive films 304a, 304b, and 304c each may have a single-layer structure or a stacked structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The conductive films 304a, 304b, and 304c each can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

The insulating films 305 and 306 are formed over the substrate 302 and the conductive films 304a, 304c, and 304b. The insulating films 305 and 306 function as the gate insulating film 51 of the transistor in the driver circuit portion and the gate insulating film 51 of the transistor in the pixel portion 11.

The insulating film 305 is preferably formed using a nitride insulating film such as a silicon nitride film, a silicon nitride oxide film, an aluminum nitride film, and an aluminum nitride oxide film.

The insulating film 306 can be formed to have a single-layer structure or a stacked-layer structure using, for example, any of silicon oxide, silicon oxynitride, silicon nitride oxide, silicon nitride, aluminum oxide, hafnium oxide, gallium oxide, and Ga—Zn-based metal oxide. The insulating film 306 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

The total thickness of the insulating films 305 and 306 is greater than or equal to 5 nm and less than or equal to 400 nm, preferably greater than or equal to 10 nm and less than or equal to 300 nm, further preferably greater than or equal to 50 nm and less than or equal to 250 nm.

The oxide semiconductor films 308a and 308b and the metal oxide film 308c are formed over the insulating film 306. The oxide semiconductor film 308a is formed in a position overlapping with the conductive film 304a and functions as a channel region of the transistor in the driver circuit portion. The oxide semiconductor film 308b is formed in a position overlapping with the conductive film 304c and functions as a channel region of the transistor in the pixel portion. The metal oxide firm 308c functions as one electrode of the capacitor 105.

The oxide semiconductor films 308a and 308b and the metal oxide film 308c each are typically an In—Ga oxide film, an In—Zn oxide film, or an In-M-Zn oxide film (M represents Al, Ti, Ga, Y, Zr, La, Ce, Nd, Sn, or Hf). Note that the oxide semiconductor films 308a and 308b and the metal oxide film 308c have light-transmitting properties.

Note that in the case where the oxide semiconductor films 308a and 308b and the metal oxide film 308c each are an In-M-Zn oxide film, the proportions of In and M when summation of In and M is assumed to be 100 atomic % are preferably as follows: the atomic percentage of In is greater than 25 atomic % and the atomic percentage of M is less than 75 atomic %; further preferably, the atomic percentage of In is greater than 34 atomic % and the atomic percentage of M is less than 66 atomic %.

The energy gap of each of the oxide semiconductor films 308a and 308b and the metal oxide film 308c is 2 eV or more, preferably 2.5 eV or more, more preferably 3 eV or more. With the use of an oxide semiconductor having such a wide energy gap, the off-state current of the transistor can be reduced.

The thickness of each of the oxide semiconductor films 308a and 308b and the metal oxide film 308c is greater than or equal to 3 nm and less than or equal to 200 nm, preferably greater than or equal to 3 nm and less than or equal to 100 nm, more preferably greater than or equal to 3 nm and less than or equal to 50 nm.

As each of the oxide semiconductor films 308a and 308b and the metal oxide film 308c, an In—Ga—Zn oxide with an atomic ratio of In:Ga:Zn=1:1:1, 1:1:1.2, or 3:1:2 can be used. Note that the atomic ratio of each of the oxide semiconductor films 308a and 308b and the metal oxide film 308c varies within a range of ±20% of the above atomic ratio as an error.

The oxide semiconductor films 308a and 308b and the metal oxide film 308c may have a non-single-crystal structure, for example. The non-single crystal structure includes a c-axis aligned crystalline oxide semiconductor (CAAC-OS) which is described later, a polycrystalline structure, a microcrystalline structure described later, or an amorphous structure, for example. Among the non-single crystal structure, the amorphous structure has the highest density of defect levels, whereas CAAC-OS has the lowest density of defect levels. Note that the oxide semiconductor films 308a and 308b and the metal oxide film 308 have the same crystallinity.

Note that the oxide semiconductor films 308a and 308b and the metal oxide film 308c may each be a mixed film including two or more of the following: a region having an amorphous structure, a region having a microcrystalline structure, a region having a polycrystalline structure, a CAAC-OS region, and a region having a single-crystal structure. The mixed film has a single structure including, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure of two or more of a region having an amorphous structure, a region having a microcrystalline structure, a region having a polycrystalline structure, a CAAC-OS region, and a region having a single-crystal structure in some cases.

When silicon or carbon which is one of elements belonging to Group 14 is contained in the oxide semiconductor films 308a and 308b, oxygen vacancies are increased, and the oxide semiconductor films 308a and 308b each have an n-type region. Thus, the concentration of silicon or carbon (the concentration is measured by SIMS) of each of the oxide semiconductor films 308a and 308b is lower than or equal to $2 \times 10^{18}$ atoms/cm$^3$, preferably lower than or equal to $2 \times 10^{17}$ atoms/cm$^3$.

Further, the concentration of alkali metal or alkaline earth metal of each of the oxide semiconductor films 308a and 308b, which is measured by SIMS, is lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of each of the oxide semiconductor films 308a and 308b.

Further, when containing nitrogen, the oxide semiconductor films 308a and 308b each easily have an n-type region by generation of electrons serving as carriers and an increase of carrier density. Thus, a transistor including an oxide semiconductor which contains nitrogen is likely to be normally on. For this reason, nitrogen in the oxide semiconductor film is preferably reduced as much as possible; the concentration of nitrogen which is measured by SIMS is preferably set to, for example, lower than or equal to $5 \times 10^{18}$ atoms/cm$^3$.

An oxide semiconductor film with low carrier density is used as the oxide semiconductor films 308a and 308b. For example, an oxide semiconductor film whose carrier density is $1 \times 10^{17}$/cm$^3$ or lower, preferably $1 \times 10^{15}$/cm$^3$ or lower, more preferably $1 \times 10^{13}$/cm$^3$ or lower, much more preferably $1 \times 10^{11}$/cm$^3$ or lower is used as the oxide semiconductor films 308a and 308b.

Note that, without limitation to that described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor films 308a and 308b be set to be appropriate.

The oxide semiconductor films 308a and 308b are in contact with the films each formed using a material which can improve characteristics of the interface with the oxide semiconductor film, such as the insulating film 306 and the insulating film 312. Thus, the oxide semiconductor films 308a and 308b function as semiconductors, so that the transistors including the oxide semiconductor films 308a and 308b have excellent electrical characteristics.

Note that it is preferable to use, as the oxide semiconductor films 308a and 308b, an oxide semiconductor film in which the impurity concentration is low and density of defect states is low, in which case the transistor can have excellent electrical characteristics. Here, the state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor film in which a channel region is formed rarely has a negative threshold voltage (is rarely normally-on). A highly purified intrinsic or substantially highly purified intrinsic oxide semiconductor film has a low density of defect states and accordingly has few carrier traps in some cases. Further, the highly purified intrinsic or substantially highly purified intrinsic oxide semiconductor film has an extremely low off-state current; even when an element has a channel width of $1\times10^6$ µm and a channel length (L) of 10 µm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. Examples of the impurities include hydrogen, nitrogen, alkali metal, and alkaline earth metal.

The metal oxide film 308c is formed by processing an oxide semiconductor film that is formed at the same time as the oxide semiconductor films 308a and 308b. Accordingly, the metal oxide film 308c contains a metal element the same as a metal element contained in the oxide semiconductor films 308a and 308b. Furthermore, the metal oxide film 308c has a crystal structure similar to or different from that of each of the oxide semiconductor films 308a and 308b. By adding impurities or oxygen vacancies to the oxide semiconductor film faulted at the same time as the oxide semiconductor films 308a and 308b, the oxide semiconductor film has conductivity and thus functions as an electrode of a capacitor. An example of the impurities contained in the oxide semiconductor film is hydrogen. Instead of hydrogen, as the impurity, boron, phosphorus, tin, antimony, a rare gas element, alkali metal, alkaline earth metal, or the like may be contained. Alternatively, the metal oxide film 308c is formed at the same time as the oxide semiconductor films 308a and 308b and has increased conductivity by including oxygen vacancies generated by plasma damage or the like. Alternatively, the metal oxide film 308c is formed at the same time as the oxide semiconductor films 308a and 308b and has increased conductivity by containing an impurity and including oxygen vacancies generated by plasma damage or the like.

The oxide semiconductor films 308a and 308b and the metal oxide film 308c are formed over the insulating film 306 and have different impurity concentrations. Specifically, the metal oxide film 308c has higher impurity concentration than the oxide semiconductor films 308a and 308b. For example, the concentration of hydrogen contained in each of the oxide semiconductor films 308a and 308b is lower than $5\times10^{19}$ atoms/cm$^3$, preferably lower than $1\times10^{19}$ atoms/cm$^3$, more preferably lower than or equal to $5\times10^{18}$ atoms/cm$^3$, much more preferably lower than or equal to $1\times10^{18}$ atoms/cm$^3$, still more preferably lower than or equal to $5\times10^{17}$ atoms/cm$^3$, still further more preferably lower than or equal to $1\times10^{16}$ atoms/cm$^3$. The concentration of hydrogen contained in the metal oxide film 308c is higher than or equal to $8\times10^{19}$ atoms/cm$^3$, preferably higher than or equal to $1\times10^{20}$ atoms/cm$^3$, more preferably higher than or equal to $5\times10^{20}$ atoms/cm$^3$. The concentration of hydrogen contained in the metal oxide film 308c is twice or more, preferably 10 times or more that in each of the oxide semiconductor films 308a and 308b.

By exposing the oxide semiconductor film formed at the same time as the oxide semiconductor films 308a and 308b to plasma, the oxide semiconductor film can be damaged, so that oxygen vacancies can be formed. For example, when a film is formed over the oxide semiconductor film by plasma-enhanced CVD or sputtering, the oxide semiconductor film is exposed to plasma and oxygen vacancies are generated. Alternatively, when the oxide semiconductor film is exposed to plasma in etching treatment for formation of the insulating film 312, oxygen vacancies are generated. Alternatively, when the oxide semiconductor film is exposed to plasma of, for example, hydrogen, a rare gas, ammonia, a mixed gas of oxygen and hydrogen, oxygen vacancies are generated. As a result, the conductivity of the oxide semiconductor film is increased, so that the oxide semiconductor film has conductivity and functions as the metal oxide film 308c.

In other words, the metal oxide film 308c is formed using an oxide semiconductor film having high conductivity. It can also be said that the metal oxide film 308c is formed using a metal oxide film having high conductivity.

In the case where a silicon nitride film is used as the insulating film 314, the silicon nitride film contains hydrogen. Thus, when hydrogen in the insulating film 314 is diffused into the oxide semiconductor film formed at the same time as the oxide semiconductor films 308a and 308b, hydrogen is bonded to oxygen and electrons serving as carriers are generated in the oxide semiconductor film. When the silicon nitride film is formed by plasma-enhanced CVD or sputtering, the oxide semiconductor film is exposed to plasma and oxygen vacancies are generated in the oxide semiconductor film. When hydrogen contained in the silicon nitride film enters the oxygen vacancies, electrons serving as carriers are generated. As a result, the conductivity of the oxide semiconductor film is increased, so that the oxide semiconductor film becomes the metal oxide film 308c.

When hydrogen is added to an oxide semiconductor including oxygen vacancies, hydrogen enters oxygen vacant sites and forms a donor level in the vicinity of the conduction band. As a result, the conductivity of the oxide semiconductor is increased, so that the oxide semiconductor becomes a conductor. An oxide semiconductor having become a conductor can be referred to as an oxide conductor. That is, it can be said that the metal oxide film 308c is formed with an oxide conductor film. Oxide semiconductors generally have a visible light-transmitting property because of their large energy gap. An oxide conductor has a donor level in the vicinity of the conduction band. Therefore, the influence of absorption due to the donor level is small, and an oxide conductor has a visible light-transmitting property comparable to that of an oxide semiconductor.

The metal oxide film 308c has lower resistivity than the oxide semiconductor films 308a and 308b. The resistivity of the metal oxide film 308c is preferably greater than or equal to $1\times10^{-8}$ times and less than $1\times10^{-1}$ times the resistivity of each of the oxide semiconductor films 308a and 308b. The resistivity of the metal oxide film 308c is typically greater than or equal to $1\times10^{-3}$ Ωcm and less than $1\times10^{4}$ Ωcm, preferably greater than or equal to $1\times10^{-3}$ Ωcm and less than $1\times10^{-1}$ Ωcm.

Note that one embodiment of the present invention is not limited thereto, and it is possible that the metal oxide film 308c be not in contact with the insulating film 314 depending on circumstances.

Furthermore, one embodiment of the present invention is not limited thereto, and the metal oxide film 308c may be formed by a process different from that of the oxide semiconductor film 308a or 308b depending on circumstances. In that case, the metal oxide film 308c may include a material different from that of the oxide semiconductor film 308a or 308b. For example, the metal oxide film 308c may include ITO or indium zinc oxide.

In the liquid crystal display device described in this embodiment, the capacitor has a light-transmitting property. As a result, the area occupied by the capacitor can be increased and the aperture ratio in a pixel can be increased.

The conductive films 310a, 310b, 310c, 310d, and 310e are formed to have a single-layer structure or a stacked-layer structure including, as a conductive material, any of metals such as aluminum, titanium, chromium, nickel, copper, yttrium, zirconium, molybdenum, silver, tantalum, and tungsten or an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The insulating films 312 and 314 are formed as the inorganic insulating film 53 over the insulating film 306, the oxide semiconductor films 308a and 308b, the metal oxide film 308c, and the conductive films 310a, 310b, 310c, 310d, and 310e. For the insulating film 312, in a manner similar to that of the insulating film 306, a material which can improve characteristics of the interface with the oxide semiconductor film is preferably used. The insulating film 312 can be formed using an oxide insulating film. Here, the insulating film 312 is formed by stacking insulating films 312a and 312b.

The insulating film 312a is an oxide insulating film through which oxygen is passed. Note that the insulating film 312a also serves as a film which relieves damage to the oxide semiconductor films 308a and 308b and the metal oxide film 308c at the time of forming the insulating film 312b later.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 312a. Note that in this specification, a "silicon oxynitride film" refers to a film that contains oxygen at a higher proportion than nitrogen, and a "silicon nitride oxide film" refers to a film that contains nitrogen at a higher proportion than oxygen.

The insulating film 312a is an oxide insulating film. It is preferable that the oxide insulating film contain nitrogen and have a small amount of defects.

Typical examples of the oxide insulating film containing nitrogen and having a small number of defects include a silicon oxynitride film and an aluminum oxynitride film.

In an ESR spectrum at 100 K or lower of the oxide insulating film containing nitrogen and having a small number of defects, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width the second and third signals that are obtained by measurement using an X-band are each approximately 5 mT. The sum of the spin densities of the first signal that appears at a g-factor of greater than or equal to 2.037 and smaller than or equal to 2.039, the second signal that appears at a g-factor of greater than or equal to 2.001 and smaller than or equal to 2.003, and the third signal that appears at a g-factor of greater than or equal to 1.964 and smaller than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than or equal to 0 and less than or equal to 2, preferably greater than or equal to 1 and less than or equal to 2). Typical examples of nitrogen oxide include nitrogen monoxide and nitrogen dioxide. Accordingly, the lower the sum of the spin densities of the first signal that appears at a g-factor of greater than or equal to 2.037 and smaller than or equal to 2.039, the second signal that appears at a g-factor of greater than or equal to 2.001 and smaller than or equal to 2.003, and the third signal that appears at a g-factor of greater than or equal to 1.964 and smaller than or equal to 1.966 is, the smaller the amount of nitrogen oxide contained in the oxide insulating film is.

When the amount of nitrogen oxide contained in the insulating film 312a is small as described above, carrier traps at the interface between the insulating film 312a and an oxide semiconductor film can be reduced. Thus, a change in the threshold voltage of the transistor included in the semiconductor device can be reduced, which leads to a reduced change in the electrical characteristics of the transistor.

The insulating film 312a preferably has a nitrogen concentration measured by secondary ion mass spectrometry (SIMS) of lower than or equal to $6 \times 10^{20}$ atoms/cm$^3$. In that case, nitrogen oxide is unlikely to be generated in the insulating film 312a, so that the carrier trap at the interface between the insulating film 312a and the oxide semiconductor films 308a and 308b can be inhibited. Furthermore, a change in the threshold voltage of the transistor included in the semiconductor device can be reduced, which leads to a reduced change in the electrical characteristics of the transistor.

Note that when a nitrogen oxide and ammonia are contained in the insulating film 312a, the nitrogen oxide and ammonia react with each other by heat treatment in the manufacturing process, so that the nitrogen oxide becomes a nitrogen gas to be released. As a result, the nitrogen concentration and the content of nitrogen oxide in the insulating film 312a can be reduced. In addition, carrier traps at the interfaces between the insulating film 312a and the oxide semiconductor film 308a and between the insulating film 312a and the oxide semiconductor film 308b can be reduced. Furthermore, a change in the threshold voltage of the transistor included in the semiconductor device can be reduced, which leads to a reduced change in the electrical characteristics of the transistor.

Note that in the insulating film 312a, all oxygen entering the insulating film 312a from the outside does not move to the outside of the insulating film 312a and some oxygen remains in the insulating film 312a. Further, movement of oxygen occurs in the insulating film 312a in some cases in such a manner that oxygen enters the insulating film 312a and oxygen contained in the insulating film 312a is moved to the outside of the insulating film 312a.

When the oxide insulating film through which oxygen is passed is formed as the insulating film 312a, oxygen released from the insulating film 312b provided over the insulating film 312a can be moved to the oxide semiconductor films 308a and 308b through the insulating film 312a.

The insulating film 312b is formed in contact with the insulating film 312a. The insulating film 312b is preferably formed using an oxide insulating film which contains oxygen at a higher proportion than the stoichiometric composition. Part of oxygen is released by heating from the oxide insulating film which contains oxygen at a higher proportion than the stoichiometric composition. The oxide insulating film containing oxygen at a higher proportion than the stoichiometric composition is an oxide insulating film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 312b.

Further, it is preferable that the amount of defects in the insulating film 312b be small, typically the spin density of a signal which appears at g=2.001 originating from a dangling bond of silicon, be lower than $1.5 \times 10^{18}$ spins/cm$^3$, more preferably lower than or equal to $1 \times 10^{18}$ spins/cm$^3$ by ESR measurement. Note that the insulating film 312b is provided more apart from the oxide semiconductor films 308a and 308b than the insulating film 312a is; thus, the insulating film 312b may have higher defect density than the insulating film 312a.

Further, it is possible to prevent outward diffusion of oxygen from the oxide semiconductor films 308a and 308b and the metal oxide film 308c by providing the nitride insulating film having a blocking effect against oxygen, hydrogen, water, alkali metal, alkaline earth metal, and the like as the insulating film 314. As the nitride insulating film, a silicon nitride film, a silicon nitride oxide film, an aluminum nitride film, an aluminum nitride oxide, or the like.

Note that over the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, aluminum oxide, aluminum oxynitride, gallium oxide, gallium oxynitride, yttrium oxide, yttrium oxynitride, hafnium oxide, and hafnium oxynitride can be given. In order to control the capacity value of the capacitor, a nitride insulating film or an oxide insulating film may be further provided over the nitride insulating film having a blocking effect against oxygen, hydrogen, water, alkali metal, alkaline earth metal, and the like, as appropriate.

The conductive film 316b is formed over the insulating film 314, and can function as an electrode of the capacitor.

The conductive film 316b can be formed using a conductive material having a light-transmitting property. As the conductive material having a light-transmitting property, indium oxide including tungsten oxide, indium zinc oxide including tungsten oxide, indium oxide including titanium oxide, indium tin oxide including titanium oxide, ITO, indium zinc oxide, indium tin oxide to which silicon oxide is added, or the like can be used.

For the organic insulating film 317, an organic resin such as an acrylic resin, polyimide, or an epoxy resin can be used. The thickness of the organic insulating film 317 is 500 to 5000 nm, preferably 1000 to 3000 nm. In the case where the thickness of the organic insulating film 317 is larger than or equal to the above thickness, a depressed portion of the conductive film 316b can be filled with the organic insulating film 317; thus, unevenness of a region on which an alignment film 320 is formed can be reduced.

By forming the organic insulating film 317 with an organic resin, at least the depressed portion of the conductive film 316b functioning as the pixel electrode can be filled with the organic insulating film 317, so that the uneven alignment of the liquid crystal material included in the liquid crystal layer 321 can be reduced.

The conductive films 319 and 319a are formed over the organic insulating film 317. The conductive film 319 functions as a pixel electrode. The conductive film 319a is electrically connected to the conductive film 310a through the opening 364a (see FIG. 9A) and electrically connected to the conductive film 310c through the opening 364b (see FIG. 9A). That is, the conductive film 319a functions as a connection electrode which connects the conductive film 304a and the conductive film 310c.

The organic insulating film 317 is not limited the above description. For example, the organic insulating film 317 can function as a color filter or a black matrix. For example, in the case where the organic insulating film 317 functions as a color filter, the organic insulating film 317 colored in accordance with red pixels, blue pixels, and green pixels, for example, may be formed.

The conductive films 319 and 319a, as well as the conductive film 316b, can be formed with a light-transmitting conductive material.

To form a connection structure in which the conductive film 304a is in direct contact with the conductive film 310c, it is necessary to perform patterning for forming an opening in the insulating films 305 and 306 and to form a mask before the conductive film 310c is formed. However, the photomask is not needed to obtain the connection structure in FIG. 4. When the conductive film 304a is connected to the conductive film 310c with the conductive film 319a as illustrated in FIG. 4, it is not necessary to form a connection portion where the conductive film 304a is in direct contact with the conductive film 310c. Thus, the number of photomasks can be reduced by one. That is, the number of steps for forming a liquid crystal display device can be reduced.

The alignment film 320 preferably has a light-transmitting property, and typically can be formed with an organic resin such as an acrylic resin, polyimide, or an epoxy resin.

A film having a colored property (hereinafter referred to as a colored film 346) is formed on the substrate 342. The colored film 346 functions as a color filter. Further, a light-blocking film 344 adjacent to the colored film 346 is formed on the substrate 342. The light-blocking film 344 functions as a black matrix. The colored film 346 is not necessarily provided in the case where the liquid crystal display device displays monochrome images, for example.

The colored film 346 is a colored film that transmits light in a specific wavelength range. For example, a red (R) film for transmitting light in a red wavelength range, a green (G) film for transmitting light in a green wavelength range, a blue (B) film for transmitting light in a blue wavelength range, or the like can be used.

The light-blocking film 344 preferably has a function of blocking light in a particular wavelength region, and can be a metal film or an organic insulating film including a black pigment.

An insulating film 348 is formed on the colored film 346. The insulating film 348 functions as a planarization layer or suppresses diffusion of impurities in the colored film 346 to the liquid crystal element side.

The conductive film 350 is formed on the insulating film 348. The conductive film 350 functions as the other of the pair of electrodes of the liquid crystal element in the pixel portion. Note that the insulating film 352 is formed on the conductive films 319 and 319a and the conductive film 350.

The liquid crystal layer 321 is formed between the conductive film 319 and the conductive film 350, and the conductive film 319a and the conductive film 350. The liquid crystal layer 321 is sealed between the substrate 302 and the substrate 342 with the use of a sealant (not illustrated). The sealant is preferably in contact with an inorganic material to prevent entry of moisture and the like from the outside.

A spacer may be provided between the conductive film 319 and the conductive film 350, and the conductive film 319a and the conductive film 350 to maintain the thickness of the liquid crystal layer 321 (also referred to as a cell gap).

A formation method of the element portion over the substrate 302 in the liquid crystal display device illustrated in FIG. 4 is described with reference to FIGS. 5A to 5C, FIGS. 6A to 6C, FIGS. 7A and 7B, and FIGS. 8A to 8C. Here, the element portion provided over the substrate 302 refers to a region sandwiched between the substrate 302 and the alignment film 320.

Films of the transistor (e.g., an insulating film, a semiconductor film, an oxide semiconductor film, a metal oxide film, and a conductive film) can be formed by sputtering, chemical vapor deposition (CVD), vacuum vapor deposition, or pulsed laser deposition (PLD). Alternatively, the films of the transistor can be formed by a coating method or a printing method. Although sputtering and plasma-enhanced chemical vapor deposition (PECVD) are typical examples of the deposition method, thermal CVD may be used. As thermal CVD, metal organic chemical vapor deposition (MOCVD) or atomic layer deposition (ALD) may be used, for example.

Deposition by thermal CVD is performed in such a manner that pressure in a chamber is set to atmospheric pressure or reduced pressure, and a source gas and an oxidizer are supplied to the chamber at the same time and react with each other in the vicinity of the substrate or over the substrate. In this manner, thermal CVD does not generate plasma and thus has an advantage that no defect due to plasma damage is caused.

Deposition by ALD is performed in such a manner that pressure in a chamber is set to atmospheric pressure or reduced pressure, source gases for reaction are sequentially introduced into the chamber, and then the sequence of gas introduction is repeated. For example, two or more kinds of source gases are sequentially supplied to the chamber by switching switching valves (also referred to as high-speed valves). In such a case, a first source gas is introduced, an inert gas (e.g., argon or nitrogen) or the like is introduced at the same time as or after introduction of the first gas so that the source gases are not mixed, and then a second source gas is introduced. Note that in the case where the first source gas and the inert gas are introduced at the same time, the inert gas serves as a carrier gas, and the inert gas may be introduced at the same time as introduction of the second source gas. Alternatively, the first source gas may be exhausted by vacuum evacuation instead of introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed.

The sequence of gas introduction is repeated more than once until desired thickness is obtained, so that a thin film with excellent step coverage can be formed. The thickness of the thin film can be adjusted by the number of repetition times of the sequence of gas introduction; therefore, ALD makes it possible to adjust thickness accurately and thus is suitable for manufacturing a scaled transistor.

First, the substrate 302 is prepared. Here, a glass substrate is used as the substrate 302.

Then, a conductive film is formed over the substrate 302 and processed into a desired shape to form the conductive films 304a, 304b, and 304c. The conductive films 304a, 304b, and 304c can be formed in such a manner that a mask is formed in a shape by first patterning and regions that are not covered with the mask are etched (see FIG. 5A).

The conductive films 304a, 304b, and 304c can be formed typically by sputtering, vacuum evaporation, pulsed laser deposition (PLD), thermal CVD, or the like.

A tungsten film to be the conductive films 304a, 304b, and 304c can be formed with a deposition apparatus utilizing an ALD method. In that case, a $WF_6$ gas and a $B_2H_6$ gas are sequentially introduced more than once to form an initial tungsten film, and then a $WF_6$ gas and an $H_2$ gas are introduced at the same time, so that a tungsten film is formed. Note that an $SiH_4$ gas may be used instead of a $B_2H_6$ gas.

Next, the insulating film 305 is formed over the substrate 302 and the conductive films 304a, 304b, and 304c, and then the insulating film 306 is formed over the insulating film 305 (see FIG. 5A).

The insulating films 305 and 306 are formed by sputtering, CVD, vacuum vapor deposition, PLD, thermal CVD, or the like. Note that it is preferable that the insulating films 305 and 306 be formed in succession in a vacuum because entry of impurities is inhibited.

When a silicon oxide film or a silicon oxynitride film is formed as each of the insulating films 305 and 306, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

In the case where gallium oxide films are formed as the insulating film 305 and the insulating film 306, MOCVD can be used.

In the case where a hafnium oxide film is formed as each of the insulating films 305 and 306 with a deposition apparatus using ALD, two kinds of gases, i.e., ozone ($O_3$) as an oxidizer and a source gas that is obtained by vaporizing liquid containing a solvent and a hafnium precursor compound (a hafnium alkoxide solution, typically tetrakis (dimethylamide) hafnium (TDMAH)) are used. Note that the chemical formula of tetrakis (dimethylamide) hafnium is Hf[N(CH$_3$)$_2$]$_4$. Examples of another material liquid include tetrakis (ethylmethylamide) hafnium.

In the case where an aluminum oxide film is formed as each of the insulating films 305 and 306 with a deposition apparatus using ALD, two kinds of gases, e.g., H$_2$O as an oxidizer and a source gas that is obtained by vaporizing liquid containing a solvent and an aluminum precursor compound (e.g., trimethylaluminum (TMA)) are used. Note that the chemical formula of trimethylaluminum is Al(CH$_3$)$_3$. Examples of another material liquid include tris (dimethylamide)aluminum, triisobutylaluminum, and aluminum tris(2,2,6,6-tetramethyl-3,5-heptanedionate).

In the case where a silicon oxide film is formed as each of the insulating films 305 and 306 with a deposition apparatus using ALD, hexachlorodisilane is adsorbed on a deposition surface, chlorine contained in adsorbate is removed, and radicals of an oxidizing gas (e.g., O$_2$ or dinitrogen monoxide) are supplied to react with the adsorbate.

Next, the oxide semiconductor film 307 is formed over the insulating film 306 (see FIG. 5B).

The oxide semiconductor film 307 can be formed by sputtering, pulsed laser deposition, laser ablation, thermal CVD, or the like.

As a sputtering gas, a rare gas (typically argon), an oxygen gas, or a mixed gas of a rare gas and an oxygen gas is used as appropriate. In the case where the mixed gas of a rare gas and oxygen is used, the proportion of oxygen to a rare gas is preferably increased.

A target may be selected as appropriate in accordance with the composition of an oxide semiconductor film to be formed.

For example, in the case where the oxide semiconductor film is formed by sputtering at a substrate temperature of 150° C. to 750° C., preferably 150° C. to 450° C., more preferably 200° C. to 350° C., the oxide semiconductor film can be a CAAC-OS film.

For the deposition of the CAAC-OS film, the following conditions are preferably employed.

By inhibiting entry of impurities during the deposition, the crystal state can be prevented from being broken by the impurities. For example, the concentration of impurities (e.g., hydrogen, water, carbon dioxide, or nitrogen) that exist in a deposition chamber may be reduced. Furthermore, the concentration of impurities in a deposition gas may be reduced. Specifically, a deposition gas whose dew point is −80° C. or lower, preferably −100° C. or lower is used.

In the case where an oxide semiconductor film, e.g., an InGaZnO film is formed using a deposition apparatus employing ALD, an In(CH$_3$)$_3$ gas and an O$_3$ gas are sequentially introduced more than once to form an InO layer, a Ga(CH$_3$)$_3$ gas and an O$_3$ gas are introduced at the same time to form a GaO layer, and then a Zn(CH$_3$)$_2$ gas and an O$_3$ gas are introduced at the same time to form a ZnO layer. Note that the order of these layers is not limited to this example. A mixed compound layer such as an InGaO layer, an InZnO layer, or a GaZnO layer may be formed by mixing of these gases. Although an H$_2$O gas that is obtained by bubbling with an inert gas such as Ar may be used instead of an O$_3$ gas, it is preferable to use an O$_3$ gas that does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Instead of an In(CH$_3$)$_3$ gas, an In(C$_2$H$_5$)$_3$ gas may be used. Furthermore, a Zn(CH$_3$)$_2$ gas may be used.

Next, the oxide semiconductor film 307 is processed into a desired shape to form the island-shaped oxide semiconductor films 308a, 308b, and 308d. The oxide semiconductor films 308a, 308b, and 308d can be formed in such a manner that a mask is formed in a desired shape by second patterning and regions that are not covered with the mask are etched. Dry etching, wet etching, or a combination of dry etching and wet etching can be employed as etching (see FIG. 5C).

After that, hydrogen, water, and the like may be released from the oxide semiconductor films 308a, 308b, and 308d by heat treatment and the hydrogen concentration and the water concentration in the oxide semiconductor films 308a, 308b, and 308d may be reduced. As a result, highly purified oxide semiconductor films 308a, 308b, and 308d can be formed. The heat treatment is performed typically at a temperature of 250° C. to 650° C., preferably 300° C. to 500° C. The heat treatment is performed typically at a temperature of 300° C. to 400° C., preferably 320° C. to 370° C., so that warp or shrinkage of a large-area substrate can be reduced and yield can be improved.

An electric furnace, an RTA apparatus, or the like can be used for the heat treatment. With the use of an RTA apparatus, the heat treatment can be performed at a temperature of higher than or equal to the strain point of the substrate if the heating time is short. Thus, the heat treatment time can be shortened and warp of the substrate during the heat treatment can be reduced, which is particularly preferable in a large-area substrate.

The heat treatment may be performed under an atmosphere of nitrogen, oxygen, ultra-dry air (air in which water content is 20 ppm or less, preferably 1 ppm or less, more preferably 10 ppb or less), or a rare gas (e.g., argon or helium). The atmosphere of nitrogen, oxygen, ultra-dry air, or a rare gas preferably does not contain hydrogen, water, and the like. Furthermore, after heat treatment is performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film and oxygen can be supplied to the oxide semiconductor film at the same time. Consequently, the number of oxygen vacancies in the oxide semiconductor film can be reduced.

In the case where the deposition temperature of an insulating film 311a formed later is 280° C. to 400° C., hydrogen, water, and the like can be released from the oxide semiconductor films 308a, 308b, and 308d; thus, the heat treatment is not necessary.

Figure 6A:
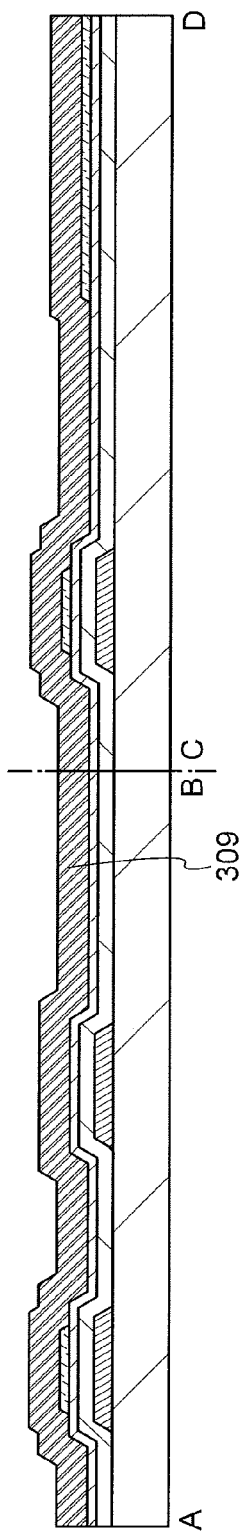
FIGS. 6A to 6C are cross-sectional views illustrating one embodiment of a method of manufacturing a semiconductor device.
Figure 6B:
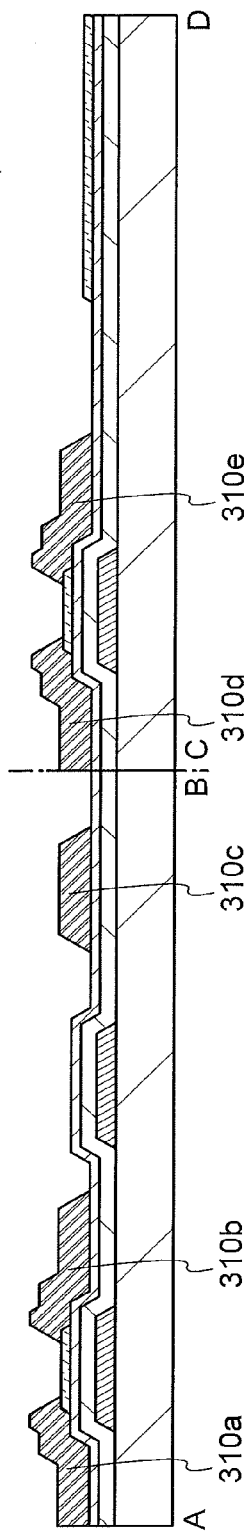

Next, the conductive film 309 is formed over the insulating film 306 and the oxide semiconductor films 308a, 308b, and 308d (see FIG. 6A).

The conductive film 309 can be formed by sputtering, vacuum vapor deposition, PLD, thermal CVD, or the like.

Then, the conductive film 309 is processed into a desired shape to form the conductive films 310a, 310b, 310c, 310d, and 310e. Note that the conductive films 310a, 310b, 310c, 310d, and 310e can be formed in such a manner that a mask is formed in a desired shape by third patterning and regions that are not covered with the mask are etched (see FIG. 6B).

Figure 6C:
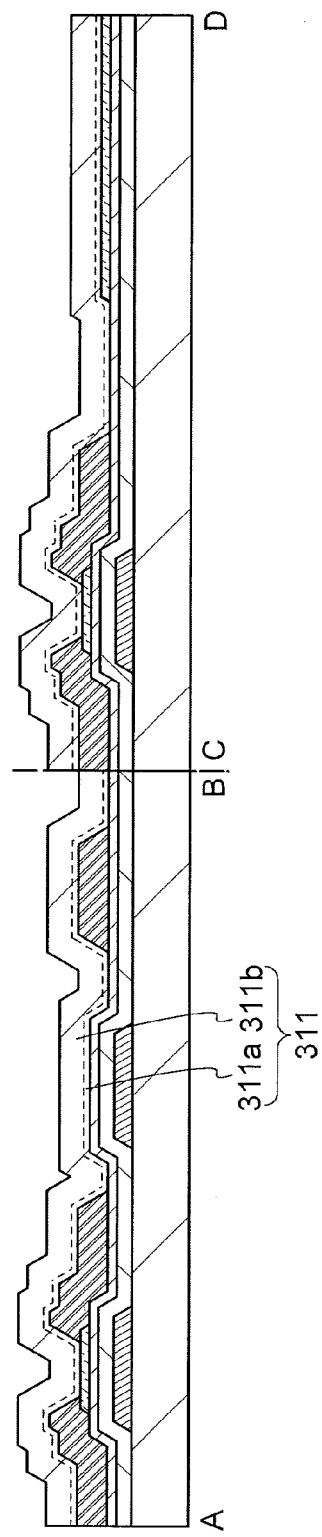

Next, an insulating film 311 in which insulating films 311a and 311b are stacked is formed to cover the insulating film 306, the oxide semiconductor films 308a, 308b, and 308d, and the conductive films 310a, 310b, 310c, 310d, and 310e (see FIG. 6C). The insulating film 311 can be formed by sputtering, CVD, vapor deposition, or the like.

Note that after the insulating film 311a is formed, the insulating film 311b is preferably formed in succession without exposure to the air. After the insulating film 311a is formed, the insulating film 311b is formed in succession by adjusting at least one of the flow rate of a source gas, pressure, high-frequency power, and substrate temperature without exposure to the air, so that the concentration of impurities attributed to an atmospheric component at an interface between the insulating films 311a and 311b can be lowered and oxygen in the insulating film 311b can be moved to the oxide semiconductor films 308a, 308b, and 308d. Accordingly, the number of oxygen vacancies in the oxide semiconductor films 308a, 308b, and 308d can be reduced.

An oxide insulating film containing nitrogen and having a small number of defects can be formed as the insulating film 311a by CVD under the conditions that the ratio of an oxidizing gas to a deposition gas is higher than 20 times and lower than 100 times, preferably higher than or equal to 40 times and lower than or equal to 80 times and pressure in a treatment chamber is lower than 100 Pa, preferably lower than or equal to 50 Pa.

A deposition gas containing silicon and an oxidizing gas are preferably used as the source gas of the insulating film 311a. Typical examples of the deposition gas containing silicon include silane, disilane, trisilane, and silane fluoride. Examples of the oxidizing gas include oxygen, ozone, dinitrogen monoxide, and nitrogen dioxide.

Under the above conditions, an oxide insulating film that passes oxygen can be formed as the insulating film 311a. With the insulating film 311a, damage to the oxide semiconductor films 308a, 308b, and 308d can be reduced in a step of forming the insulating film 311b formed later.

As the insulating film 311b, a silicon oxide film or a silicon oxynitride film is formed under the following conditions: a substrate placed in a vacuum-evacuated treatment chamber of a plasma-enhanced CVD apparatus is held at a temperature of 180° C. to 280° C., preferably 200° C. to 240° C., a source gas is introduced into the treatment chamber, pressure in the treatment chamber is 100 Pa to 250 Pa, preferably 100 Pa to 200 Pa, and a high-frequency power of 0.17 W/cm$^2$ to 0.5 W/cm$^2$, preferably 0.25 W/cm$^2$ to 0.35 W/cm$^2$ is supplied to an electrode provided in the treatment chamber.

A deposition gas containing silicon and an oxidizing gas are preferably used as the source gas of the insulating film 311b. Typical examples of the deposition gas containing silicon include silane, disilane, trisilane, and silane fluoride. Examples of the oxidizing gas include oxygen, ozone, dinitrogen monoxide, and nitrogen dioxide.

In the deposition conditions of the insulating film 311b, when the high-frequency power with the above power density is supplied to the treatment chamber at the above pressure, the decomposition efficiency of the source gas in plasma is increased, oxygen radicals are increased, and oxidation of the source gas is promoted; therefore, the oxygen content of the insulating film 311b becomes higher than in the stoichiometric composition. However, when the substrate temperature is the deposition temperature of the insulating film 311b, the bond between silicon and oxygen is weak; thus, part of oxygen is released by heating. Thus, it is possible to form an oxide insulating film which contains oxygen at higher proportion than the stoichiometric composition and from which part of oxygen is released by heating. Furthermore, the insulating film 311a is provided over the oxide semiconductor films 308a, 308b, and 308d. Accordingly, in the step of forming the insulating film 311b, the insulating film 311a serves as a protective film of the oxide semiconductor films 308a, 308b, and 308d. Consequently, the insulating film 311b can be formed using the high-frequency power having high power density while damage to the oxide semiconductor films 308a, 308b, and 308d is reduced.

Note that in the deposition conditions of the insulating film 311b, the flow rate of the deposition gas containing silicon relative to the oxidizing gas can be increased, so that the number of defects in the insulating film 311b can be reduced. Typically, it is possible to form an oxide insulating film containing nitrogen and having a small number of defects, i.e., the spin density of a signal that appears at g=2.001 due to a dangling bond of silicon, be lower than $6\times10^{17}$ spins/cm$^3$, preferably lower than or equal to $3\times10^{17}$ spins/cm$^3$, more preferably lower than or equal to $1.5\times10^{17}$ spins/cm$^3$ by ESR measurement. As a result, the reliability of the transistor can be increased.

Next, heat treatment is performed. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C. The heat treatment is performed typically at a temperature of higher than or equal to 300° C. and lower than or equal to 400° C., preferably higher than or equal to 320° C. and lower than or equal to 370° C., so that warp or shrinkage of a large-area substrate can be reduced and yield can be improved.

An electric furnace, an RTA apparatus, or the like can be used for the heat treatment. With the use of an RTA apparatus, the heat treatment can be performed at a temperature of higher than or equal to the strain point of the substrate if the heating time is short. Thus, the heat treatment time can be shortened.

The heat treatment may be performed under an atmosphere of nitrogen, oxygen, ultra-dry air (air in which water content is 20 ppm or less, preferably 1 ppm or less, more preferably 10 ppb or less), or a rare gas (e.g., argon or helium). The atmosphere of nitrogen, oxygen, ultra-dry air, or a rare gas preferably does not contain hydrogen, water, and the like.

By the heat treatment, part of oxygen contained in the insulating film 311b can be moved to the oxide semiconductor films 308a, 308b, and 308d to reduce the oxygen vacancies in the oxide semiconductor films 308a, 308b, and 308d. Consequently, the number of oxygen vacancies in the oxide semiconductor films 308a, 308b, and 308d can be further reduced.

In the case where water, hydrogen, or the like is contained in the insulating films 311a and 312b, when the insulating film 313 having a function of blocking water, hydrogen, and the like is formed later and heat treatment is performed, water, hydrogen, or the like contained in the insulating films 311a and 311b is moved to the oxide semiconductor films 308a, 308b, and 308d, so that defects are generated in the oxide semiconductor films 308a, 308b, and 308d. However, by the heating, water, hydrogen, or the like contained in the insulating films 311a and 311b can be released; thus, variations in electrical characteristics of the transistor can be reduced, and changes in the threshold voltage can be inhibited.

Note that when the insulating film 311b is formed over the insulating film 311a while being heated, oxygen can be moved to the oxide semiconductor films 308a, 308b, and 308d to compensate the oxygen vacancies in the oxide semiconductor films 308a, 308b, and 308d; thus, the heat treatment is not necessarily performed.

When the conductive films 310a, 310b, 310c, 310d, and 310e are formed, the oxide semiconductor films 308a, 308b, and 308d are damaged by etching of the conductive film, so that oxygen vacancies are generated on back channel sides (sides of the oxide semiconductor films 308a and 308b that are opposite to sides facing the conductive films 304a and 304c functioning as gate electrodes) of the oxide semiconductor films 308a and 308b. However, with the use of the oxide insulating film containing oxygen at higher proportion than the stoichiometric composition as the insulating film 311b, the oxygen vacancies generated on the back channel side can be repaired by heat treatment. This reduces defects contained in the oxide semiconductor films 308a and 308b to improve the reliability of the transistor.

Note that the heat treatment may be performed after formation of an opening 362 to be formed later.

Next, the insulating film 311 is processed into a desired shape to form the insulating film 312 and the opening 362. The insulating film 312 and the opening 362 can be formed in such a manner that a mask is formed in a desired shape by fourth patterning and regions that are not covered with the mask are etched (see FIG. 7A).

The opening 362 is formed to expose the surface of the oxide semiconductor film 308d. The opening 362 can be formed by dry etching, for example. The insulating film 311 is preferably etched by dry etching. In that case, the oxide semiconductor film 308d is exposed to plasma in the etching treatment; thus, oxygen vacancies in the oxide semiconductor film 308d can be increased. Note that the method for forming the opening 362 is not limited to dry etching, and wet etching or a combination of dry etching and wet etching may be employed.

Next, the insulating film 313 is formed over the insulating film 312 and the oxide semiconductor film 308d (see FIG. 7B).

The insulating film 313 is preferably formed using a material that prevents diffusion of impurities from the outside, such as oxygen, hydrogen, water, alkali metal, and alkaline earth metal, into the oxide semiconductor film, more preferably formed using the material including hydrogen, and typically an inorganic insulating material containing nitrogen, such as a nitride insulating film, can be used. The insulating film 313 can be formed by CVD or sputtering, for example.

When the insulating film 313 is formed by plasma-enhanced CVD or sputtering, the oxide semiconductor film is exposed to plasma and oxygen vacancies are generated in the oxide semiconductor film The insulating film 313 is formed using a material that prevents diffusion of impurities from the outside, such as water, alkali metal, and alkaline earth metal, into the oxide semiconductor film, and the material further includes hydrogen. Thus, when hydrogen in the insulating film 313 is diffused into the oxide semiconductor film 308d, hydrogen is bonded to oxygen and electrons serving as carriers are generated in the oxide semiconductor film 308d. Alternatively, when hydrogen enters the oxygen vacancies in the oxide semiconductor film, electrons serving as carriers are generated. As a result, the conductivity of the oxide semiconductor film 308d is increased, so that the oxide semiconductor film 308d becomes the metal oxide film 308c.

The insulating film 313 is preferably formed at high temperature to have an improved blocking property; for example, the silicon nitride film is preferably formed at a substrate temperature of 100° C. to 400° C., more preferably 300° C. to 400° C. When the silicon nitride film is formed at high temperature, a phenomenon in which oxygen is released from the oxide semiconductor used for the oxide semiconductor films 308a and 308b and carrier concentration is increased is caused in some cases; therefore, the upper limit of the temperature is temperature at which the phenomenon is not caused.

Figure 8A:
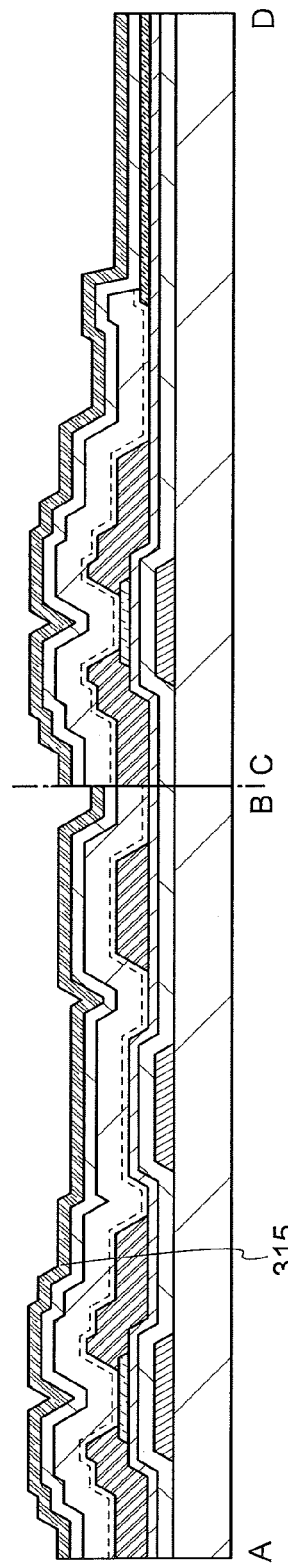
FIGS. 8A to 8C are cross-sectional views illustrating one embodiment of a method of manufacturing a semiconductor device.
Figure 8B:
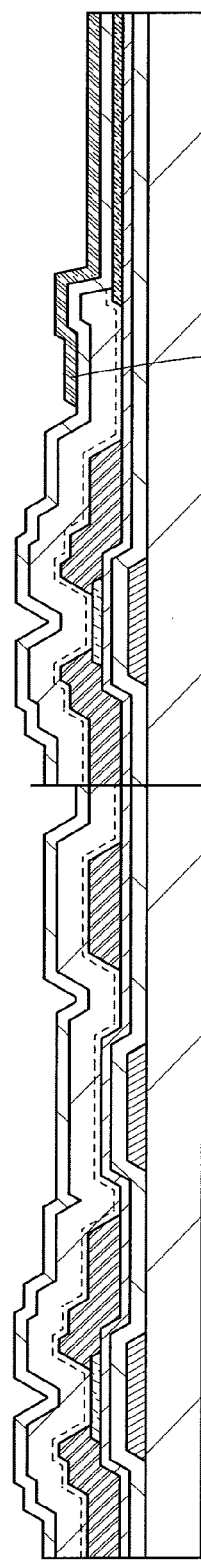

Next, a conductive film 315 is formed over the insulating film 314 (see FIG. 8A).

The conductive film 315 can be formed by sputtering, for example.

Then, the conductive film 315 is processed into a desired shape to form the conductive film 316b. The conductive film 316b are formed in such a manner that a mask is formed in a desired shape by fifth patterning and regions that are not covered with the mask are etched (see FIG. 8B).

Figure 8C:
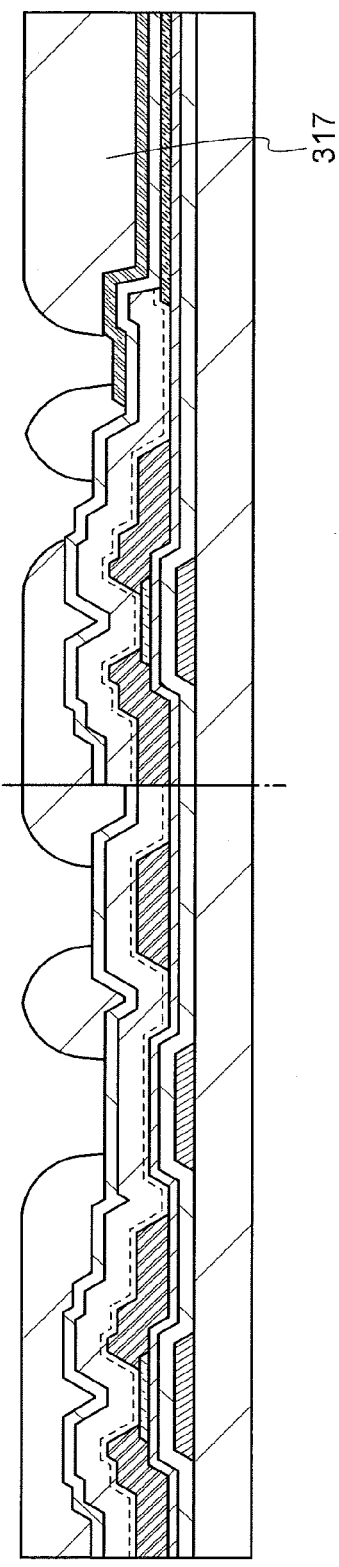

Next, the organic insulating film 317 is formed to cover the insulating film 314 and the conductive film 316b (see FIG. 8C). The organic insulating film 317 functioning as a planarization film has an opening that partly exposes the insulating film 313 and the conductive film 316b.

The organic insulating film 317 is formed in such a manner that a photosensitive composition is applied to the insulating film 313 and the conductive film 316b by a coating method such as a spin coating method or a dip coating method, exposed to light and developed in a photolithography process using a sixth photomask, and then subjected to heat treatment. Note that in the case where a non-photosensitive composition is applied to the insulating film 313 and the conductive film 316b, the organic insulating film 317 can be formed in such a manner that a resist is applied to the non-photosensitive composition and processed into a mask in a photolithography process using the sixth photomask, and the non-photosensitive composition is etched using the mask.

Note that in the formation of the organic insulating film 317, the number of photomasks can be reduced by employing a wet method such as an ink-jet method or a printing method.

Next, the insulating film 305, the insulating film 306, the insulating film 312, and the insulating film 313 are partly etched using the organic insulating film 317 as a mask to form the opening 364a from which the conductive film 304b is exposed, the opening 364b from which the conductive film 310c is exposed, the opening 364c from which the conductive film 310e is exposed, and the opening 364d from which the conductive film 316b is exposed (see FIG. 9A).

Next, a conductive film 318 is formed (see FIG. 9B).

The conductive film 318 can be formed by sputtering, for example.

Next, the conductive film 318 is processed into a desired shape to form conductive films 319 and 319a. The conductive films 319 and 319a can be formed in such a manner that a mask is formed in a desired shape by seventh patterning and regions not covered with the mask are etched (see FIG. 9C).

Through the above process, the pixel portion and the driver circuit portion that include transistors can be formed over the substrate 302. In the manufacturing process described in this embodiment, the transistors and the capacitor can be formed at the same time by the first to seventh patterning, that is, with the seven masks.

In this embodiment, the conductivity of the oxide semiconductor film 308d is increased by diffusing hydrogen contained in the insulating film 314 into the oxide semiconductor film 308d; however, the conductivity of the oxide semiconductor film 308d may be increased by covering the oxide semiconductor films 308a and 308b with a mask and adding impurities, typically, hydrogen, boron, phosphorus, tin, antimony, a rare gas element, alkali metal, alkaline earth metal, or the like to the oxide semiconductor film 308d. Hydrogen, boron, phosphorus, tin, antimony, a rare gas element, or the like is added to the oxide semiconductor film 308d by an ion doping method, an ion implantation method, or the like. Further, alkali metal, alkaline earth metal, or the like may be added to the oxide semiconductor film 308d by a method in which the oxide semiconductor film 308d is exposed to a solution that contains the impurity.

Next, an element portion formed over the substrate 342 provided so as to face the substrate 302 is described below. Here, the element portion provided over the substrate 342 refers to a region sandwiched between the substrate 342 and the alignment film 352.

First, the substrate 342 is prepared. For materials of the substrate 342, the materials that can be used for the substrate 302 can be referred to. Then, the light-blocking film 344 and the colored film 346 are formed over the substrate 342 (see FIG. 10A).

The light-blocking film 344 and the colored film 346 each are formed in a desired position with any of various materials by a printing method, an inkjet method, an etching method using a photolithography technique, or the like.

Then, the insulating film 348 is formed over the light-blocking film 344 and the colored film 346 (see FIG. 10B).

For the insulating film 348, an organic insulating film of an acrylic resin, an epoxy resin, polyimide, or the like can be used. With the insulating film 348, an impurity or the like contained in the colored film 346 can be prevented from diffusing into the liquid crystal layer 321, for example. Note that the insulating film 348 is not necessarily for med.

Then, the conductive film 350 is formed over the insulating film 348 (see FIG. 10C). As the conductive film 350, a material that can be used for the conductive film 315 can be used.

Through the above process, the structure formed over the substrate 342 can be formed.

Next, the alignment film 320 and the alignment film 352 are formed over the substrate 302 and the substrate 342 respectively, specifically, over the insulating film 314 and the conductive films 319 and 319a formed over the substrate 302 and over the conductive film 350 formed over the substrate 342. The alignment films 320 and 352 can be formed by a rubbing method, an optical alignment method, or the like. After that, the liquid crystal layer 321 is formed between the substrate 302 and the substrate 342. The liquid crystal layer 321 can be formed by a dispenser method (a dropping method), or an injecting method by which a liquid crystal is injected using a capillary phenomenon after the substrate 302 and the substrate 342 are bonded to each other.

Through the above process, the liquid crystal display device illustrated in FIG. 4 can be fabricated.

Note that the structures, methods, and the like described in this embodiment can be used as appropriate in combination with any of the structures, methods, and the like described in the other embodiments.

(Embodiment 3)

In this embodiment, a liquid crystal display device including a transistor different from that described in Embodiment 1 is described with reference to FIG. 11, FIG. 12, FIG. 13, FIG. 14, and FIG. 15.

Figure 11:
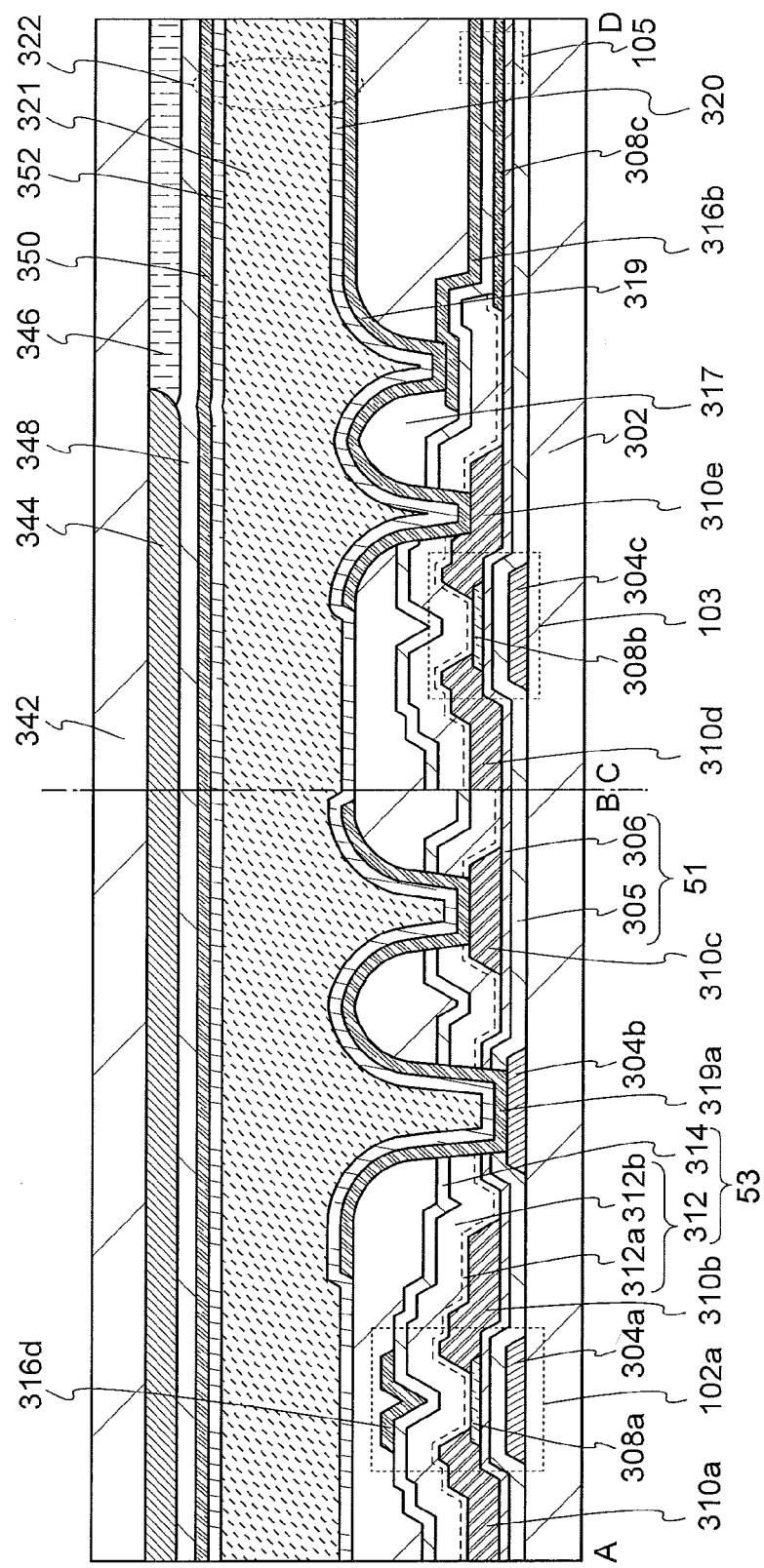
FIG. 11 is a cross-sectional view illustrating one embodiment of a semiconductor device.

A liquid crystal display device illustrated in FIG. 11 includes a transistor 102a with a dual-gate structure in a driver circuit portion illustrated in the cross section A-B.

The transistor 102a in the driver circuit portion includes the conductive film 304a being over the substrate 302 and functioning as a gate electrode; the insulating films 305 and 306 functioning as the gate insulating film 51; the oxide semiconductor film 308a over the insulating film 306; and the conductive films 310a and 310b functioning as a source electrode and a drain electrode and being in contact with the oxide semiconductor film 308a. The inorganic insulating film 53 is formed over the oxide semiconductor film 308a and the conductive films 310a and 310b, and a conductive film 316d functioning as a gate electrode is formed over the inorganic insulating film 53. The conductive film 316d functioning as a gate electrode is connected to the conductive film 304a functioning as a gate electrode in an opening (not illustrated) provided in the gate insulating film 51 and the inorganic insulating film 53. That is, the conductive film 304a and the conductive film 316a have the same potential.

Thus, by applying voltage at the same potential to each gate electrode of the transistor 102a, variation in the initial characteristics can be reduced, and degradation of the transistor 102a after the -GBT stress test and a change in the rising voltage of on-state current at different drain voltages can be suppressed. In addition, a region where carriers flow in the oxide semiconductor film 308a becomes larger in the film thickness direction, so that the amount of carrier movement is increased. As a result, the on-state current of the transistor 102a is increased, and the field-effect mobility is increased. Typically, the field-effect mobility is greater than or equal to 20 cm$^2$/V·s.

Defects are formed at an end portion of the oxide semiconductor film processed by etching or the like because of damage due to the processing, and the end portion of the oxide semiconductor film is polluted by attachment of impurities, or the like. Thus, when stress such as an electric field is applied, the end portion of the oxide semiconductor film is easily activated to be n-type (have low resistance). For this reason, the end portion of the oxide semiconductor film 308a overlapping with the conductive film 304a functioning as a gate electrode easily becomes n-type. When the end portion which becomes n-type is provided between the conductive films 310a and 310b functioning as a source electrode and a drain electrode, the region which becomes n-type functions as a carrier path, resulting in a parasitic channel. However, in the channel width direction, by providing the conductive film 316d functioning as a gate electrode, generation of a parasitic channel at a side surface of the oxide semiconductor film 308a or an end portion (including the side surface and the vicinity) of the oxide semiconductor film 308a due to an electric field generated in the conductive film 316d functioning as a gate electrode can be suppressed. As a result, a transistor which has excellent electrical characteristics such as a sharp increase in the drain current at the threshold voltage is obtained.

The conductive film 316d functioning as a gate electrode can be formed with the same material as the conductive film 316b in Embodiment 2, as appropriate.

<Modification Example 1>

Figure 12:
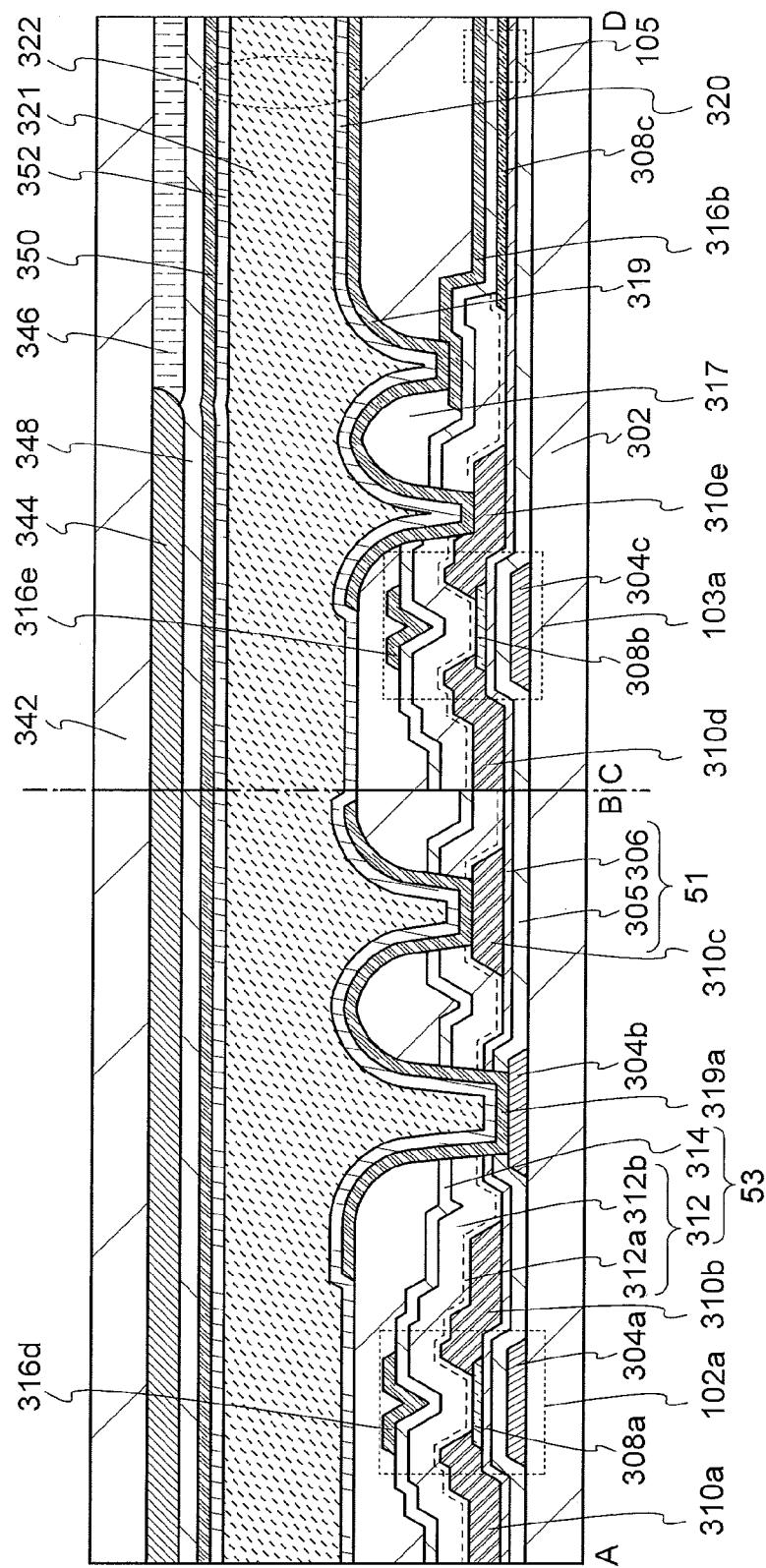
FIG. 12 is a cross-sectional view illustrating one embodiment of a semiconductor device.

Although the liquid crystal display device illustrated in FIG. 11 of Embodiment 3 includes the transistor with a dual-gate structure as a transistor in the driver circuit portion, as illustrated in FIG. 12, a transistor 103a with a dual-gate structure may be included in a pixel portion illustrated in the cross section C-D in addition to the transistor 102a with a dual-gate structure in the driver circuit illustrated in the cross section A-B.

The transistor 103a includes the conductive film 304c being over the substrate 302 and functioning as a gate electrode; the insulating films 305 and 306 functioning as the gate insulating film 51; the oxide semiconductor film 308b over the insulating film 306; and the conductive films 310d and 310e functioning as a source electrode and a drain electrode and being in contact with the oxide semiconductor film 308b. The inorganic insulating film 53 is formed over the oxide semiconductor film 308b and the conductive films 310d and 310e, and a conductive film 316e functioning as a gate electrode is formed over the inorganic insulating film 53. The conductive film 316e functioning as a gate electrode is connected to the conductive film 304c functioning as a gate electrode in an opening (not illustrated) provided in the gate insulating film 51 and the inorganic insulating film 53. That is, the conductive film 304c and the conductive film 316e have the same potential.

By providing a highly reliable transistor with a dual-gate structure having large on-state current and high field-effect mobility not only in the driver circuit portion but also in the pixel portion, the liquid crystal display device can have a high display quality.

<Modification Example 2>

Figure 13:
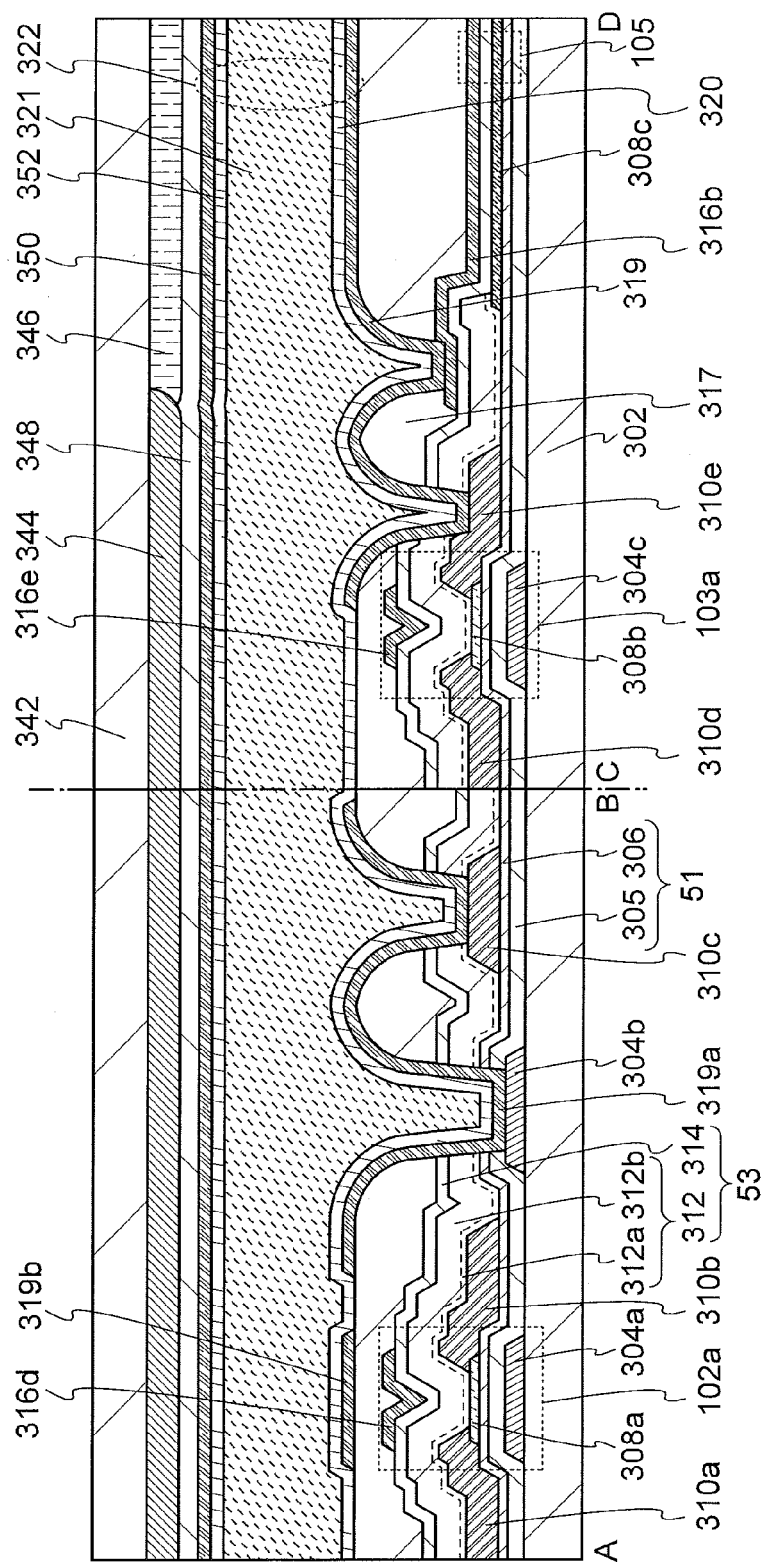
FIG. 13 is a cross-sectional view illustrating one embodiment of a semiconductor device.

In the liquid crystal display device described in Embodiment 2 or Embodiment 3, as illustrated in FIG. 13, a conductive film 319b formed at the same time as the conductive film 319 may be formed over the organic insulating film 317 to overlap with the transistor 102a provided in a driver circuit portion. The conductive film 319b can have a desired potential, for example, a common potential or a ground potential. By providing the conductive film 319b overlapping with the transistor 102a with a dual-gate structure, the conductive film 319b can block an electric field caused by a voltage applied to the conductive film 316d functioning as a gate electrode of the transistor 102a. Consequently, an alignment defect in the liquid crystal layer 321 caused by the electric field can be prevented.

<Modification Example 3>

Figure 14:
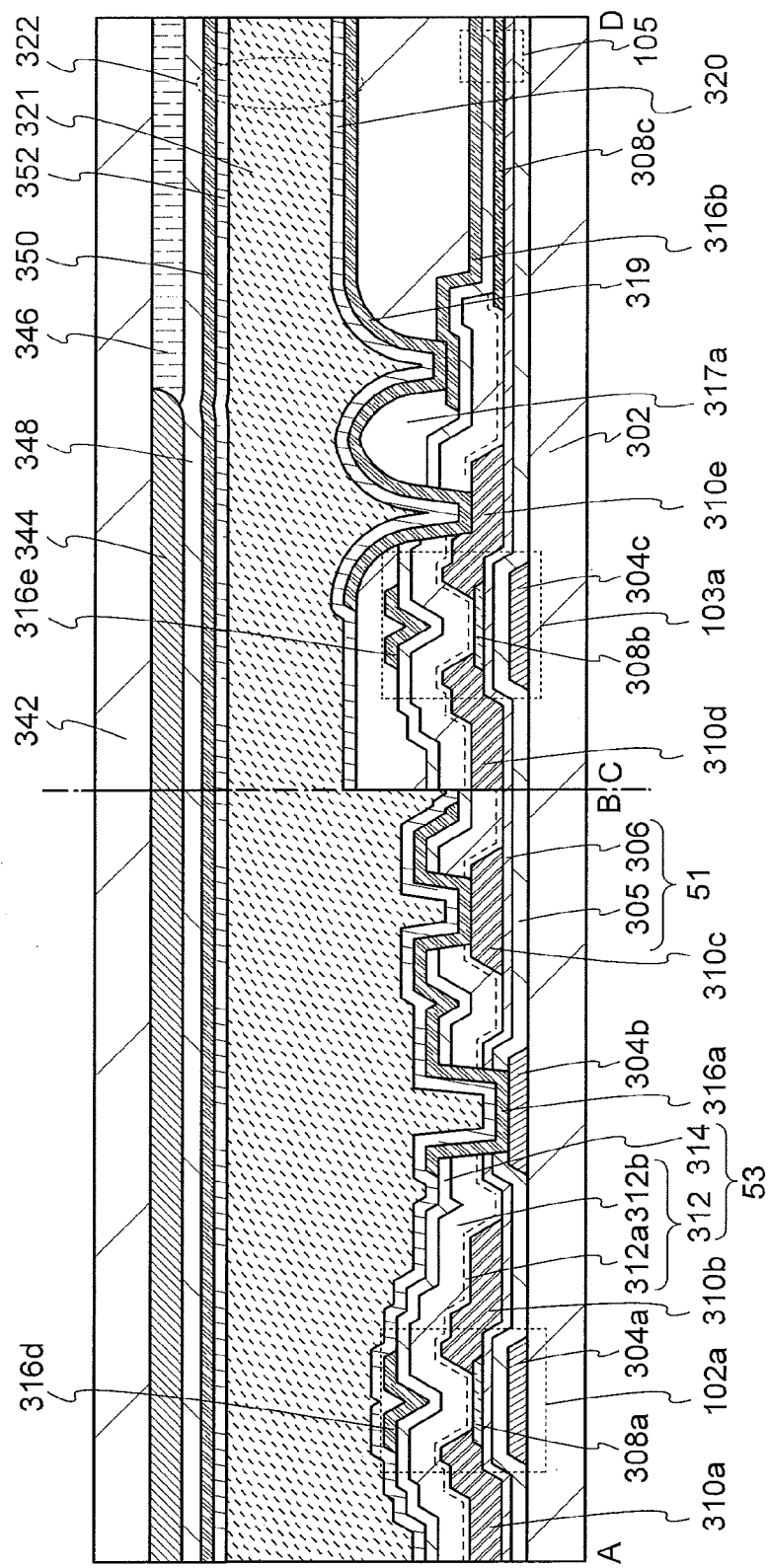
FIG. 14 is a cross-sectional view illustrating one embodiment of a semiconductor device.

In the liquid crystal display device described in Embodiment 2 or Embodiment 3, the organic insulating film 317 is provided in the driver circuit portion and the pixel portion; alternatively, an organic insulating film 317a may be formed only in the pixel portion, as illustrated in FIG. 14.

Note that in the liquid crystal display device illustrated in FIG. 14, the insulating film 313 is formed as illustrated in FIG. 7B, a mask is formed by patterning, and the insulating films 305, 306, 312, and 313 are etched using the mask to form an opening. Next, the conductive film 315 illustrated in FIG. 8A is formed, and then the conductive film 316a that connects the conductive film 304b and the conductive film 310c is formed at the same time as the conductive film 316b illustrated in FIG. 8B. After that, the organic insulating film 317a and the conductive film 319 are formed.

Figure 15:
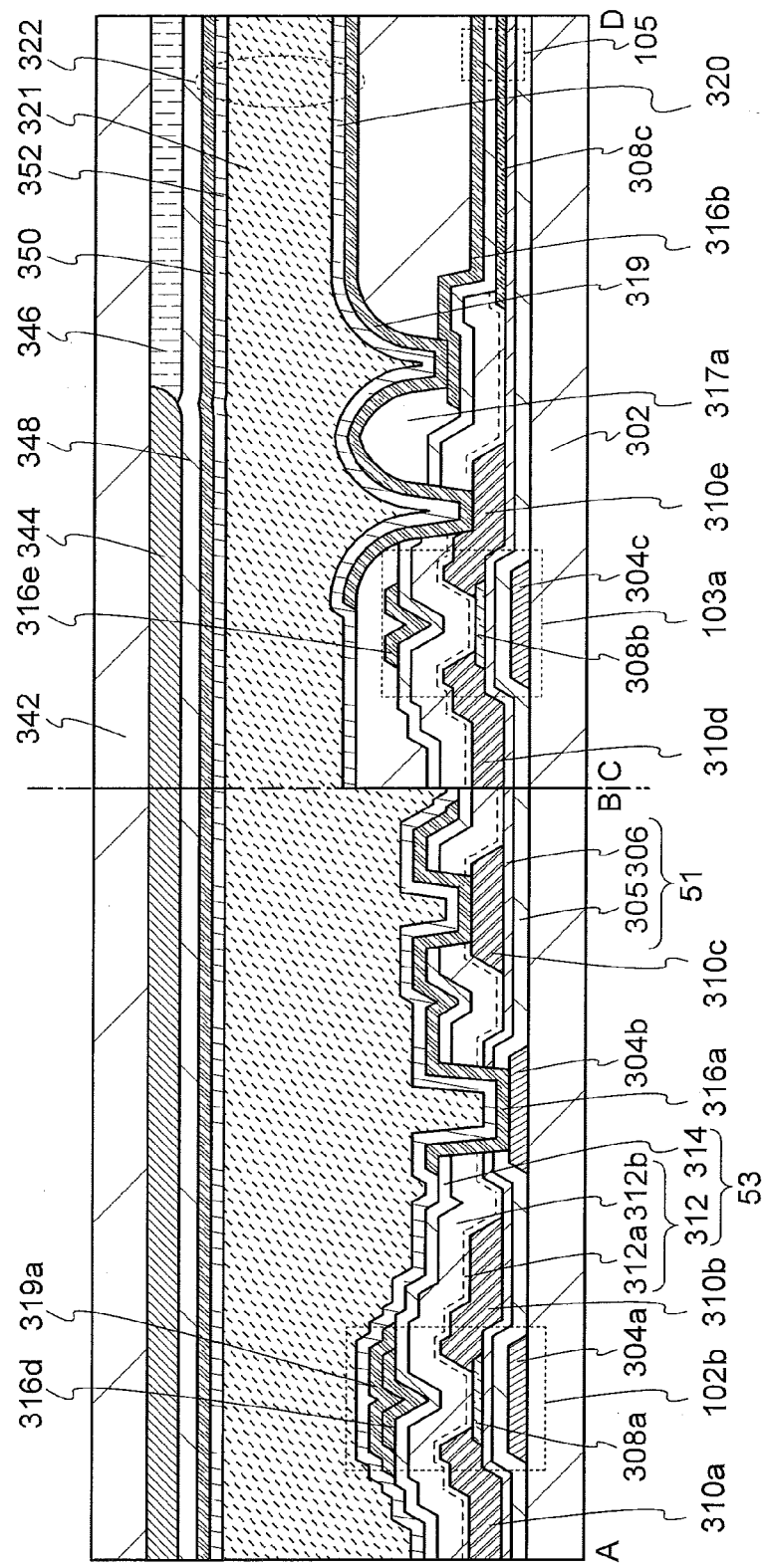
FIG. 15 is a cross-sectional view illustrating one embodiment of a semiconductor device.

In the case where the organic insulating film 317a is not provided in the driver circuit portion as illustrated in FIG. 15, the conductive film 319a formed at the same time as the conductive film 319 may be provided over the conductive film 316d functioning as a gate electrode of a transistor 102b with a dual-gate structure.

Note that the structures, methods, and the like described in this embodiment can be used as appropriate in combination with any of the structures, methods, and the like described in the other embodiments.

(Embodiment 4)

In this embodiment, a semiconductor device of one embodiment of the present invention is described with reference to drawings.

Figure 16A:
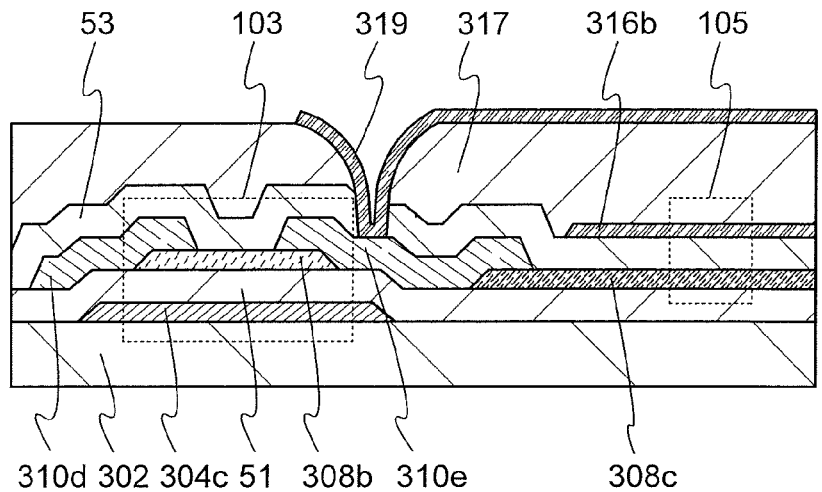
FIGS. 16A to 16C are cross-sectional views illustrating one embodiment of a semiconductor device.
Figure 16B:
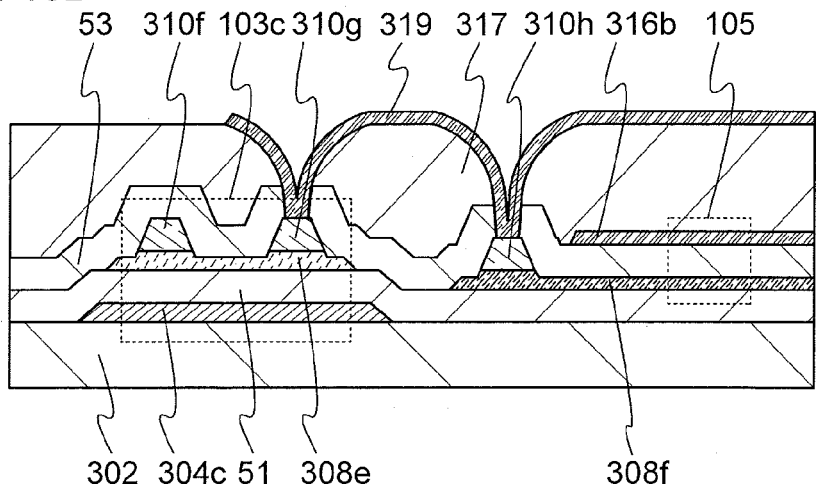
Figure 16C:
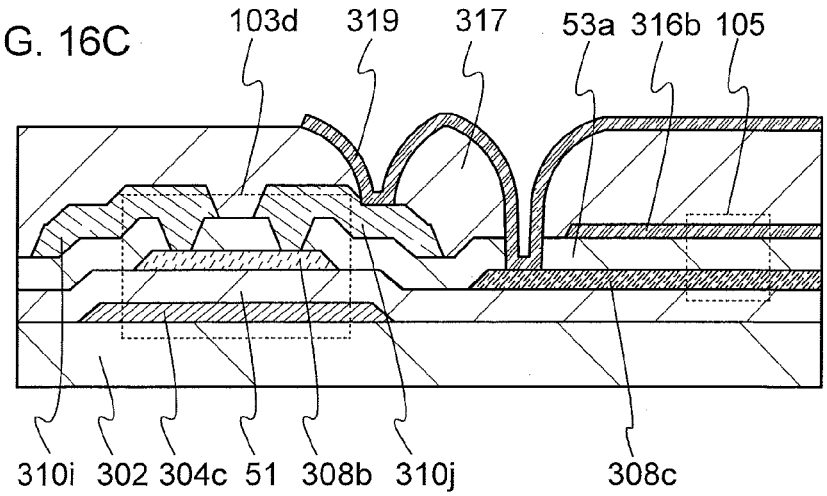

FIGS. 16A to 16C illustrate cross-sectional views of the transistor 103 and the capacitor 105 included in the semiconductor device.

The transistor 103 illustrated in FIG. 16A includes the conductive film 304c being over the substrate 302 and functioning as a gate electrode; the gate insulating film 51 over the substrate 302 and the conductive film 304c; the oxide semiconductor film 308b overlapping with the conductive film 304c with the gate insulating film 51 positioned therebetween; and the pair of conductive films 310d and 310e functioning as a source electrode and a drain electrode and being in contact with the oxide semiconductor film 308b.

The metal oxide film 308c is provided over the gate insulating film 51. The metal oxide film 308c is connected to the conductive film 310e that is one of the pair of conductive films of the transistor 103. The inorganic insulating film 53 is provided over the transistor 102 and the metal oxide film 308c. The conductive film 316b is provided over the inorganic insulating film 53. The metal oxide film 308c, the inorganic insulating film 53, and the conductive film 316b constitute the capacitor 105.

An organic insulating film 317 is provided over the inorganic insulating film 53 and the conductive film 316b. The conductive film 319 is provided over the organic insulating film 317 to be connected to the conductive film 310e in an opening formed in the inorganic insulating film 53 and the organic insulating film 317. The conductive film 319 functions as a pixel electrode.

The metal oxide film 308c is formed by adding hydrogen, boron, phosphorus, nitrogen, tin, antimony, a rare gas element, an alkali metal, an alkaline earth metal, or the like which serves as an impurity to an oxide semiconductor film that is formed at the same time as the oxide semiconductor film 308b or by Ruining an oxygen vacancy in the oxide semiconductor film; thus, the conductivity of the metal oxide film 308c is increased and the metal oxide film 308c has conductivity. Note that an oxide semiconductor film has a light-transmitting property, and thus the metal oxide film 308c also has a light-transmitting property.

The conductive film 316b and the conductive film 319 are formed using light-transmitting conductive films. Therefore, the capacitor 105 has a light-transmitting property. Accordingly, the area of the capacitor can be increased in a pixel, and the capacity value of the capacitor and the aperture ratio of a pixel can be increased.

The conductive film 319 formed over the organic insulating film 317 is connected to the transistor 103. The conductive film 319 functions as a pixel electrode, and is connected to the transistor 103 through the inorganic insulating film 53 and the organic insulating film 317. Since the conductive film 319 is apart from the transistor 103, the conductive film 319 is less likely to be affected by the potential of the conductive film 310d of the transistor 103. Accordingly, it is possible to provide the conductive film 319 to overlap with the transistor 103. Thus, the aperture ratio of a pixel can be increased.

In contrast, the transistor 103 of this embodiment illustrated in FIGS. 16A to 16C includes the organic insulating film 317 over the inorganic insulating film 53. Since the organic insulating film 317 has a large thickness of greater than or equal to 500 nm, an electric field caused by application of a negative voltage to the conductive film 304c that functions as a gate electrode does not affect the surface of the organic insulating film 317; thus, the surface of the organic insulating film 317 is less likely to be positively charged. Since the thickness of the organic insulating film 317 is as large as 500 nm or more, even when positively charged particles in the air are adsorbed on the surface of the organic insulating film 317, an electric field of the positively charged particles on the surface of the organic insulating film 317 is less likely to affect the interface between the oxide semiconductor film 308b and the inorganic insulating film 53. As a result, the state at the interface between the oxide semiconductor film 308b and the inorganic insulating film 53 does not become similar to the state when a positive bias is applied; accordingly, change in threshold voltage of the transistor is small.

Although water and the like are easily diffused in the organic insulating film 317, the nitride insulating film included in the inorganic insulating film 53 functions as a barrier film against water. Therefore, water diffused in the organic insulating film 317 can be prevented from diffusing into the oxide semiconductor film 308b.

As described above, change in electric characteristics of transistors can be reduced by providing the organic insulating film 317 over the transistor. Moreover, a highly reliable transistor having normally-off characteristics can be manufactured. Since the organic insulating film can be formed by a printing method, a coating method, or the like, the manufacturing time can be shortened. Furthermore, by providing the conductive film that functions as a pixel electrode over the organic insulating film 317, the aperture ratio of a pixel can be increased.

<Modification Example 1>

A modification example of the transistor illustrated in FIG. 16A is described with reference to FIG. 16B. In the transistor 103 of this modification example, the oxide semiconductor film 308e and the pair of conductive films 310f and 310g are formed with a multi-tone mask. The transistor 103 and the capacitor 105 are connected to each other by the conductive film 319 that functions as a pixel electrode.

In FIG. 16B, a metal oxide film 308f is formed over the gate insulating film 51. A conductive film 310h formed at the same time as the conductive films 310f and 310g exists over the metal oxide film 308f. The conductive film 319 is connected to the conductive film 310g and the conductive fihn 310h. As a result, the transistor 103 and the capacitor 105 are electrically connected to each other. As illustrated in FIG. 16C, a channel-protective type transistor 103d and the capacitor 105 may be connected to each other by the conductive film 319 that functions as a pixel electrode.

<Modification Example 2>

In the display device described in Embodiment 4, depending on circumstances or conditions, a conductive film having a function of reflecting light may be formed as the conductive film 319, for example.

Note that the structures, methods, and the like described in this embodiment can be used as appropriate in combination with any of the structures, methods, and the like described in the other embodiments.

(Embodiment 5)

In this embodiment, a semiconductor device of one embodiment of the present invention and a manufacturing method thereof are described with reference to drawings.

In this embodiment, a display device is described as an example of a semiconductor device. Note that the structure of a display device and the circuit diagram of a pixel illustrated in FIGS. 2A to 2C can be used, as appropriate.

Figure 17:
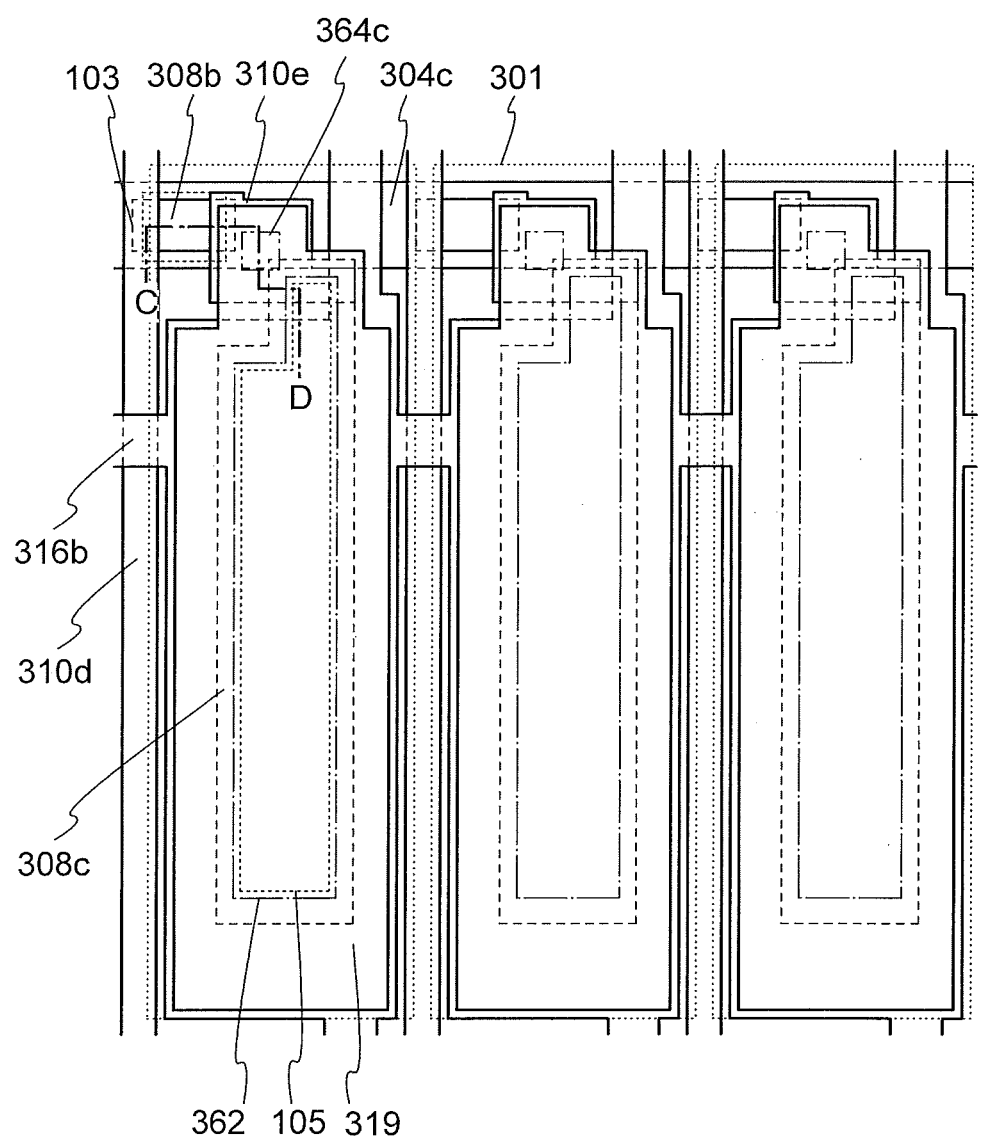
FIG. 17 is a top view illustrating one embodiment of a semiconductor device.

A specific configuration of an element substrate included in the display device is described. Here, a VA liquid crystal display device is used as the display device. FIG. 17 illustrates a top view of the pixel 301 included in the liquid crystal display device.

In FIG. 17, the conductive film 304c functioning as a scan line extends in a direction substantially perpendicularly to a conductive film functioning as a signal line (in the lateral direction in the drawing). The conductive film 310d functioning as a signal line extends in a direction substantially perpendicularly to the conductive film functioning as a scan line (in the vertical direction in the drawing).

The transistor 103 is provided in a region where the conductive film functioning as a scan line and the conductive film functioning as a signal line intersect with each other. The transistor 103 includes the conductive film 304c functioning as a gate electrode; a gate insulating film (not illustrated in FIG. 17); the oxide semiconductor film 308b where a channel region is formed, over the gate insulating film; and the pair of conductive films 310d and 310e functioning as a source electrode and a drain electrode.

The metal oxide film 308c is connected to the conductive film 310e of the transistor 103. The conductive film 316b is provided over the metal oxide film 308c with an insulating film positioned therebetween. The opening 362 indicated by the dashed line is provided in the insulating films provided over the metal oxide film 308c. In the opening 362, the metal oxide film 308c is in contact with a nitride insulating film (not illustrated in FIG. 17) included in the insulating films.

The capacitor 105 is formed in a region where the conductive film 316b overlaps with the metal oxide film 308c. The metal oxide film 308c and the conductive film 316b have light-transmitting properties. That is, the capacitor 105 has a light-transmitting property.

The conductive film 319 that functions as a pixel electrode is provided over the conductive film 310e and the conductive film 316b with an organic insulating film (not illustrated in FIG. 17) positioned therebetween. The conductive film 319 is connected to the conductive film 310e in the opening 364c. That is, the transistor 103, the capacitor 105, and the conductive film 319 are electrically connected to one another.

Figure 18:
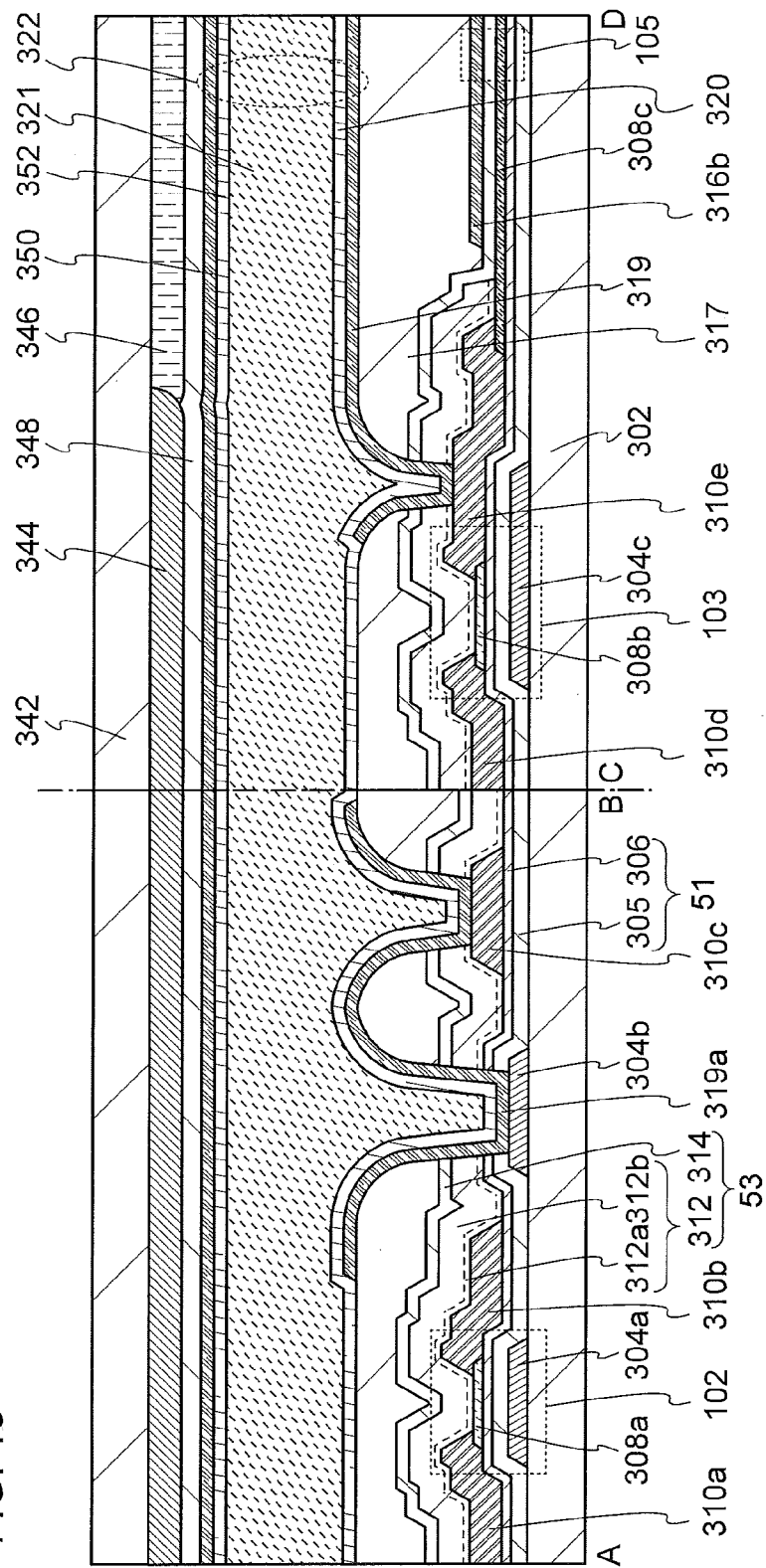
FIG. 18 is a cross-sectional view illustrating one embodiment of a semiconductor device.

Next, FIG. 18 shows a cross section taken along dashed-dotted line C-D in FIG. 17. Note that a cross section A-B in FIG. 18 is a cross-sectional view of a driver circuit portion (a top view thereof is omitted) including the scan line driver circuit 14 and the signal line driver circuit 16. In this embodiment, as a semiconductor device, a liquid crystal display device of a VA mode is described.

In the liquid crystal display device described in this embodiment, a liquid crystal element 322 is provided between a pair of substrates (a substrate 302 and a substrate 342).

The liquid crystal element 322 includes the conductive film 316b over the substrate 302, films controlling alignment (hereinafter referred to as alignment films 320 and 352), a liquid crystal layer 321, and a conductive film 350.

In the driver circuit portion, the transistor 102 includes the conductive film 304a functioning as a gate electrode, insulating fihns 305 and 306 collectively functioning as the gate insulating film 51, the oxide semiconductor film 308a in which a channel region is formed, and the conductive films 310a and 310b functioning as a source electrode and a drain electrode. The oxide semiconductor film 308a is provided over the gate insulating film 51.

In the pixel portion, the transistor 103 includes the conductive film 304c functioning as a gate electrode, the insulating films 305 and 306 collectively functioning as the gate insulating film 51, the oxide semiconductor film 308b which is formed over the gate insulating film 51 and in which a channel region is formed, and the conductive films 310d and 310e functioning as a source electrode and a drain electrode.

The oxide semiconductor film 308b is provided over the gate insulating film 51. Further, an insulating film 312 included in the inorganic insulating film 53 and an insulating film 314 are provided as protective films over the conductive films 310d and 310e.

Further, the capacitor 105 includes the metal oxide film 308c functioning as one electrode, the insulating film 314 functioning as a dielectric film, and the conductive film 316b functioning as the other electrode. The metal oxide film 308c is provided over the gate insulating film 51.

The organic insulating film 317 is formed over the inorganic insulating film 53. The conductive film 319 that functions as a pixel electrode is formed over the organic insulating film 317. The metal oxide film 308c and the conductive film 319 are connected to each other by the conductive film 310e.

In the driver circuit portion, the conductive film 304b formed at the same time as the conductive films 304a and 304c and the conductive film 310c formed at the same time as the conductive films 310a, 310b, 310d, and 310e are connected to each other via the light-transmitting conductive film 319a formed at the same time as the conductive film 319.

The conductive film 304a and the light-transmitting conductive film 319a are connected to each other through an opening provided in the insulating film 305, the insulating film 306, the insulating film 312, and the organic insulating film 317. Further, the conductive film 310c and the conductive film 319a are connected to each other through an opening provided in the insulating film 312, the insulating film 314, and the organic insulating film 317.

Although not illustrated, the conductive film 316b is electrically connected to a conductive film that is formed at the same time as the conductive films 304a to 304c or the conductive films 310a to 310e via a conductive film that is formed at the same time as the conductive films 319 and 319a. A desired potential such as a common potential or a ground potential is applied to the conductive film 316b through the conductive film that is formed at the same time as the conductive films 304a to 304c or the conductive films 310a to 310e.

Here, components of the display device illustrated in FIG. 18 are described below.

The conductive films 304a, 304b, and 304c are formed over the substrate 302. The conductive film 304a functions as a gate electrode of the transistor in the driver circuit portion. The conductive film 304b is formed in the driver circuit portion and connected to the conductive film 310c. The conductive film 304c is formed in the pixel portion 11 and functions as a gate electrode of the transistor in the pixel portion.

The insulating films 305 and 306 are formed over the substrate 302 and the conductive films 304a, 304c, and 304b. The insulating films 305 and 306 function as the gate insulating film 51 of the transistor in the driver circuit portion and the gate insulating film 51 of the transistor in the pixel portion 11.

The oxide semiconductor films 308a and 308b and the metal oxide film 308c are formed over the insulating film 306. The oxide semiconductor film 308a is formed in a position overlapping with the conductive film 304a and functions as a channel region of the transistor in the driver circuit portion. The oxide semiconductor film 308b is formed in a position overlapping with the conductive film 304c and functions as a channel region of the transistor in the pixel portion. The metal oxide film 308c is connected to the conductive film 310e included in the transistor 103 and functions as an electrode of the capacitor 105.

In the liquid crystal display device of this embodiment, the capacitor has a light-transmitting property. As a result, the area occupied by the capacitor can be increased and the aperture ratio of a pixel can be increased.

The insulating film 312 and the insulating film 314 are formed as the inorganic insulating film 53 over the insulating film 306, the oxide semiconductor films 308a and 308b, the metal oxide film 308c, and the conductive films 310a, 310b, 310c, 310d, and 310e.

The conductive film 316b is formed over the insulating film 314 and can function as an electrode of the capacitor.

The organic insulating film 317 is formed over the inorganic insulating film 53 and the conductive film 316b.

The conductive films 319 and 319a are formed over the organic insulating film 317. The conductive film 319 functions as a pixel electrode. The conductive film 319a is electrically connected to the conductive film 310a through the opening 364a (see FIG. 22A) and electrically connected to the conductive film 310c through the opening 364b (see FIG. 22A). That is, the conductive film 319a functions as a connection electrode which connects the conductive film 304a and the conductive film 310c.

To form a connection structure in which the conductive film 304a is in direct contact with the conductive film 310c, it is necessary to perform patterning for forming an opening in the insulating films 305 and 306 and to form a mask before the conductive film 310c is formed. However, the photomask is not needed to obtain the connection structure in FIG. 18. When the conductive film 304a is connected to the conductive film 310c with the conductive film 319a as illustrated in FIG. 18, it is not necessary to form a connection portion where the conductive film 304a is in direct contact with the conductive film 310c. Thus, the number of photomasks can be reduced by one. That is, the number of steps for forming a liquid crystal display device can be reduced.

The alignment film 320 preferably has a light-transmitting property and can be formed typically with an organic resin such as an acrylic resin, polyimide, or an epoxy resin.

The colored film 346 is formed on the substrate 342. The colored film 346 functions as a color filter. Further, a light-blocking film 344 adjacent to the colored film 346 is formed on the substrate 342. The light-blocking film 344 functions as a black matrix. The colored film 346 is not necessarily provided in the case where the liquid crystal display device displays monochrome images, for example.

The insulating film 348 is formed on the colored film 346. The insulating film 348 functions as a planarization layer or suppresses diffusion of impurities in the colored film 346 to the liquid crystal element side.

The conductive film 350 is formed on the insulating film 348. The conductive film 350 functions as the other of the pair of electrodes of the liquid crystal element in the pixel portion. Note that the insulating film 352 is formed on the conductive films 319 and 319a and the conductive film 350.

The liquid crystal layer 321 is formed between the conductive film 319 and the conductive film 350, and the conductive film 319a and the conductive film 350. The liquid crystal layer 321 is sealed between the substrate 302 and the substrate 342 with the use of a sealant (not illustrated). The sealant is preferably in contact with an inorganic material to prevent entry of moisture and the like from the outside.

A spacer may be provided between the conductive film 319 and the conductive film 350, and the conductive film 319a and the conductive film 350 to maintain the thickness of the liquid crystal layer 321 (also referred to as a cell gap).

A formation method of the element portion over the substrate 302 in the liquid crystal device illustrated in FIG. 18 is described with reference to FIGS. 5A to 5C, FIGS. 19A to 19C, FIGS. 20A and 20B, and FIGS. 21A to 21C.

As in Embodiment 2, the conductive films 304a, 304b, and 304c, the insulating film 305, the insulating film 306, and the island-shaped oxide semiconductor films 308a, 308b, and 308d are formed over the substrate 302 through the steps illustrated in FIGS. 5A to 5C. The conductive films 304a, 304b, and 304c are formed through mask formation by first patterning and etching. The oxide semiconductor films 308a, 308b, and 308d are formed through mask formation by second patterning and etching.

After that, as in Embodiment 2, hydrogen, water, and the like may be released from the oxide semiconductor films 308a, 308b, and 308d by heat treatment and the hydrogen concentration and the water concentration in the oxide semiconductor films 308a, 308b, and 308d may be reduced. As a result, highly purified oxide semiconductor films 308a, 308b, and 308d can be formed. The heat treatment is performed typically at a temperature of 250° C. to 650° C., preferably 300° C. to 500° C. The heat treatment is performed typically at a temperature of 300° C. to 400° C., preferably 320° C. to 370° C., so that warp or shrinkage of a large-area substrate can be reduced and yield can be improved.

In the case where the deposition temperature of an insulating film 311a formed later is 280° C. to 400° C., hydrogen, water, and the like can be released from the oxide semiconductor films 308a, 308b, and 308d; thus, the heat treatment is not necessary.

Figure 19A:
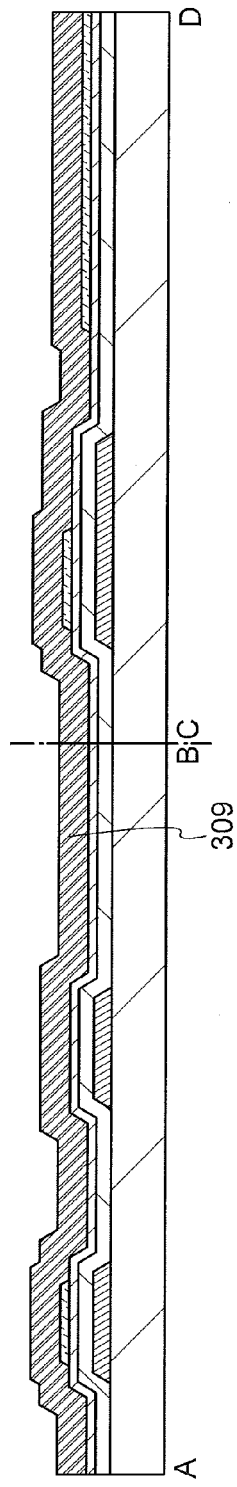
FIGS. 19A to 19C are cross-sectional views illustrating one embodiment of a method of manufacturing a semiconductor device.
Figure 19B:
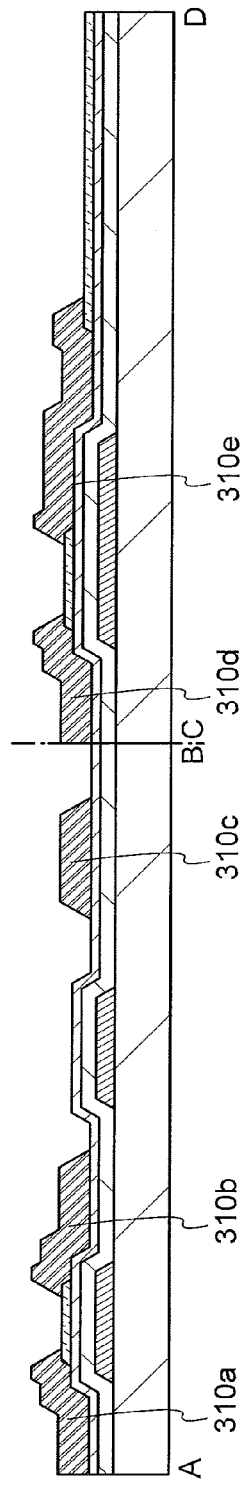

Next, as in Embodiment 2, the conductive film 309 is formed over the insulating film 306 and the oxide semiconductor films 308a, 308b, and 308d (see FIG. 19A).

Then, as in Embodiment 2, the conductive film 309 is processed into a desired shape to form that the conductive films 310a, 310b, 310c, 310d, and 310e. Note that the conductive films 310a, 310b, 310c, 310d, and 310e can be formed in such a manner that a mask is formed in a desired shape by third patterning and regions that are not covered with the mask are etched (see FIG. 19B). Note that the conductive film 310e is in contact with the oxide semiconductor film 308b and the oxide semiconductor film 308d.

Figure 19C:
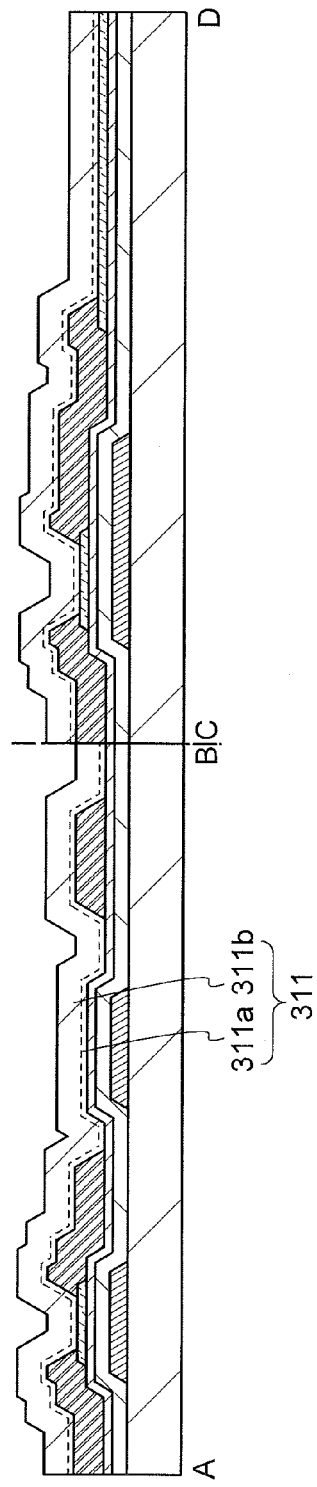

Next, as in Embodiment 2, the insulating film 311 in which insulating films 311a and 311b are stacked is formed to cover the insulating film 306, the oxide semiconductor films 308a, 308b, and 308d, and the conductive films 310a, 310b, 310c, 310d, and 310e (see FIG. 19C). The insulating film 311 can be formed by sputtering, CVD, vapor deposition, or the like.

Next, as in Embodiment 2, heat treatment is performed. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C. The heat treatment is performed typically at a temperature of higher than or equal to 300° C. and lower than or equal to 400° C., preferably higher than or equal to 320° C. and lower than or equal to 370° C., so that warp or shrinkage of a large-area substrate can be reduced and yield can be improved.

By the heat treatment, part of oxygen contained in the insulating film 311b can be moved to the oxide semiconductor films 308a, 308b, and 308d to reduce the oxygen vacancies in the oxide semiconductor films 308a, 308b, and 308d. Consequently, the number of oxygen vacancies in the oxide semiconductor films 308a, 308b, and 308d can be further reduced.

In the case where water, hydrogen, or the like is contained in the insulating films 311a and 312b, when the insulating film 313 having a function of blocking water, hydrogen, and the like is formed later and heat treatment is performed, water, hydrogen, or the like contained in the insulating films 311a and 311b is moved to the oxide semiconductor films 308a, 308b, and 308d, so that defects are generated in the oxide semiconductor films 308a, 308b, and 308d. However, by the heating, water, hydrogen, or the like contained in the insulating films 311a and 311b can be released; thus, variations in electrical characteristics of the transistor can be reduced, and changes in the threshold voltage can be inhibited.

Note that when the insulating film 311b is formed over the insulating film 311a while being heated, oxygen can be moved to the oxide semiconductor films 308a, 308b, and 308d to compensate the oxygen vacancies in the oxide semiconductor films 308a, 308b, and 308d; thus, the heat treatment is not necessarily performed.

Note that the heat treatment may be performed after formation of an opening 362 to be formed later.

Next, as in Embodiment 2, the insulating film 311 is processed into a desired shape to form the insulating film 312 and the opening 362. The insulating film 311 and the opening 362 can be formed in such a manner that a mask is formed in a desired shape by fourth patterning and regions that are not covered with the mask are etched (see FIG. 20A).

The opening 362 is formed to expose the surface of the oxide semiconductor film 308d.

Next, as in Embodiment 2, the insulating film 313 is formed over the insulating film 312 and the oxide semiconductor film 308d (see FIG. 20B).

Figures 21A, 21B, 21C:
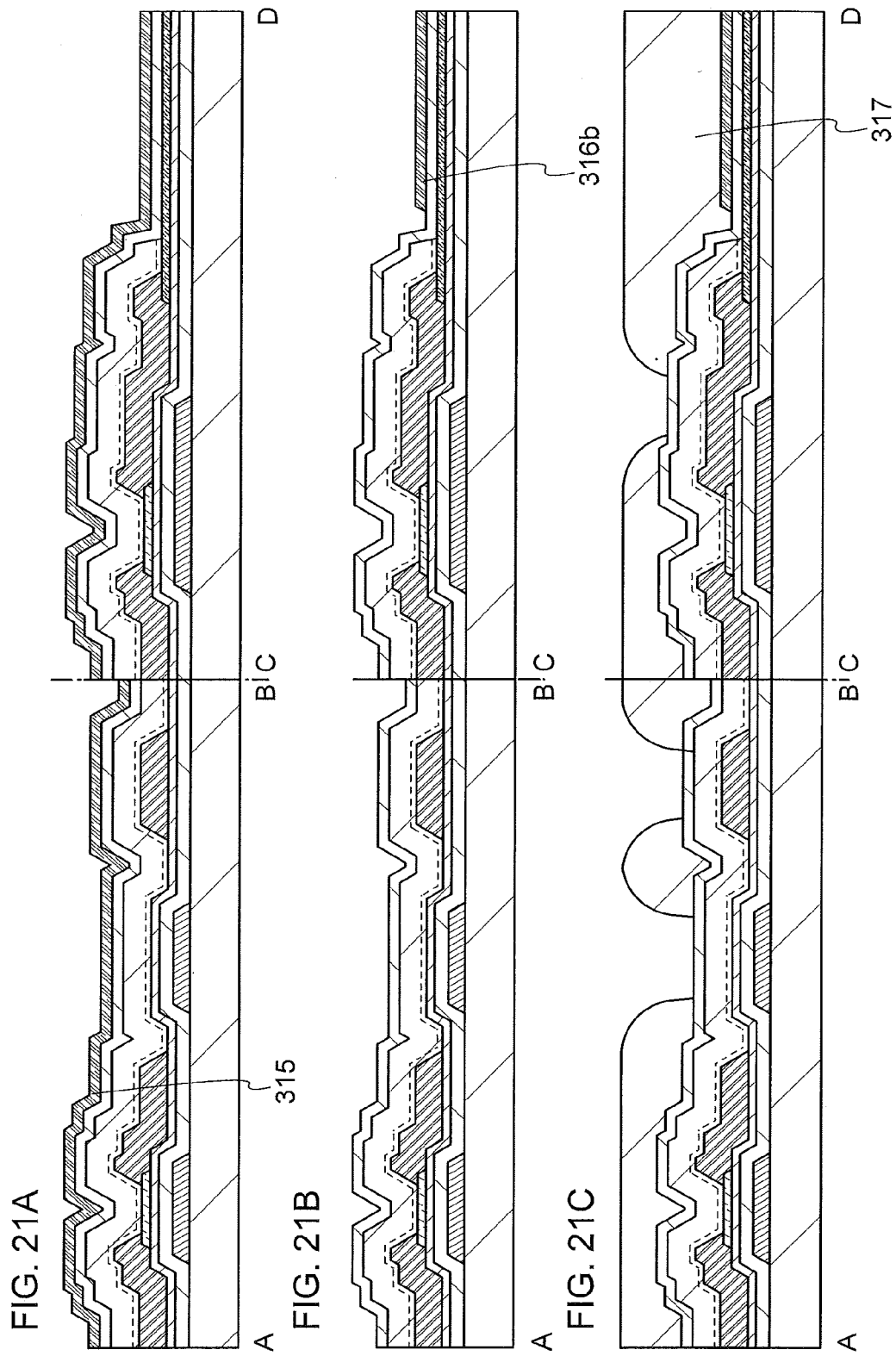
FIGS. 21A to 21C are cross-sectional views illustrating one embodiment of a method of manufacturing a semiconductor device.

Next, as in Embodiment 2, the conductive film 315 is formed over the insulating film 314 (see FIG. 21A).

Then, the conductive film 315 is processed into a desired shape to form the conductive film 316b. The conductive film 316b are formed in such a manner that a mask is formed in a desired shape by fifth patterning and regions that are not covered with the mask are etched (see FIG. 21B).

Next, the organic insulating film 317 is formed to cover the insulating film 314 and the conductive film 316b (see FIG. 21C). The organic insulating film 317 functioning as a planarization film has an opening that partly exposes the insulating film 313 and the conductive film 316b.

Next, the insulating film 305, the insulating film 306, the insulating film 312, and the insulating film 313 are partly etched using the organic insulating film 317 as a mask to form the opening 364a from which the conductive film 304b is exposed, the opening 364b from which the conductive film 310c is exposed, and the opening 364c from which the conductive film 310e is exposed (see FIG. 22A).

Next, as in Embodiment 2, the conductive film 318 is formed (see FIG. 22B).

Next, as in Embodiment 2, the conductive film 318 is processed into a desired shape to form conductive films 319 and 319a. The conductive films 319 and 319a can be formed in such a manner that a mask is formed in a desired shape by seventh patterning and regions not covered with the mask are etched (see FIG. 22C).

Through the above process, the pixel portion and the driver circuit portion that include transistors can be formed over the substrate 302. In the manufacturing process described in this embodiment, the transistors and the capacitor can be formed at the same time by the first to seventh patterning, that is, with the seven masks.

For an element portion on the substrate 342 facing the substrate 302, the manufacturing steps described in Embodiment 2 and illustrated in FIGS. 10A to 10C can be referred to.

Next, as in Embodiment 2, the alignment film 320 and the alignment film 352 are formed over the substrate 302 and the substrate 342 respectively, specifically, over the insulating film 314 and the conductive films 319 and 319a formed over the substrate 302 and over the conductive film 350 formed over the substrate 342. After that, the liquid crystal layer 321 is formed between the substrate 302 and the substrate 342.

Through the above process, the liquid crystal display device illustrated in FIG. 18 can be fabricated.

Note that the structures, methods, and the like described in this embodiment can be used as appropriate in combination with any of the structures, methods, and the like described in the other embodiments.

(Embodiment 6)

In this embodiment, a liquid crystal display device including a transistor different from that described in Embodiment 4 is described with reference to FIG. 23, FIG. 24, FIG. 25, FIG. 26, and FIG. 27.

Figure 23:
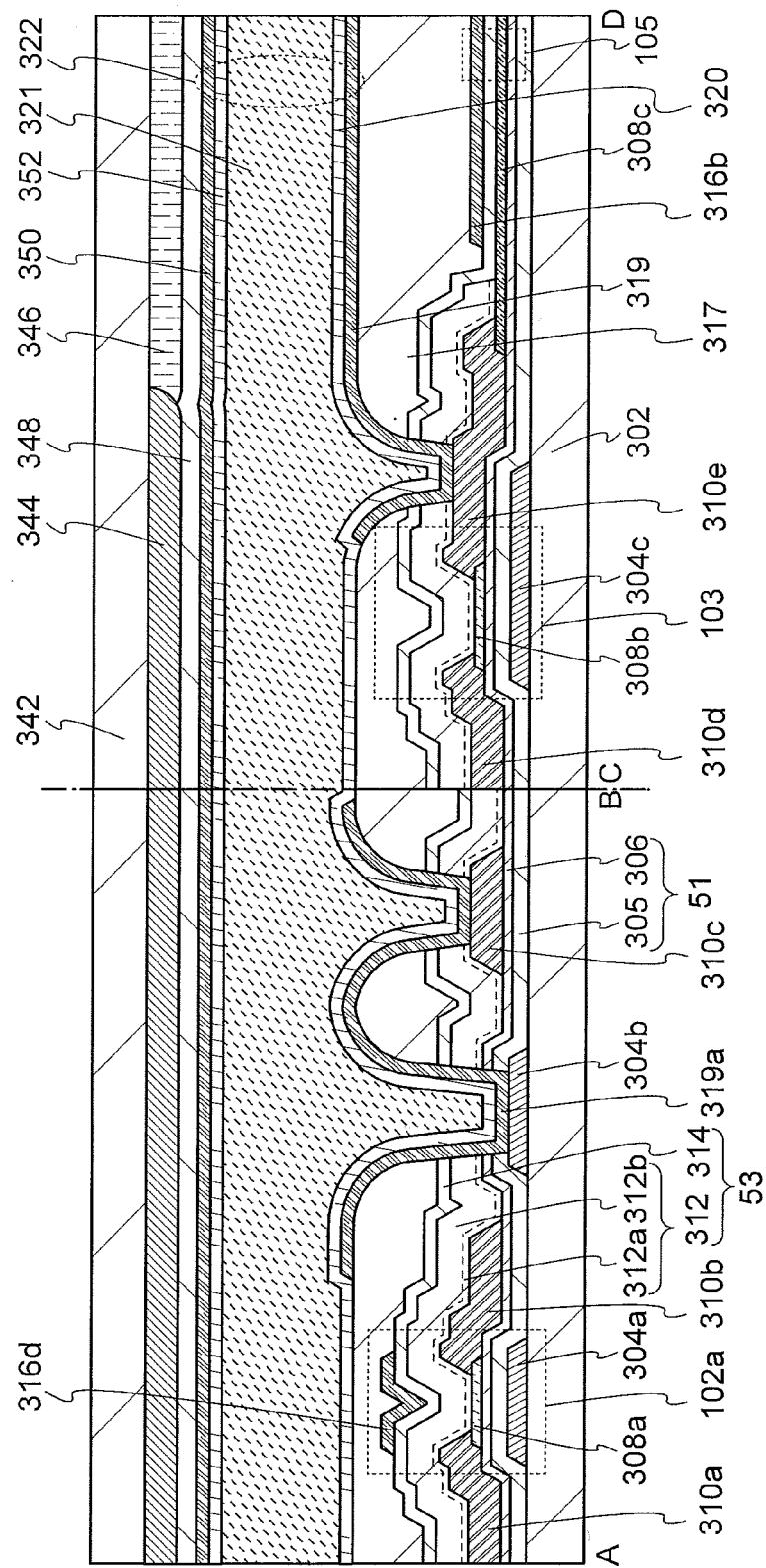
FIG. 23 is a cross-sectional view illustrating one embodiment of a semiconductor device.

A liquid crystal display device illustrated in FIG. 23 includes a transistor 102a with a dual-gate structure in a driver circuit portion illustrated in the cross section A-B.

The transistor 102a provided in the driver circuit portion has the same structure as the transistor 102a described in Embodiment 2.

<Modification Example 1>

Figure 24:
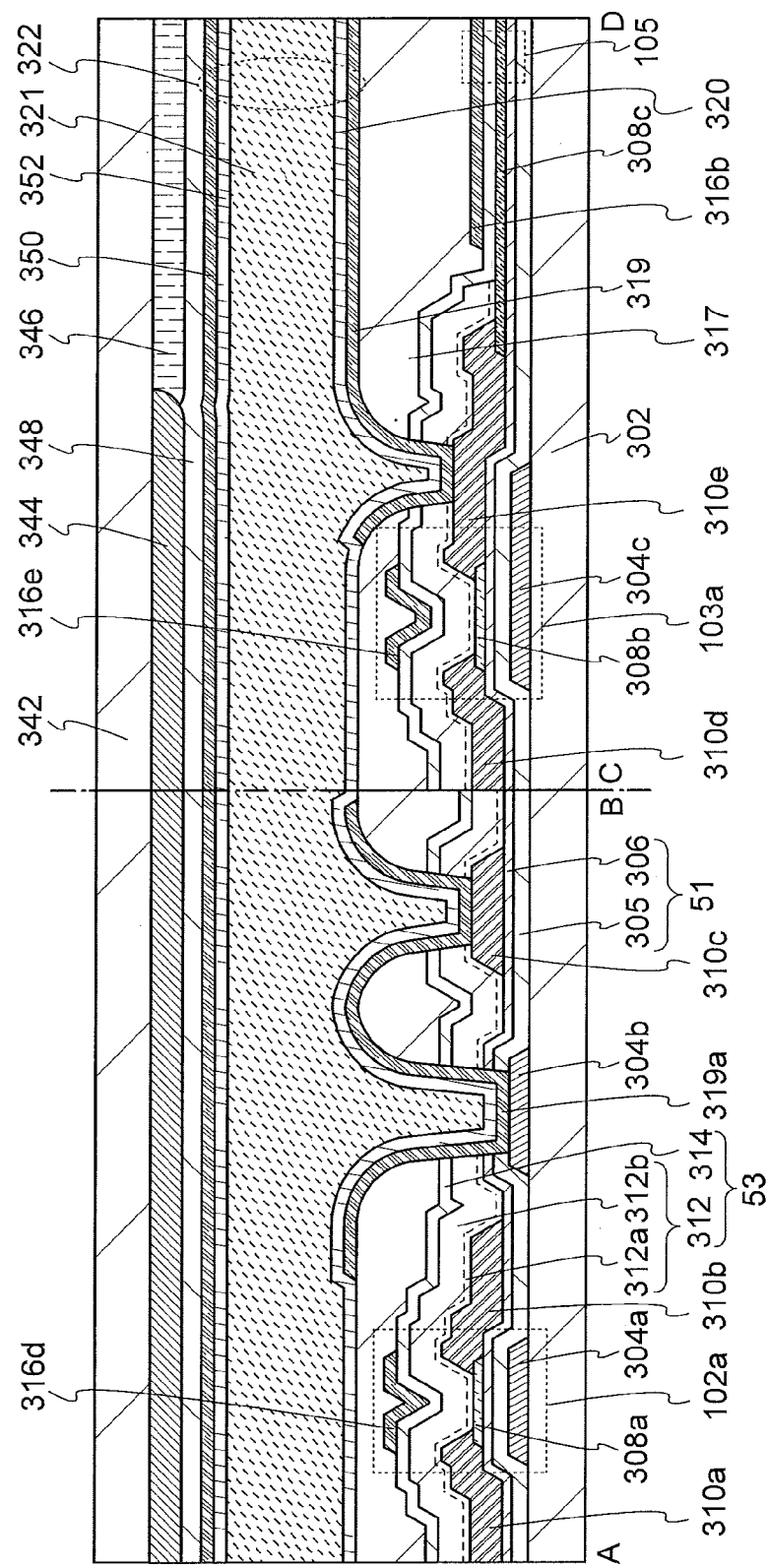
FIG. 24 is a cross-sectional view illustrating one embodiment of a semiconductor device.

Although the liquid crystal display device illustrated in FIG. 23 of Embodiment 6 includes the transistor with a dual-gate structure as a transistor in the driver circuit portion, as illustrated in FIG. 24, a transistor 103a with a dual-gate structure may be included in a pixel portion illustrated in the cross section C-D in addition to the transistor 102a with a dual-gate structure in the driver circuit illustrated in the cross section A-B.

The transistor 103a has the same structure as the transistor 103a described in Embodiment 2.

By providing a highly reliable transistor with a dual-gate structure having large on-state current and high field-effect mobility not only in the driver circuit portion but also in the pixel portion, the liquid crystal display device can have a high display quality.

<Modification Example 2>

Figure 25:
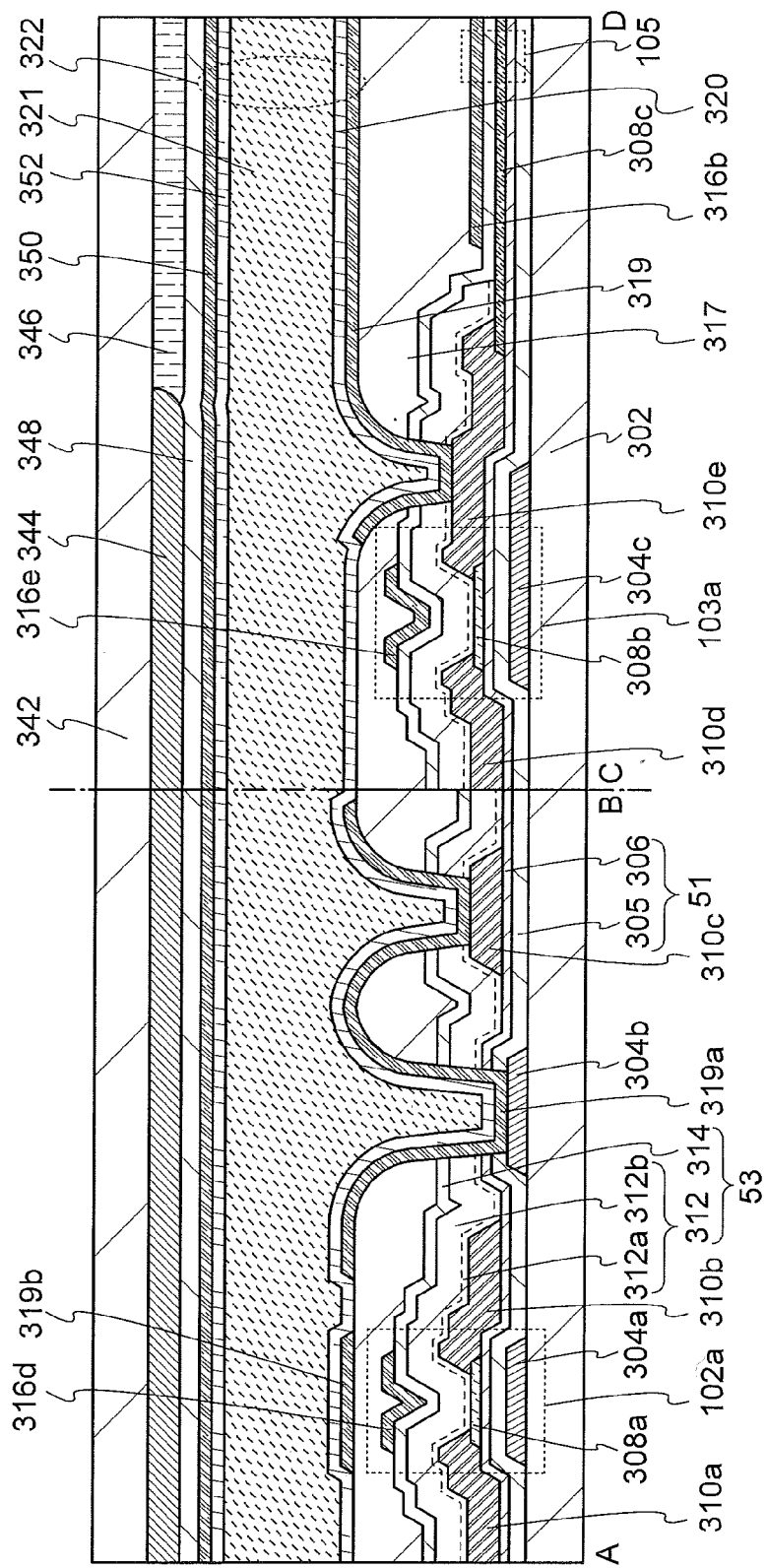
FIG. 25 is a cross-sectional view illustrating one embodiment of a semiconductor device.

In the liquid crystal display device described in Embodiment 5 or Embodiment 6, as illustrated in FIG. 25, a conductive film 319b formed at the same time as the conductive film 319 may be formed over the organic insulating film 317 to overlap with the transistor 102a provided in a driver circuit portion. The conductive film 319b can have a desired potential, for example, a common potential or a ground potential. By providing the conductive film 319b overlapping with the transistor 102a with a dual-gate structure, the conductive film 319b can block an electric field caused by a voltage applied to the conductive film 316d functioning as a gate electrode of the transistor 102a. Consequently, an alignment defect in the liquid crystal layer 321 caused by the electric field can be prevented.

<Modification Example 3>

Figure 26:
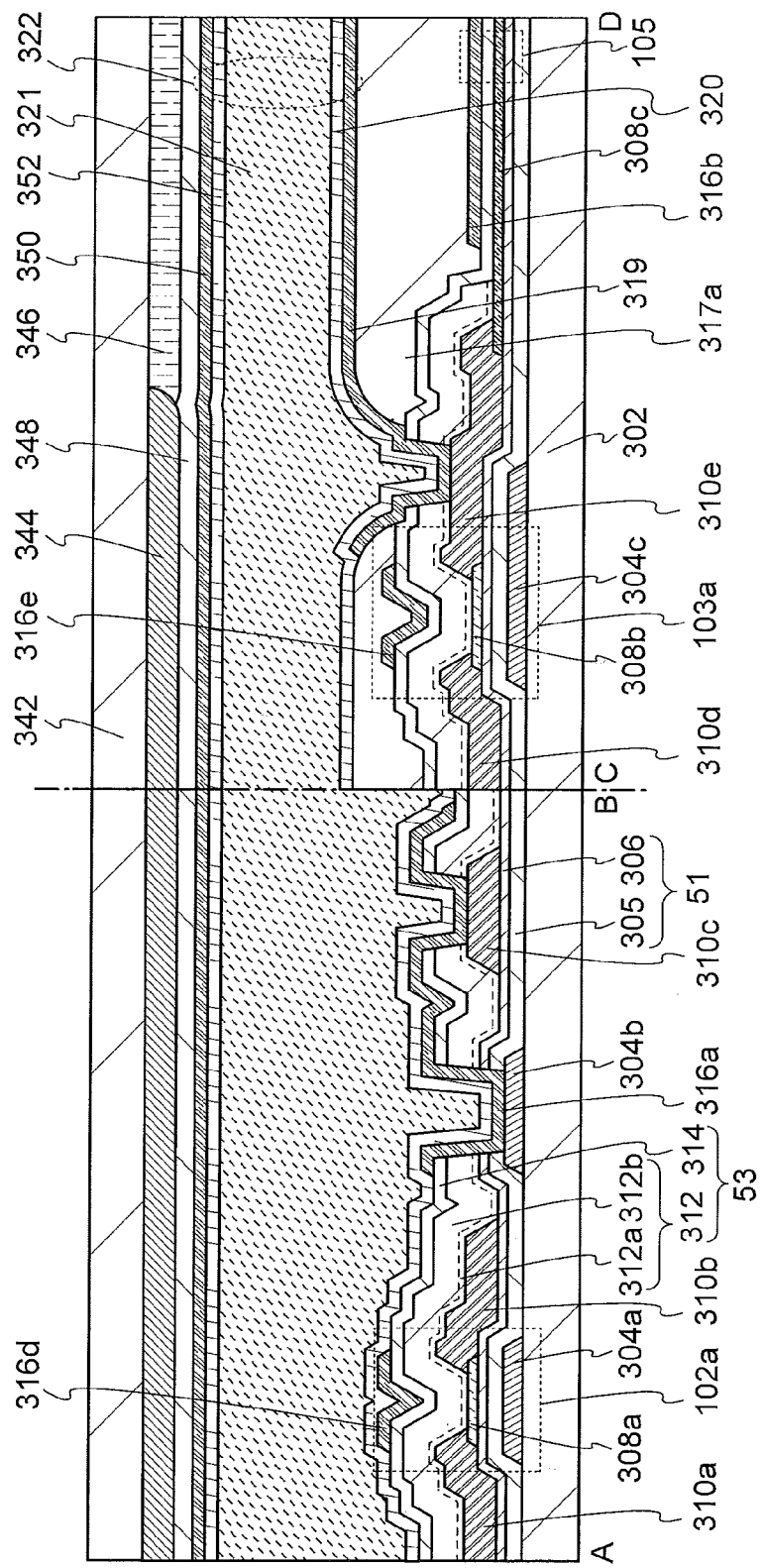
FIG. 26 is a cross-sectional view illustrating one embodiment of a semiconductor device.

In the liquid crystal display device described in Embodiment 5 or Embodiment 6, the organic insulating film 317 is provided in the driver circuit portion and the pixel portion; alternatively, an organic insulating film 317a may be formed only in the pixel portion, as illustrated in FIG. 26.

Figure 27:
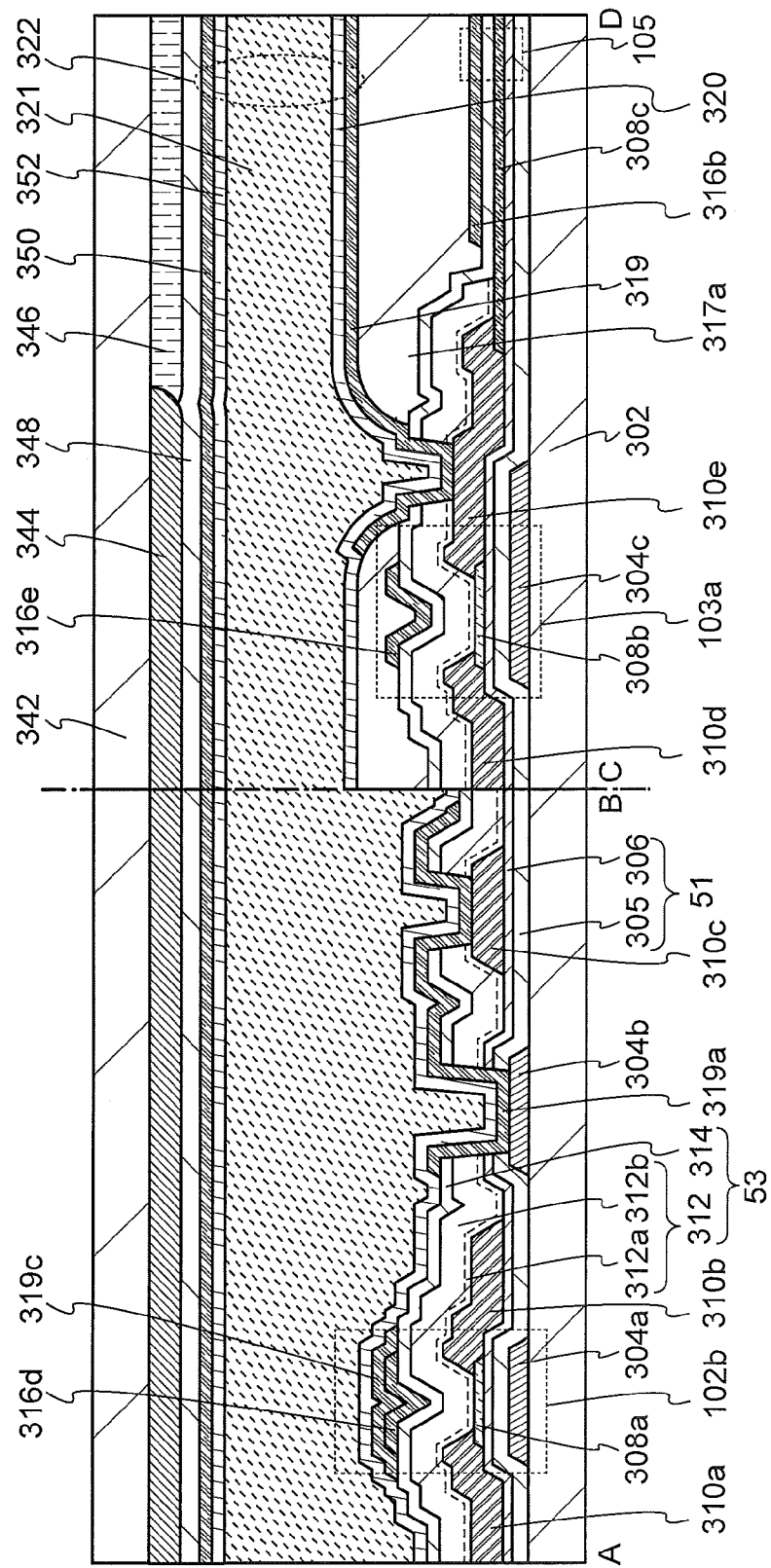
FIG. 27 is a cross-sectional view illustrating one embodiment of a semiconductor device.
Figure 28:
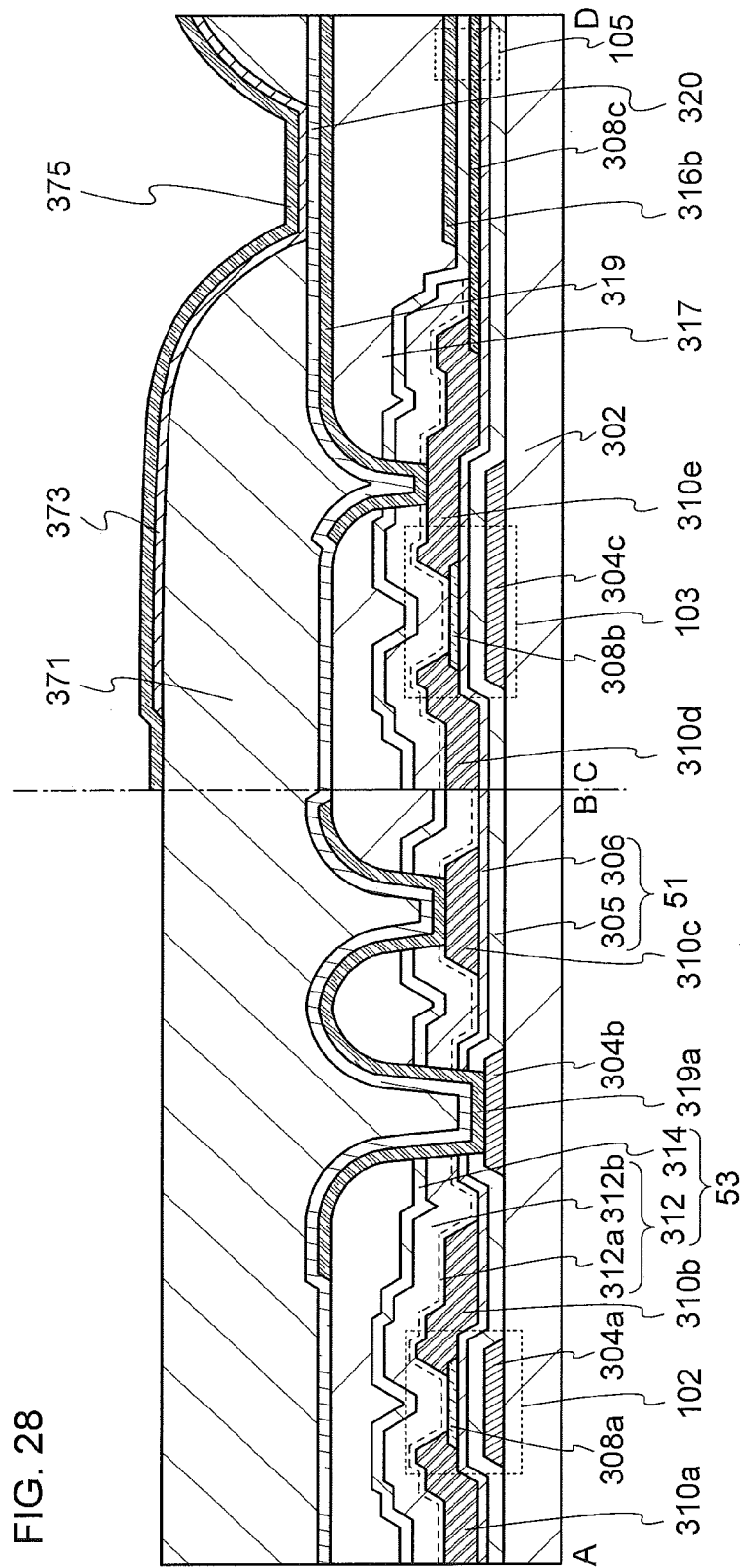
FIG. 28 is a cross-sectional view illustrating one embodiment of a semiconductor device.
Figure 29:
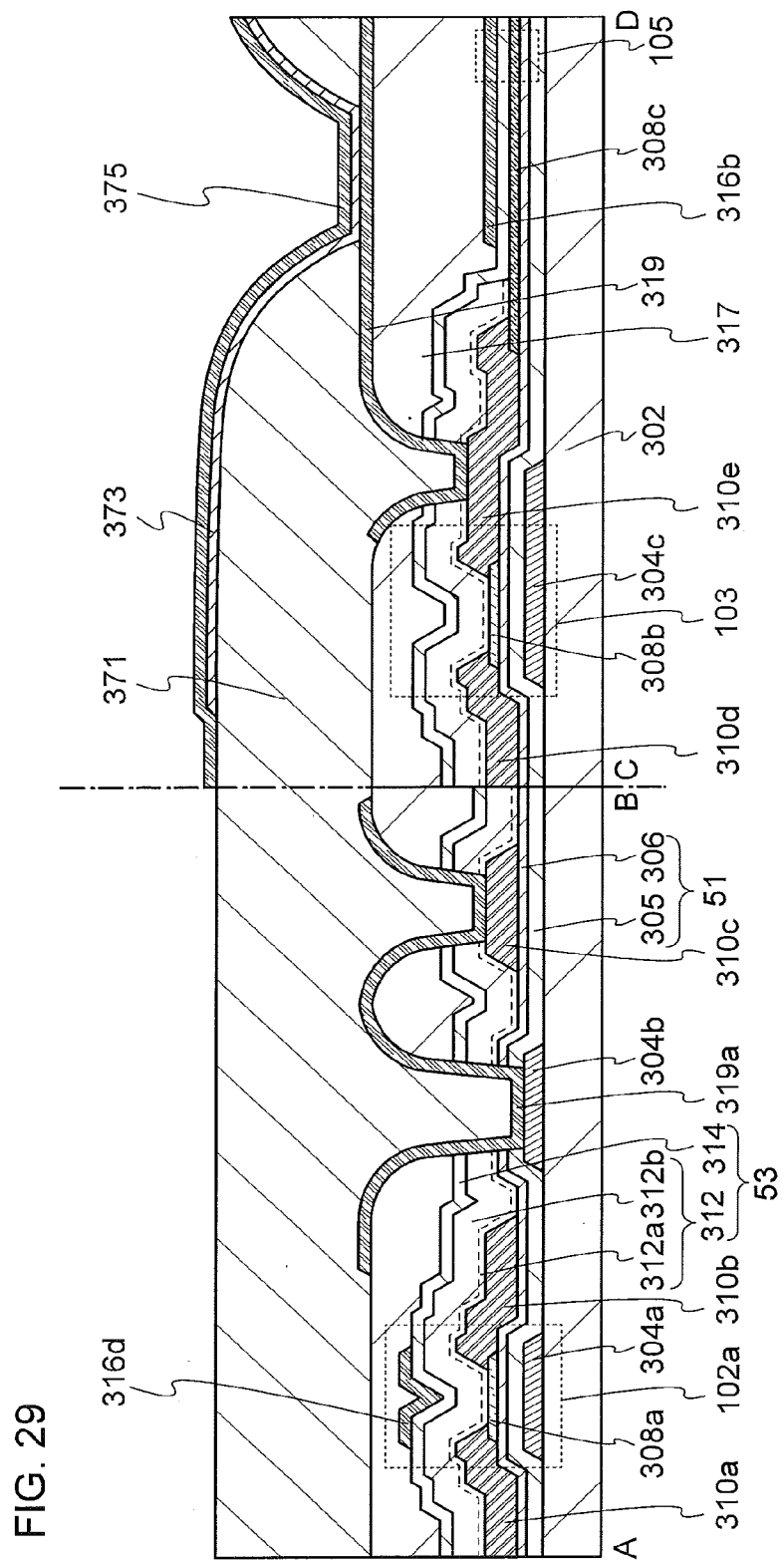
FIG. 29 is a cross-sectional view illustrating one embodiment of a semiconductor device.
Figure 30:
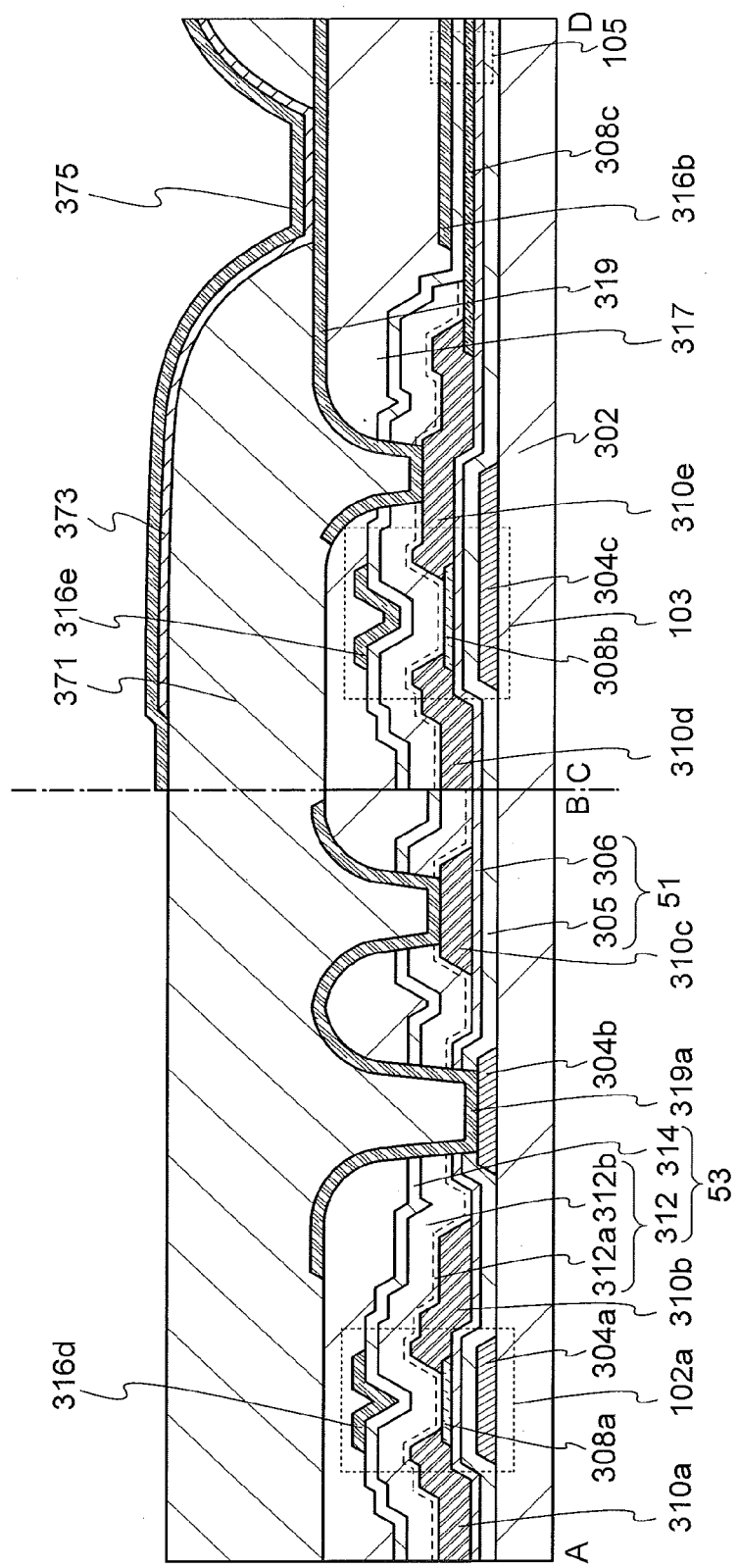
FIG. 30 is a cross-sectional view illustrating one embodiment of a semiconductor device.
Figure 31:
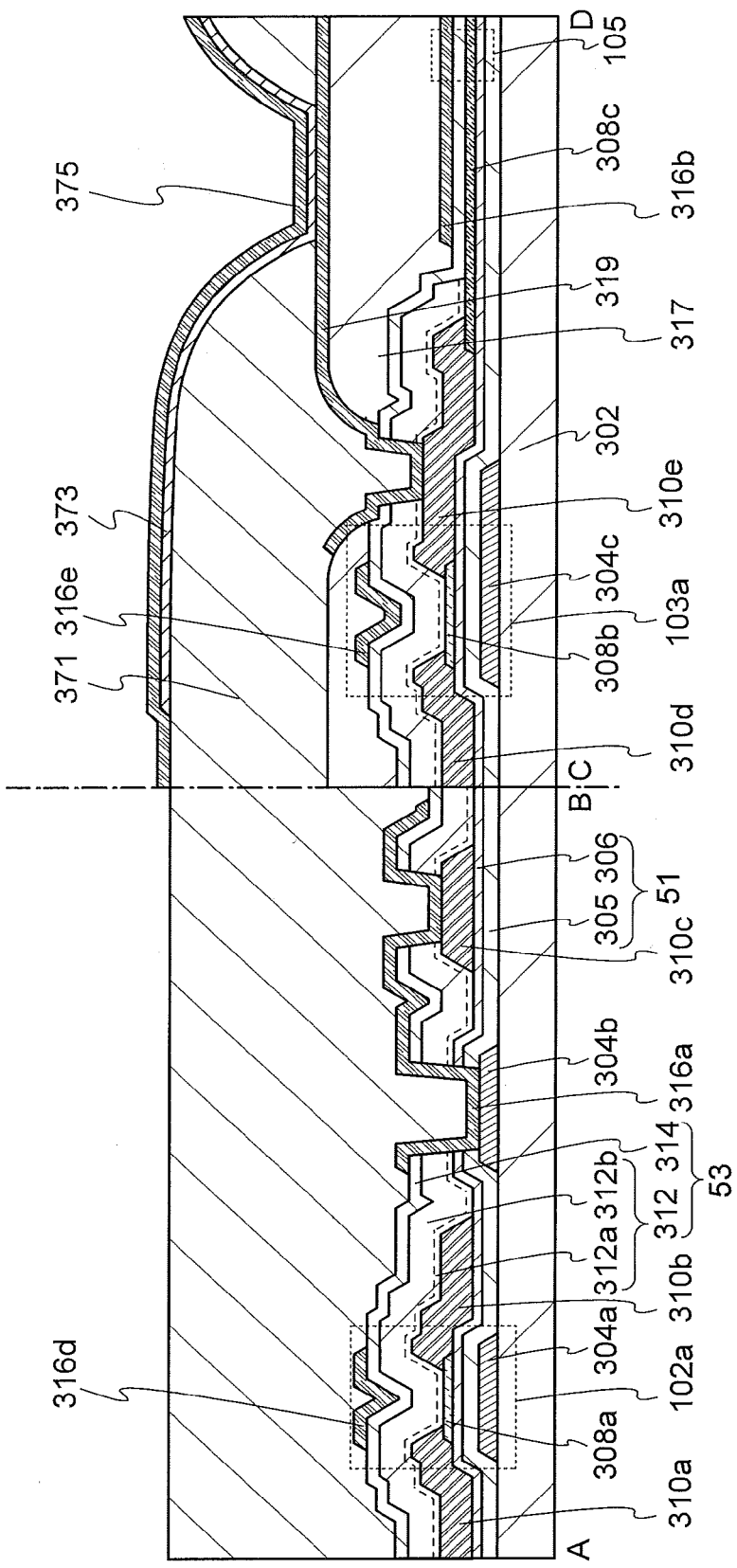
FIG. 31 is a cross-sectional view illustrating one embodiment of a semiconductor device.

In the case where the organic insulating film 317a is not provided in the driver circuit portion as illustrated in FIG. 27, the conductive film 319a formed at the same time as the conductive film 319 may be provided over the conductive film 316d functioning as a gate electrode of a transistor 102b with a dual-gate structure.

<Modification Example 4>

Although a liquid crystal element is described as an example of a display element in Embodiment 5 and Embodiment 6, various other display elements can be used. For example, the case of using an organic EL element is described with reference to FIG. 28, FIG. 29, FIG. 30, and FIG. 31. A display device including an organic EL element includes an organic resin film 371 formed with an acrylic resin, polyimide, an epoxy resin, or the like; an EL layer 373 provided over the organic resin film 371; and a common electrode 375 provided over the EL layer 373. The conductive film 319, the EL layer 373, and the common electrode 375 constitute the organic EL element.

Note that the structures, methods, and the like described in this embodiment can be used as appropriate in combination with any of the structures, methods, and the like described in the other embodiments.

(Embodiment 7)

In this embodiment, a liquid crystal display device including a transistor and a capacitor and being formed through a process using eight photomasks, which is one more than the number of photomasks used in Embodiment 2, 3, 4, or 5, is described with reference to FIG. 32.

Figure 32:
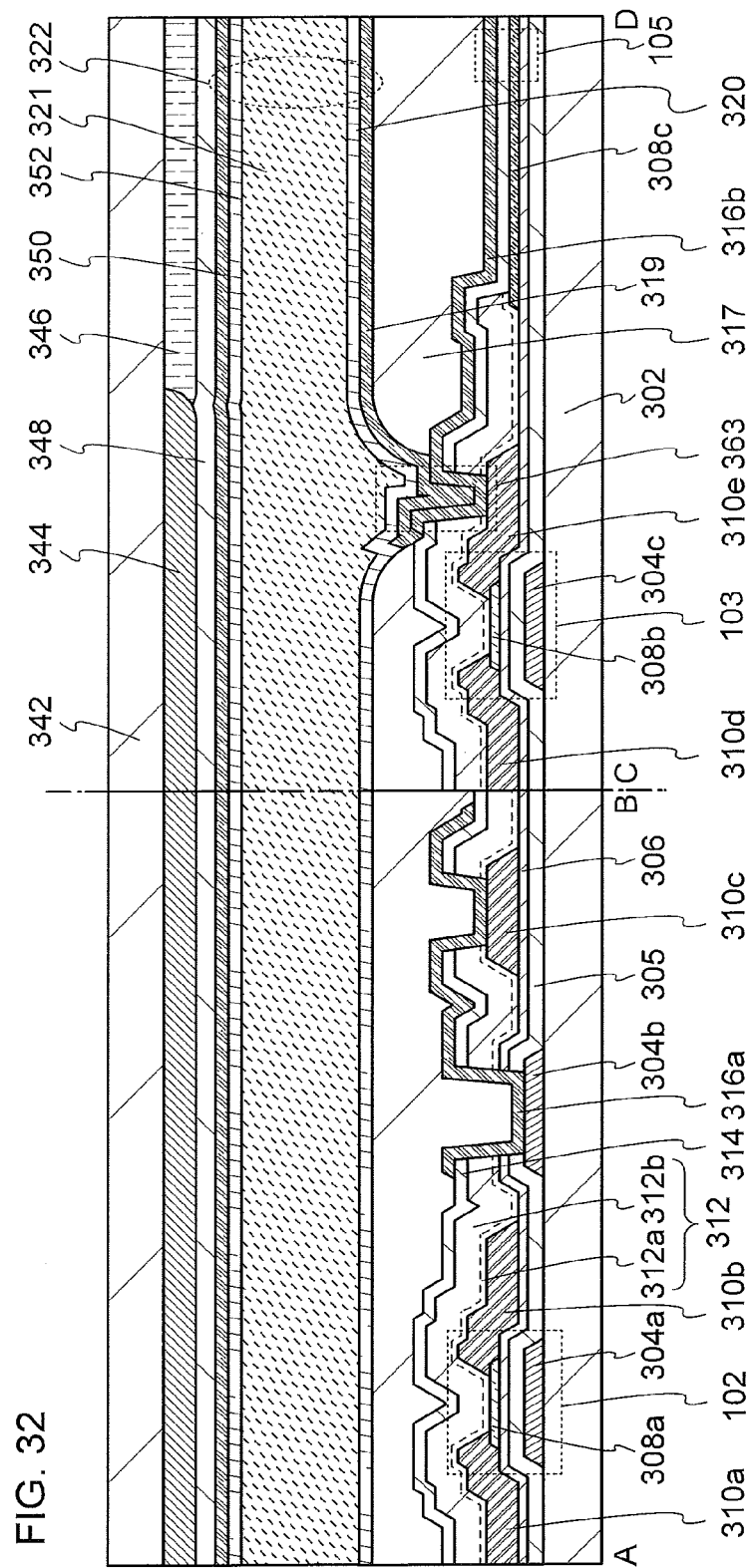
FIG. 32 is a cross-sectional view illustrating one embodiment of a semiconductor device.

In the liquid crystal display device illustrated in FIG. 32, the conductive film 316b and the conductive film 310e of the transistor 103 are connected to the conductive film 319 in an opening 363 formed in the insulating film 312 and the insulating film 314.

In the liquid crystal display device of this embodiment, an opening in which the transistor 103 is connected to the capacitor 105 overlaps with an opening in which the transistor 103 is connected to the conductive film 319 functioning as a pixel electrode. In other words, an opening in which the conductive film 310e of the transistor 103 is connected to the conductive film 316b of the capacitor 105 overlaps with an opening in which the conductive film 310e of the transistor 103 is connected to the conductive film 319 functioning as a pixel electrode. Thus, the aperture ratio of each pixel can be increased.

Note that the structures, methods, and the like described in this embodiment can be used as appropriate in combination with any of the structures, methods, and the like described in the other embodiments.

(Embodiment 8)

In this embodiment, a liquid crystal display device including a transistor having a different structure from the transistors described in Embodiments 2 to 7 is described with reference to FIG. 33, FIGS. 34A to 34C, FIGS. 35A to 35C, FIGS. 36A to 36C, and FIG. 37.

Figure 33:
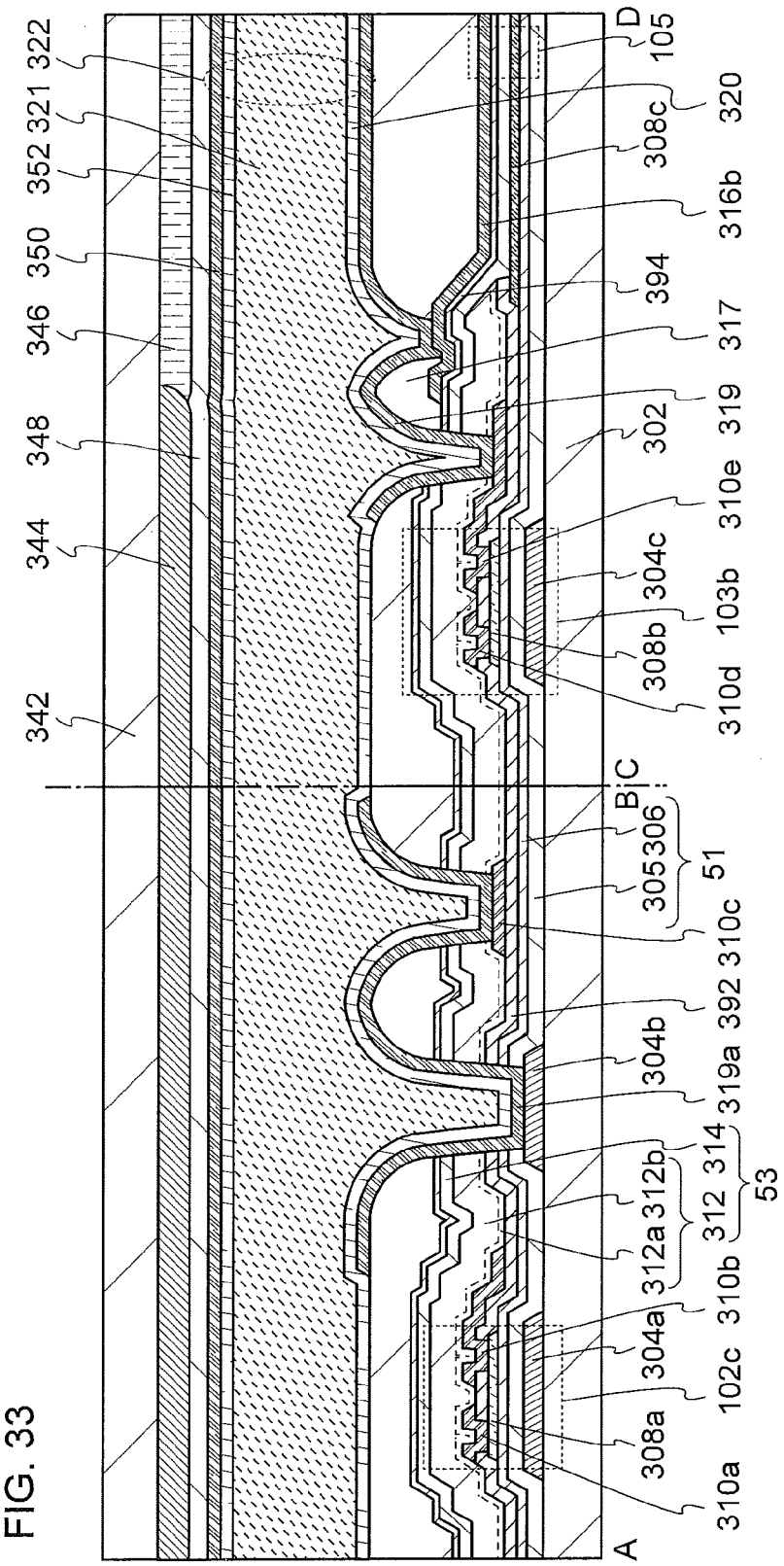
FIG. 33 is a cross-sectional view illustrating one embodiment of a semiconductor device.

A liquid crystal display device illustrated in FIG. 33 is different from the liquid crystal display devices described in Embodiments 2 to 7 in that a channel-protection transistor is used.

The liquid crystal display device in FIG. 33 is different from the liquid crystal display devices in Embodiments 2 to 7 in that the oxide semiconductor film 308a is connected to the conductive films 310a and 310b and the oxide semiconductor film 308b is connected to the conductive films 310d and 310e in openings in an insulating film 392. Further, the difference lies in that an insulating film 394 is provided between the insulating film 314 and the conductive film 316b.

In the driver circuit portion, the transistor 102c includes the conductive film 304a functioning as the gate insulating film 51, the insulating films 305 and 306 collectively functioning as a gate insulating film, the oxide semiconductor film 308a in which a channel region is formed, the insulating film 392 covering the oxide semiconductor film 308a, and the conductive films 310a and 310b which are in contact with the oxide semiconductor film 308a in the openings in the insulating film 392 and function as a source electrode and a drain electrode. Further, the insulating films 312, 314, and 394 are provided over the conductive films 310a, 310b, and 310c.

In the pixel portion, the transistor 103b includes the conductive film 304c functioning as a gate electrode, the insulating films 305 and 306 collectively functioning as a gate insulating film, the oxide semiconductor film 308b which is formed over the gate insulating film and in which a channel region is fog lied, the insulating film 392 covering the oxide semiconductor film 308b, and the conductive films 310d and 310e which are in contact with the oxide semiconductor film 308b in the openings in the insulating film 392 and function as a source electrode and a drain electrode. Further, the insulating films 312, 314, and 394 are provided over the conductive films 310d and 310e.

The conductive film 316b is provided over the insulating film 314.

The capacitor 105 includes the metal oxide film 308c functioning as one electrode, the insulating film 314 and the insulating film 394 functioning as a dielectric film, and the conductive film 316b functioning as the other electrode.

The insulating film 392 is preferably formed with an oxide insulating film because of being in contact with the oxide semiconductor films 308a and 308b. The insulating film 392 can be formed using a material similar to that of the insulating film 306. Further, it is preferable that the insulating film 392 be an oxide insulating film which transmits oxygen like the insulating film 312a and have few defects. As a result, oxygen contained in the insulating film 312b can be moved to the oxide semiconductor films 308a and 308b to reduce the oxygen vacancies in the oxide semiconductor films 308a and 308b. Further, it is preferable that the amount of defects at the interface between the insulating film 392 and the oxide semiconductor films 308a and 308b be small.

The insulating film 394 is provided to control the capacity value of the capacitor 105. Thus, the insulating film 394 can be formed using an oxide insulating film or a nitride insulating film as appropriate. As the insulating film 394, an oxide insulating film formed by a chemical vapor deposition (CVD) method using an organosilane gas, typically a silicon oxide film, is preferably used because the planarity can be improved. In the case where the capacitor 105 can obtain a certain amount of capacity value with the insulating film 314, the insulating film 394 is not necessarily provided.

In this modification example, the oxide semiconductor films 308a and 308b are not damaged by etching for forming the conductive films 310a, 310b, 310d, and 310e because the oxide semiconductor films 308a and 308b are covered with the insulating film 392. Further, the insulating film 312 is formed using an oxide insulating film which contains oxygen at a higher proportion than the stoichiometric composition. Thus, part of oxygen contained in the oxide insulating film 312 can be moved to the oxide semiconductor films 308a and 308b, so that the amount of oxygen vacancies contained in the oxide semiconductor films 308a and 308b can be reduced.

The organic insulating film 317 is provided over the insulating film 394 and the conductive film 316b.

The conductive films 319 and 319a are formed over the organic insulating film 317. The conductive film 319 functions as a pixel electrode. The conductive film 319a is electrically connected to the conductive film 310a through the opening 364a (see FIG. 36C) and electrically connected to the conductive film 310c through the opening 364b (see FIG. 36C). That is, the conductive film 319a functions as a connection electrode which connects the conductive film 304a and the conductive film 310c.

A formation method of the element portion over the substrate 302 in the liquid crystal device shown in FIG. 33 is described with reference to FIGS. 5A to 5C, FIGS. 34A to 34C, FIGS. 35A to 35C, and FIGS. 36A to 36C.

In a manner similar to that of Embodiment 1, through the steps in FIGS. 5A to 5C, the conductive films 304a, 304b, and 304c, each of which functions as a gate electrode, the insulating films 305 and 306 which function as a gate insulating film, and the oxide semiconductor films 308a, 308b, and 308d are formed over the substrate 302. Note that in the process, the first and second patterning are performed to form the conductive films 304a, 304b, and 304c and the oxide semiconductor films 308a 308b, and 308d.

Figure 34A:
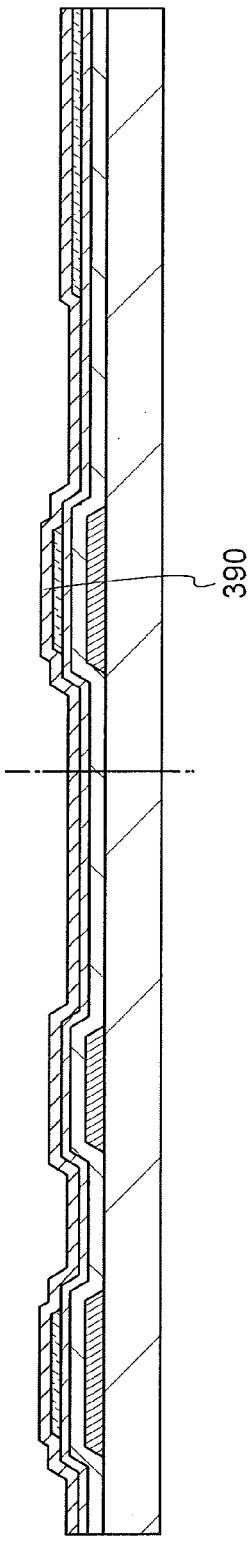
FIGS. 34A to 34C are cross-sectional views illustrating one embodiment of a method of manufacturing a semiconductor device.

Next, as illustrated in FIG. 34A, the insulating film 390 is formed. The insulating film 390 is formed under conditions similar to those of the insulating film 305 or the insulating film 311a.

Figure 34B:
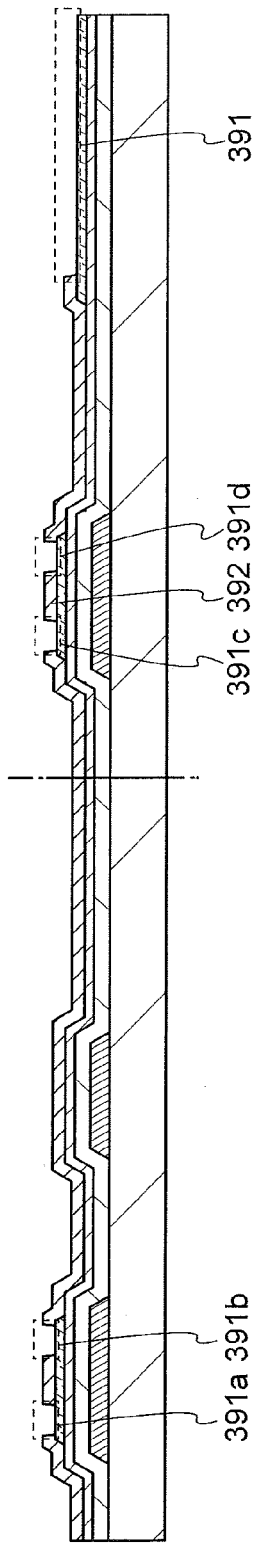

Next, the insulating film 390 is processed into a desired shape to form an insulating film 392 having the openings 391, 391a, 391b, 391c, and 391d as illustrated in FIG. 34B. Note that the insulating film 392 can be formed in such a manner that a mask is Mimed in a desired shape by third patterning and regions not covered with the mask are etched.

Figure 34C:
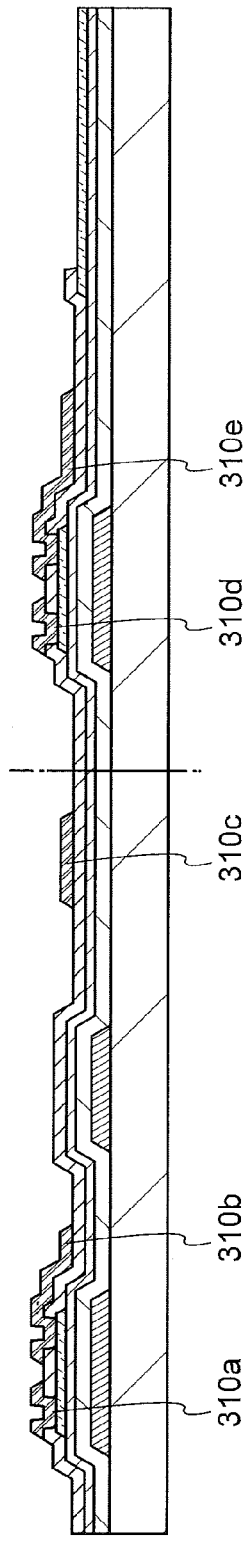

Next, after a conductive film is formed over the oxide semiconductor films 308a and 308b and the insulating film 392, a process similar to that in Embodiment 1 is performed, so that the conductive films 310a, 310b, 310c, 310d, and 310e are formed (see FIG. 34C). The conductive films 310a, 310b, 310c, 310d, and 310e can be formed in such a manner that a mask is formed in a desired shape by fourth patterning and regions not covered with the mask are etched.

Next, the insulating film 311 is formed over the insulating film 392 and the conductive films 310a, 310b, 310c, 310d, and 310e (see FIG. 35A).

Then, the insulating film 311 is processed into a desired shape to form the insulating film 312 having the opening 393. Note that the insulating film 312 and the opening 393 can be formed in such a manner that a mask is formed in a desired shape by fifth patterning and regions not covered with the mask are etched (see FIG. 35B).

Next, as illustrated in FIG. 35C, the insulating film 313 and the insulating film 394 are formed to cover the oxide semiconductor film 308d, the insulating film 392, and the opening 393.

The insulating film 394 is formed by CVD, sputtering, or the like.

Figure 36A:
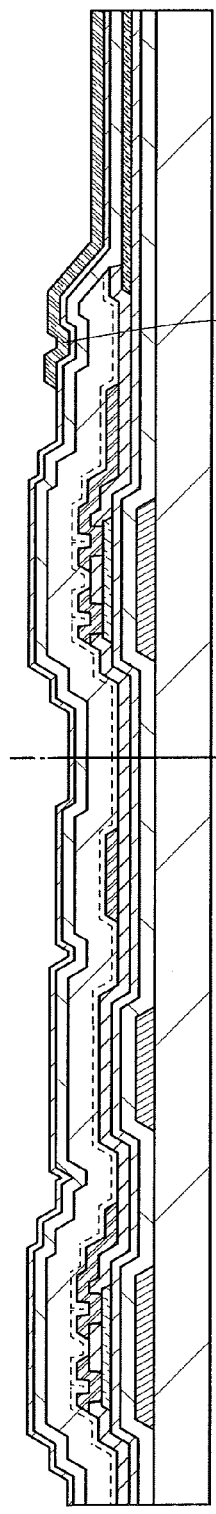
FIGS. 36A to 36C are cross-sectional views illustrating one embodiment of a method of manufacturing a semiconductor device.

Next, a conductive film is formed over the insulating film 394, and then the conductive film 316b is formed through a process the same as that in Embodiment 1 (see FIG. 36A). The conductive films 316a and 316b can be formed in such a manner that a mask is formed in a desired shape by sixth patterning and regions not covered with the mask are etched.

Figure 36B:
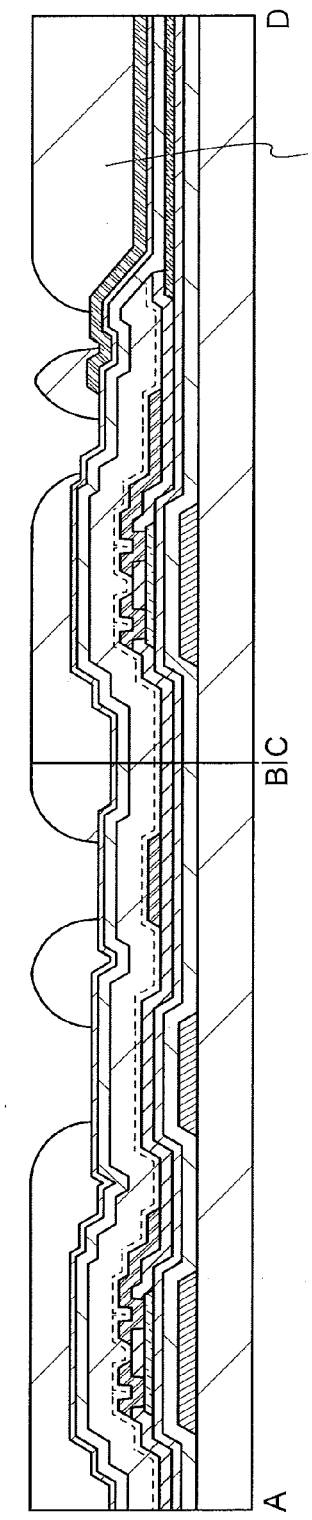

Next, as illustrated in FIG. 36B, the organic insulating film 317 is formed as in Embodiment 2. The organic insulating film 317 can be formed through a photolithography process the same as that using the sixth photomask described in Embodiment 2. Note that in this embodiment, this process corresponds to seventh patterning.

Figure 36C:
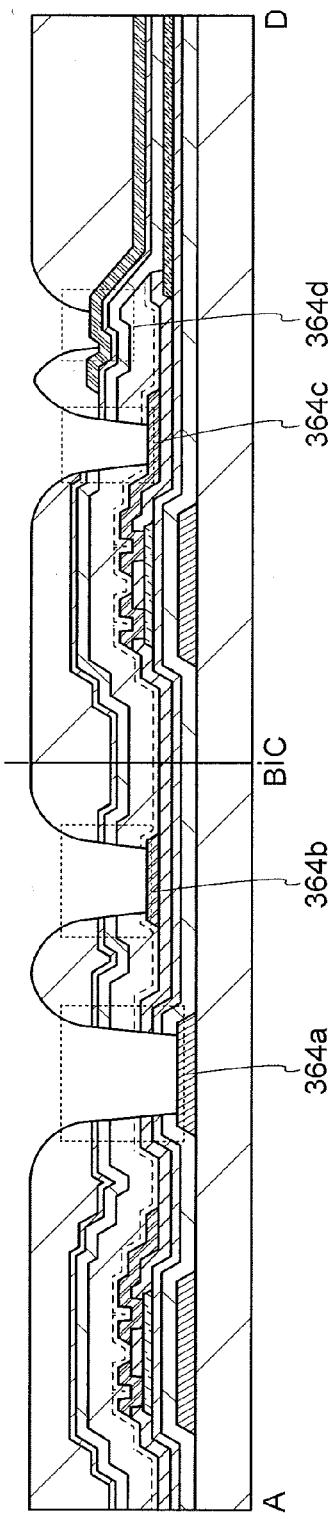

Next, the insulating film 305, the insulating film 306, the insulating film 312, the insulating film 313, and the insulating film 394 are partly etched using the organic insulating film 317 as a mask to form the opening 364a from which the conductive film 304b is exposed, the opening 364b from which the conductive film 310c is exposed, the opening 364c from which the conductive film 310e is exposed, and the opening 364d from which the conductive film 316b is exposed (see FIG. 36C).

Figure 37:
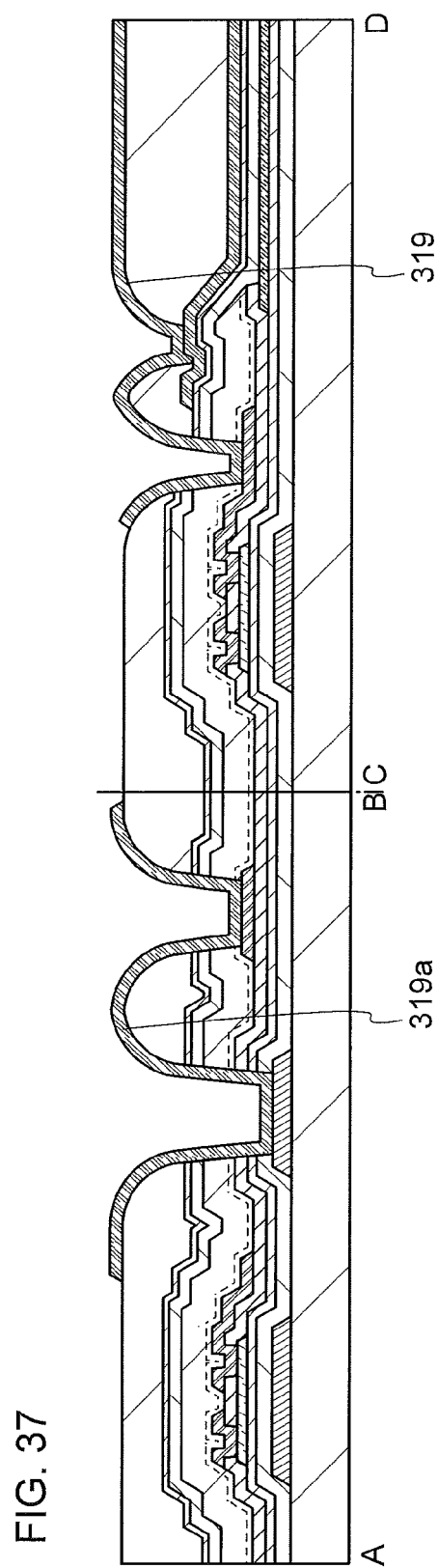
FIG. 37 is a cross-sectional view illustrating one embodiment of a method of manufacturing a semiconductor device.
Figure 38:
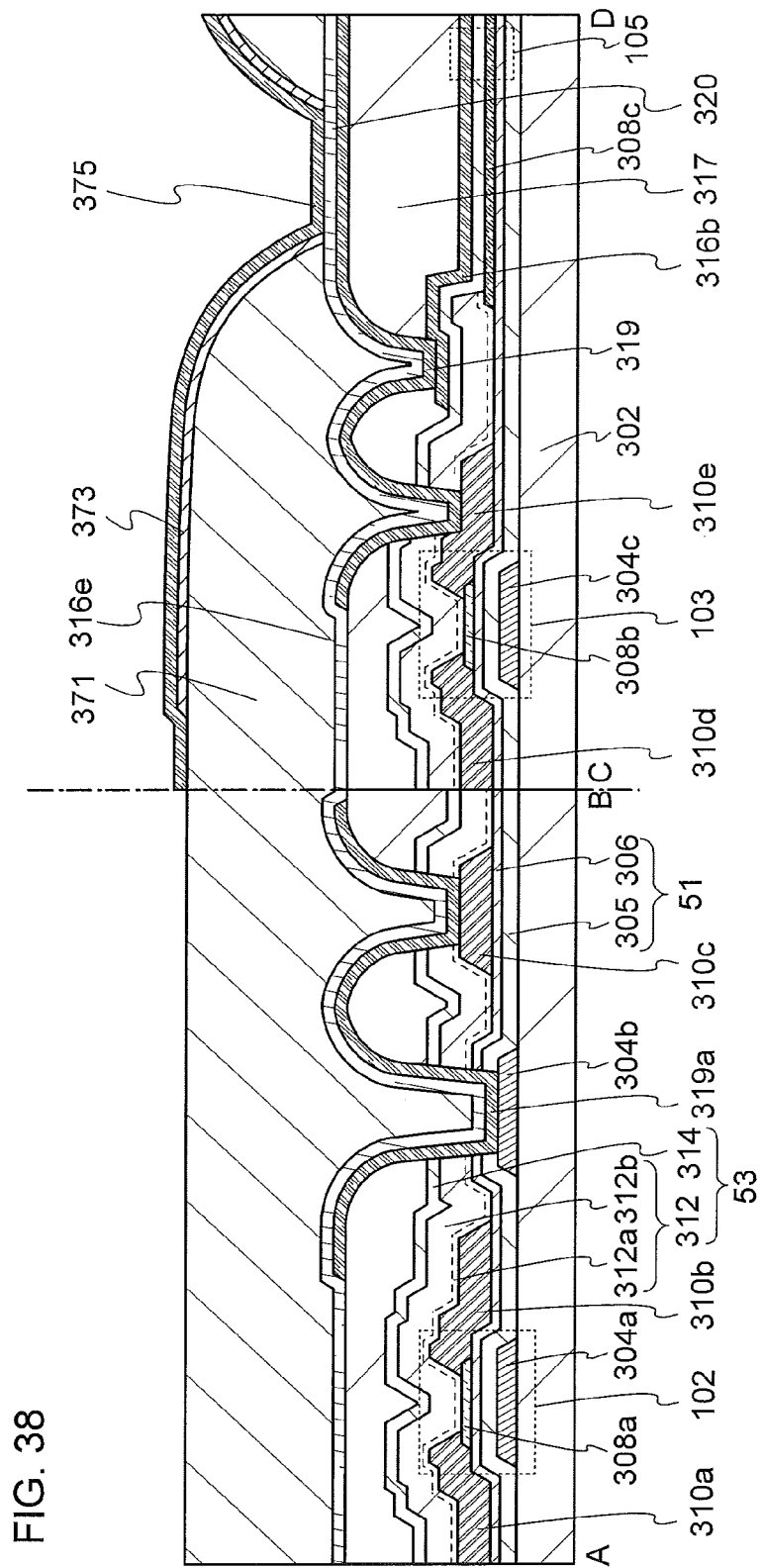
FIG. 38 is a cross-sectional view illustrating one embodiment of a semiconductor device.
Figure 39:
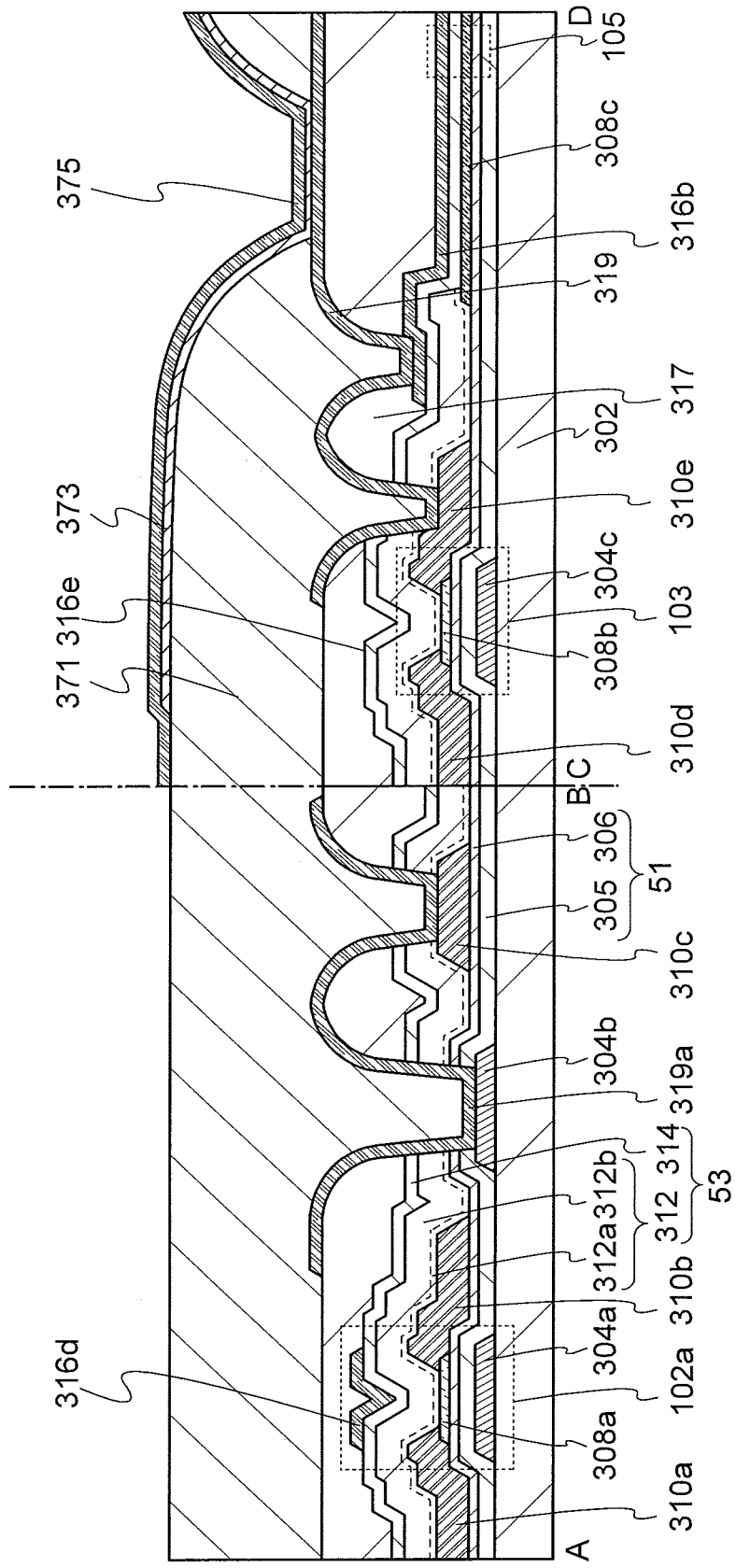
FIG. 39 is a cross-sectional view illustrating one embodiment of a semiconductor device.
Figure 40:
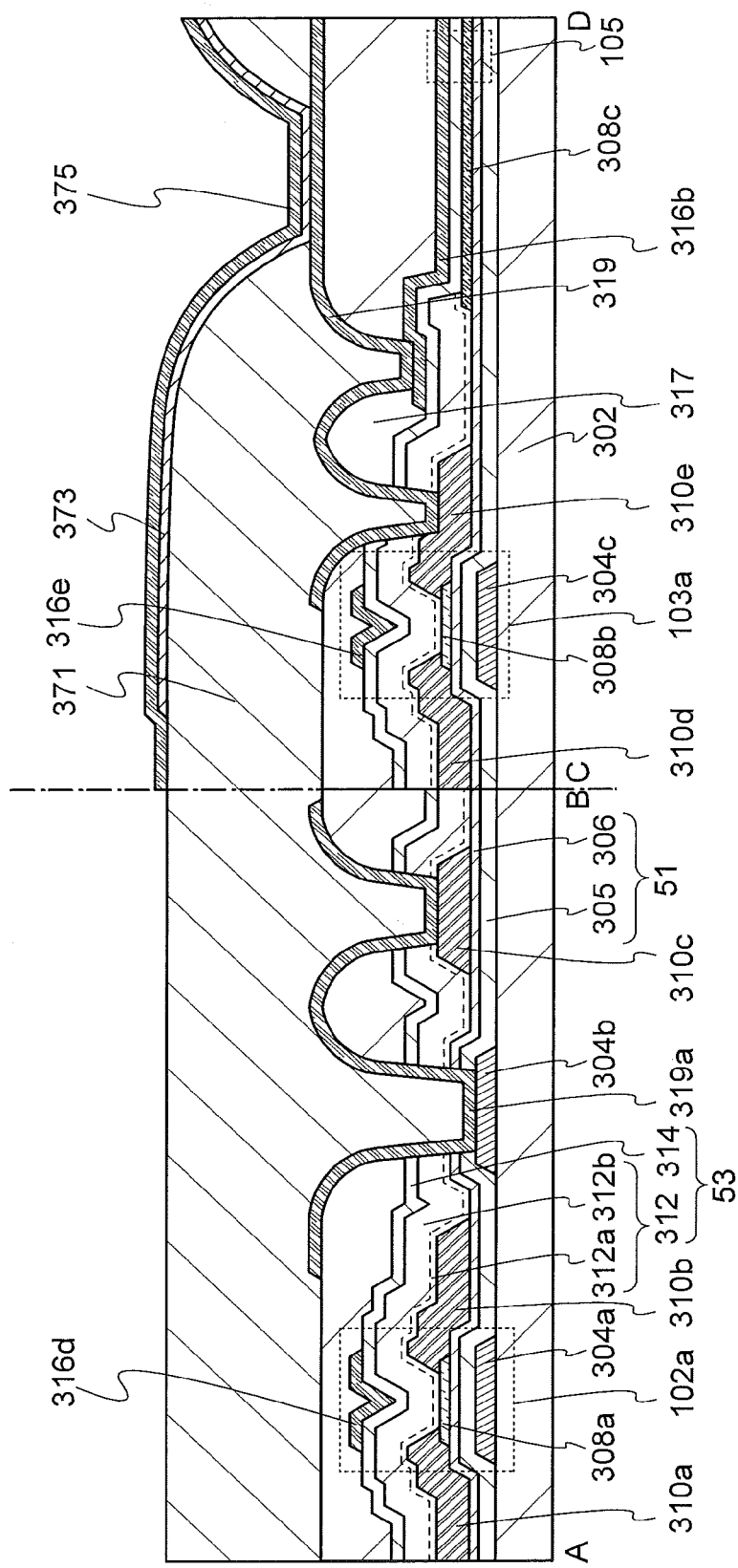
FIG. 40 is a cross-sectional view illustrating one embodiment of a semiconductor device.
Figure 41:
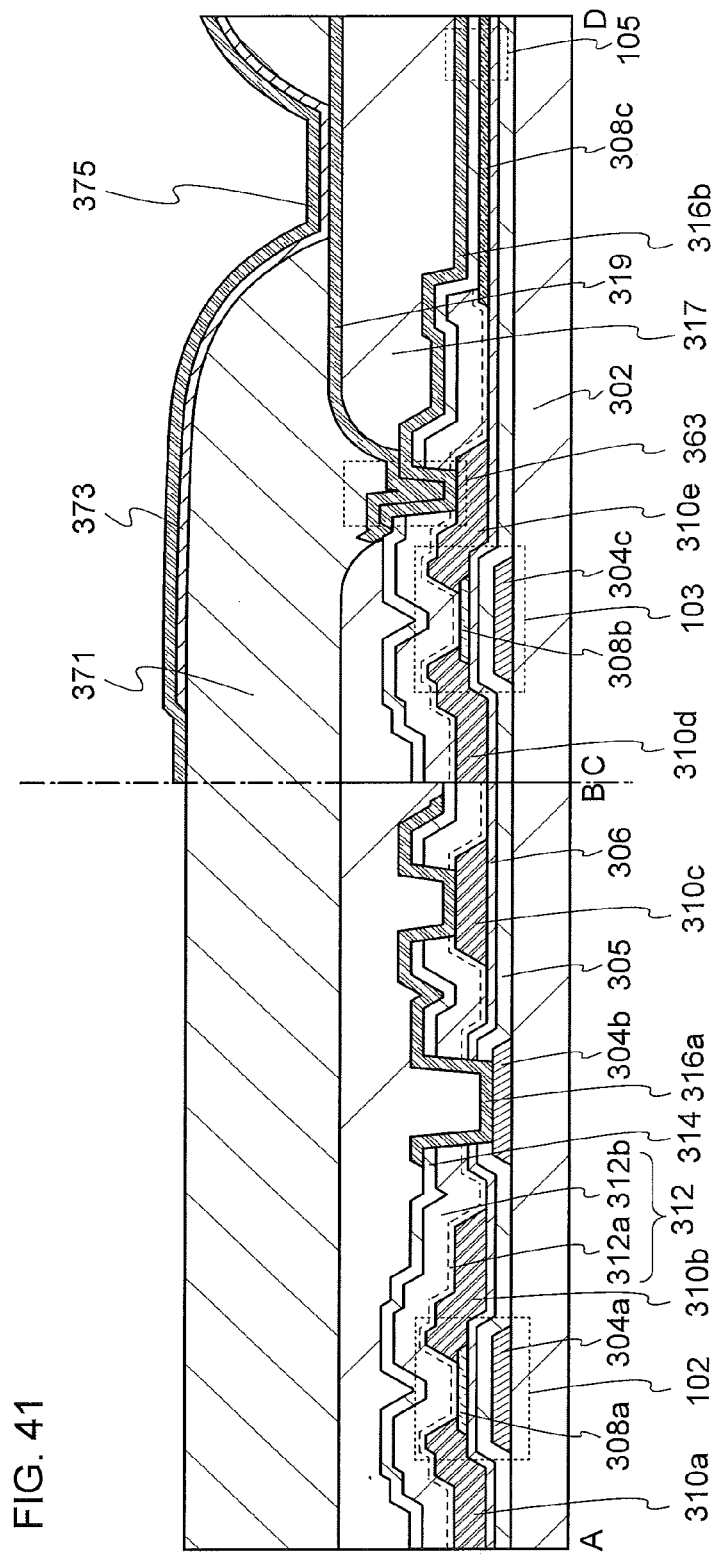
FIG. 41 is a cross-sectional view illustrating one embodiment of a semiconductor device.
Figure 42:
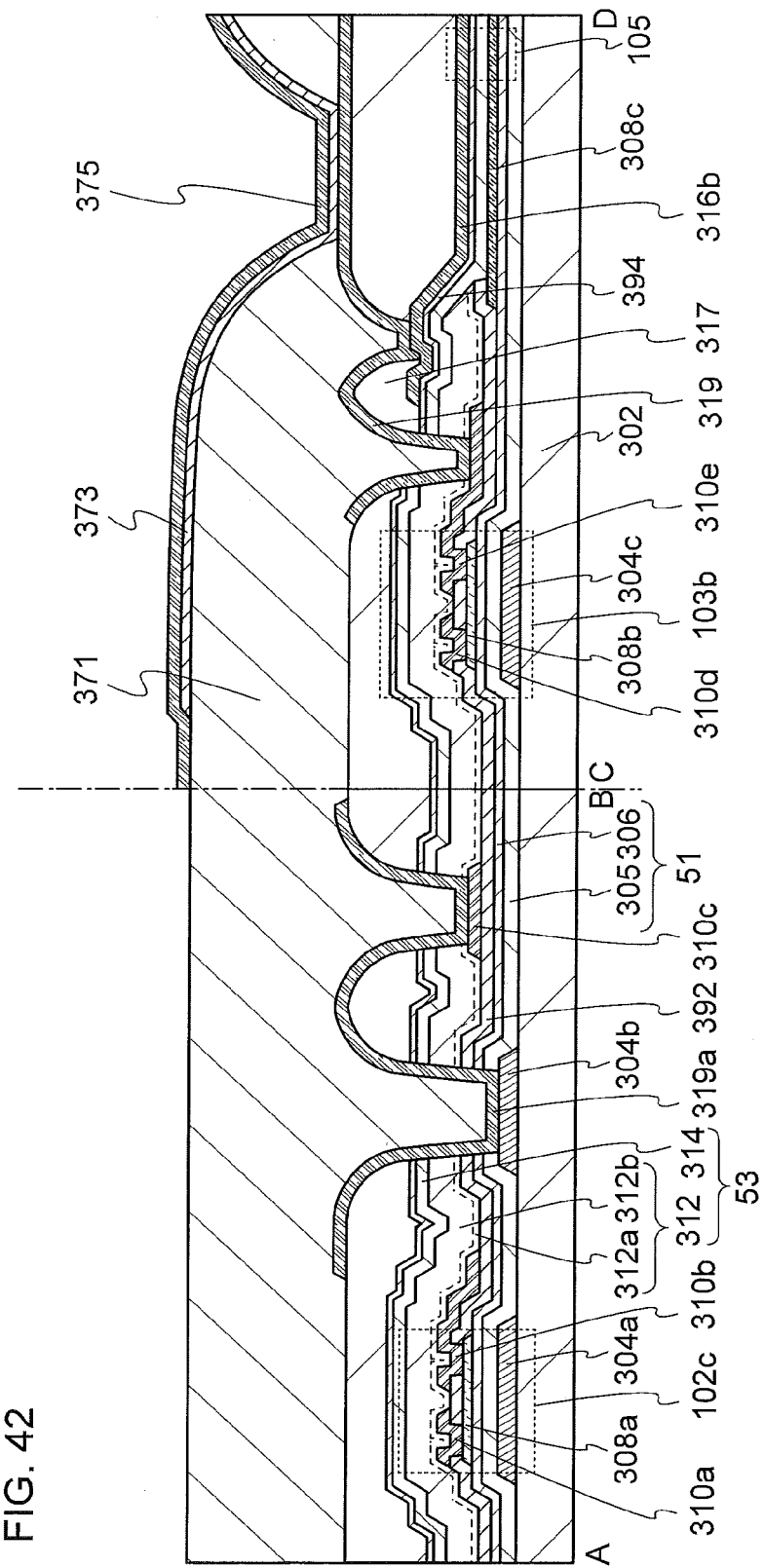
FIG. 42 is a cross-sectional view illustrating one embodiment of a semiconductor device.

Next, a conductive film is focused to form the conductive films 319 and 319a through a process the same as that in Embodiment 1 (see FIG. 37). The conductive films 319 and 319a can be formed in such a manner that a mask is formed in a desired shape by eighth patterning and regions not covered with the mask are etched.

Through the above process, the pixel portion and the driver circuit portion that include the transistors can be formed over the substrate 302. In the manufacturing process described in this embodiment, the transistors and the capacitor can be formed at the same time by the first to eighth patterning, that is, with the eight photomasks.

Although a liquid crystal element is described as an example of a display element in Embodiments 1 to 8, various other display elements can be used. For example, the case of using an organic EL element is described with reference to FIG. 38, FIG. 39, FIG. 40, FIG. 41, and FIG. 42. A display device including an organic EL element includes an organic resin film 371 formed with an acrylic resin, polyimide, an epoxy resin, or the like; an EL layer 373 provided over the organic resin film 371; and a common electrode 375 provided over the EL layer 373. The conductive film 319, the EL layer 373, and the common electrode 375 constitute the organic EL element.

Note that the structures, methods, and the like described in this embodiment can be used as appropriate in combination with any of the structures, methods, and the like described in the other embodiments.

(Embodiment 9)

In the transistors 102, 102a, 102b, 102c, 103, 103a, and 103b described in Embodiments 2 to 8, the oxide semiconductor film can have a stacked structure as needed. Here, an example of the transistor 103 is described.

Figure 43:
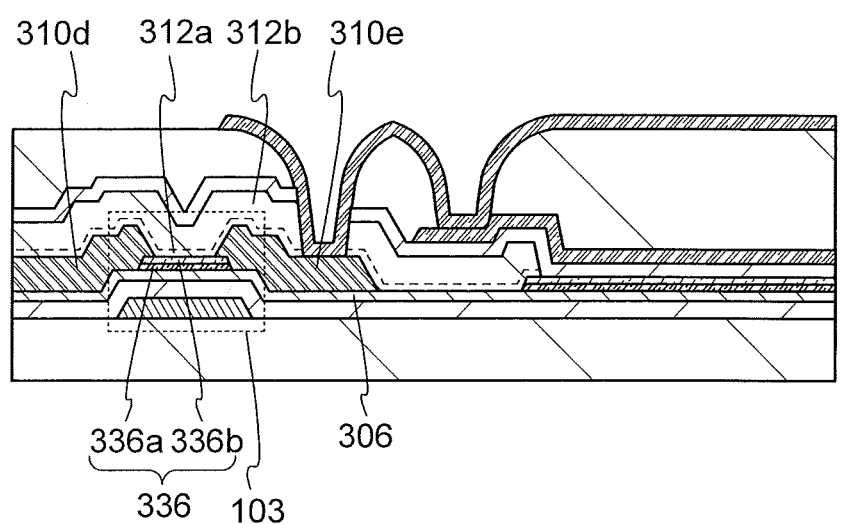
FIG. 43 is a cross-sectional view illustrating one embodiment of a semiconductor device.

In the transistor illustrated in FIG. 43, a multilayer film 336 including an oxide semiconductor film is formed between the insulating film 306 and the conductive films 310d and 310e.

The multilayer film 336 includes the oxide semiconductor film 336a and the oxide semiconductor film 336b. That is, the multilayer film 336 has a two-layer structure. Further, part of the oxide semiconductor film 336a serves as a channel region. Furthermore, the insulating film 312a is formed in contact with the multilayer film 336, and the oxide semiconductor film 336b is formed in contact with the insulating film 312a. That is, the oxide semiconductor film 336b is provided between the oxide semiconductor film 336a and the insulating film 312a.

The oxide semiconductor film 336b contains one or more elements which form the oxide semiconductor film 336a. Since the oxide semiconductor film 336b contains one or more elements which form the oxide semiconductor film 336a, interface scattering is unlikely to occur at the interface between the oxide semiconductor film 336a and the oxide semiconductor film 336b. Thus, the transistor can have a high field-effect mobility because the movement of carriers is not hindered at the interface.

The oxide semiconductor film 336b is typically an In—Ga oxide film, an In—Zn oxide film, or an In-M-Zn oxide film (M represents Al, Ti, Ga, Y, Zr, La, Ce, Nd, Sn, or Hf). The energy at the conduction band bottom of the oxide semiconductor film 336b is closer to a vacuum level than that of the oxide semiconductor film 336a is, and typically, the difference between the energy at the conduction band bottom of the oxide semiconductor film 336b and the energy at the conduction band bottom of the oxide semiconductor film 336a is any one of 0.05 eV or more, 0.07 eV or more, 0.1 eV or more, and 0.15 eV or more, and any one of 2 eV or less, 1 eV or less, 0.5 eV or less, and 0.4 eV or less. That is, the difference between the electron affinity of the oxide semiconductor film 336b and the electron affinity of the oxide semiconductor film 336a is any one of 0.05 eV or more, 0.07 eV or more, 0.1 eV or more, and 0.15 eV or more, and any one of 2 eV or less, 1 eV or less, 0.5 eV or less, and 0.4 eV or less.

The oxide semiconductor film 336b preferably contains In because carrier mobility (electron mobility) can be increased.

When the oxide semiconductor film 336b contains a larger amount of Al, Ti, Ga, Y, Zr, La, Ce, Nd, Sn or Hf in an atomic ratio than the amount of In in an atomic ratio, any of the following effects may be obtained: (1) the energy gap of the oxide semiconductor film 336b is widened; (2) the electron affinity of the oxide semiconductor film 336b decreases; (3) an impurity from the outside is blocked; (4) an insulating property increases as compared to the oxide semiconductor film 336a; and (5) oxygen vacancies are less likely to be generated in the oxide semiconductor film 336b because Al, Ti, Ga, Y, Zr, La, Ce, Nd, Sn, or Hf is a metal element which is strongly bonded to oxygen.

In the case where the oxide semiconductor film 336b is In-M-Zn oxide, the proportions of In and M when summation of In and M is assumed to be 100 atomic % are preferably as follows: the atomic percentage of In is less than 50 atomic % and the atomic percentage of M is greater than 50 atomic %; further preferably, the atomic percentage of In is less than 25 atomic % and the atomic percentage of M is greater than 75 atomic %.

Further, in the case where each of the oxide semiconductor film 336a and the oxide semiconductor film 336b is In-M-Zn oxide (M represents Al, Ti, Ga, Y, Zr, La, Ce, Nd, Sn, or Hf), the proportion of M atoms (M represents Al, Ti, Ga, Y, Zr, La, Ce, Nd, Sn, or Hf) in the oxide semiconductor film 336b is higher than that in the oxide semiconductor film 336a. Typically, the proportion of M in each of the films is 1.5 or more times, preferably twice or more, more preferably three or more times as high as that in the oxide semiconductor film 336a.

Furthermore, in the case where each of the oxide semiconductor film 336a and the oxide semiconductor film 336b is In-M-Zn oxide film (M represents Al, Ti, Ga, Y, Zr, La, Ce, Nd, Sn, or Hf), when In:M:Zn=$x_1$:$y_1$:$z_1$ [atomic ratio] is satisfied in the oxide semiconductor film 336b and In:M:Zn=$x_2$:$y_2$:$z_2$ [atomic ratio] is satisfied in the oxide semiconductor film 336a, $y_1/x_1$ is higher than $y_2/x_2$. It is preferable that $y_1/x_1$ be 1.5 or more times as high as $y_2/x_2$. It is further preferable that $y_1/x_1$ be twice or more as high as $y_2/x_2$. It is still further preferable that $y_1/x_1$ be three or more times as high as $y_2/x_2$.

For example, for the oxide semiconductor film 336a, an In—Ga—Zn oxide with an atomic ratio of In:Ga:Zn=1:1:1, 1:1:1.2, or 3:1:2 can be used. For the oxide semiconductor film 336b, an In—Ga—Zn oxide with an atomic ratio of In:Ga:Zn=1:3:n (n is an integer greater than or equal to 2 and less than or equal to 8), 1:6:m (m is an integer greater than or equal to 2 and less than or equal to 10), or 1:9:6 can be used. Note that the atomic ratio of each of the oxide semiconductor film 336a and the oxide semiconductor film 336b can allow a difference within a range of ±20%. In the oxide semiconductor film 336a, a percentage of Zn is preferably higher than or equal to a percentage of Ga because a CAAC-OS is easily formed.

The oxide semiconductor film 336b also serves as a film which relieves damage to the oxide semiconductor film 336a at the time of forming the insulating film 312b later.

The thickness of the oxide semiconductor film 336b is greater than or equal to 3 nm and less than or equal to 100 nm, preferably greater than or equal to 3 nm and less than or equal to 50 nm.

The oxide semiconductor film 336b may have a non-single-crystal structure, for example, like the oxide semiconductor film 336a. The non-single crystal structure includes a c-axis aligned crystalline oxide semiconductor (CAAC-OS) which is described later, a polycrystalline structure, a microcrystalline structure described later, or an amorphous structure, for example.

Note that the oxide semiconductor film 336a and the oxide semiconductor film 336b may each be a mixed film including two or more of the following: a region having an amorphous structure, a region having a microcrystalline structure, a region having a polycrystalline structure, a CAAC-OS region, and a region having a single-crystal structure. The mixed film has a single structure including, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure of two or more of a region having an amorphous structure, a region having a microcrystalline structure, a region having a polycrystalline structure, a CAAC-OS region, and a region having a single-crystal structure in some cases.

Here, the oxide semiconductor film 336b is provided between the oxide semiconductor film 336a and the insulating film 312a. Hence, if a carrier trap is formed between the oxide semiconductor film 336b and the insulating film 312a owing to impurities and defects, electrons flowing in the oxide semiconductor film 336a are less likely to be captured by the carrier trap because there is a distance between the carrier trap and the oxide semiconductor film 336a. Accordingly, the amount of on-state current of the transistor can be increased, and the field-effect mobility can be increased. When an electron is captured by the carrier trap, the electron become a negative fixed charge. As a result, a threshold voltage of the transistor varies. However, by the distance between the oxide semiconductor film 336a and the carrier trap, capture of the electron by the carrier trap can be reduced, and accordingly a fluctuation of the threshold voltage can be reduced.

Further, impurities from the outside can be blocked by the oxide semiconductor film 336b, and accordingly, the amount of impurities which move from the outside to the oxide semiconductor film 336a can be reduced. Further, an oxygen vacancy is less likely to be formed in the oxide semiconductor film 336b. Consequently, the impurity concentration and the amount of oxygen vacancies in the oxide semiconductor film 336a can be reduced.

Note that the oxide semiconductor film 336a and the oxide semiconductor film 336b are not formed by simply stacking each film, but are formed to form a continuous junction (here, in particular, a structure in which the energy of the bottom of the conduction band is changed continuously between each film). In other words, a stacked-layer structure in which there exist no impurity which forms a defect level such as a trap center or a recombination center at each interface is provided. If an impurity exists between the oxide semiconductor film 336a and the oxide semiconductor film 336b which are stacked, a continuity of the energy band is damaged, and the carrier is captured or recombined at the interface and then disappears.

In order to form such a continuous energy band, it is necessary to form films continuously without being exposed to air, with use of a multi-chamber deposition apparatus (sputtering apparatus) including a load lock chamber. Each chamber in the sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

In FIG. 43, the multilayer film 336 has a two-layer structure of the oxide semiconductor film 336a and the oxide semiconductor film 336b; however the multilayer film 336 may have a three-layer structure in which a film similar to the oxide semiconductor film 336b is further provided between the insulating film 306 and the oxide semiconductor film 336a. In this case, the thickness of the oxide film provided between the insulating film 306 and the oxide semiconductor film 336a is preferably less than that of the oxide semiconductor film 336a. When the oxide film has a thickness greater than or equal to 1 nm and less than or equal to 5 nm, preferably greater than or equal to 1 nm and less than or equal to 3 nm, the amount of change in the threshold voltage of the transistor can be reduced.

Note that the structures, methods, and the like described in this embodiment can be used as appropriate in combination with any of the structures, methods, and the like described in the other embodiments.

(Embodiment 10)

In this embodiment, one embodiment that can be applied to the oxide semiconductor film and the metal oxide film in the transistor included in the display device described in the above embodiment is described. Note that structures of an oxide semiconductor film described here can be applied to a metal oxide film as appropriate.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS) layer, a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<CAAC-OS>

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 44A:
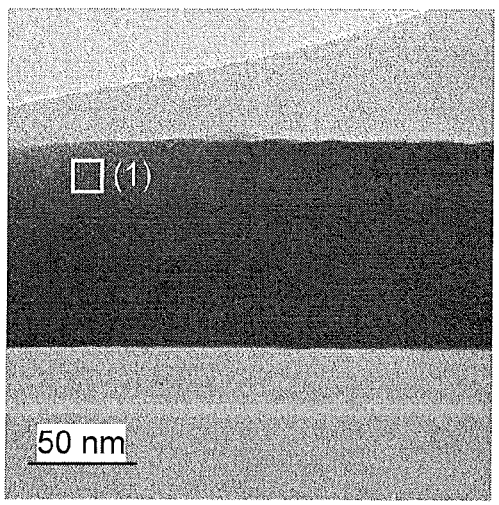
FIGS. 44A to 44D are Cs-corrected high-resolution TEM images of a cross section of a CAAC-OS and a cross-sectional schematic view of the CAAC-OS.

A CAAC-OS observed with TEM is described below. FIG. 44A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 44B:
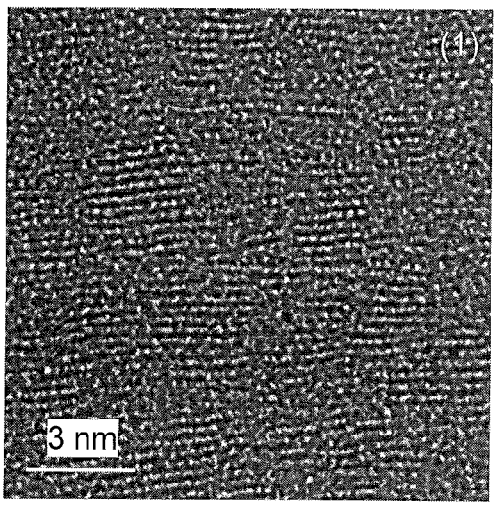

FIG. 44B is an enlarged Cs-corrected high-resolution TEM image of a region (1) in FIG. 44A. FIG. 44B shows that metal atoms are arranged in a layered manner in a pellet. Each metal atom layer has a configuration reflecting unevenness of a surface over which a CAAC-OS film is formed (hereinafter, the surface is referred to as a formation surface) or a top surface of the CAAC-OS, and is arranged parallel to the formation surface or the top surface of the CAAC-OS.

Figure 44C:
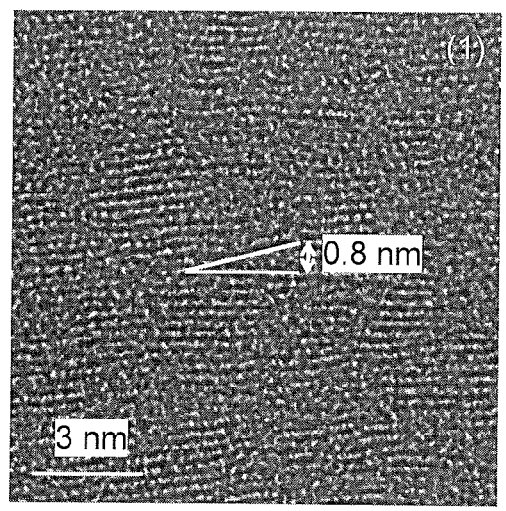

As shown in FIG. 44B, the CAAC-OS has a characteristic atomic arrangement. The characteristic atomic arrangement is denoted by an auxiliary line in FIG. 44C. FIGS. 44B and 44C prove that the size of a pellet is approximately 1 nm to 3 nm, and the size of a space caused by tilt of the pellets is approximately 0.8 nm. Therefore, the pellet can also be referred to as a nanocrystal (nc).

Figure 44D:
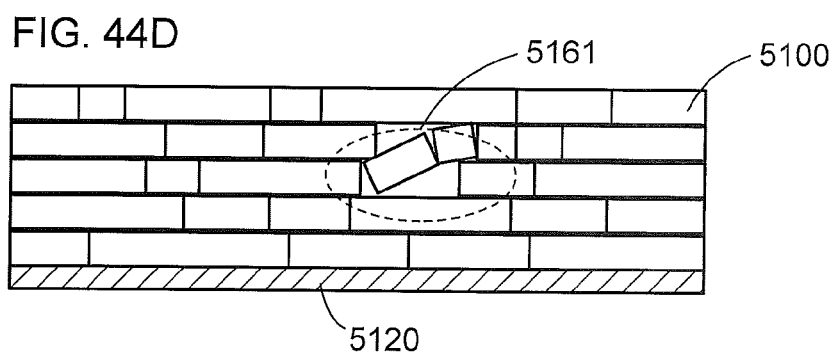

Here, according to the Cs-corrected high-resolution TEM images, the schematic arrangement of pellets 5100 of a CAAC-OS over a substrate 5120 is illustrated by such a structure in which bricks or blocks are stacked (see FIG. 44D). The part in which the pellets are tilted as observed in FIG. 44C corresponds to a region 5161 shown in FIG. 44D.

FIG. 45A shows a Cs-corrected high-resolution TEM image of a plane of the CAAC-OS observed from a direction substantially perpendicular to the sample surface. FIGS. 45B, 45C, and 45D are enlarged Cs-corrected high-resolution TEM images of regions (1), (2), and (3) in FIG. 45A, respectively. FIGS. 45B, 45C, and 45D indicate that metal atoms are arranged in a triangular, quadrangular, or hexagonal configuration in a pellet. However, there is no regularity of arrangement of metal atoms between different pellets.

Figure 46A:
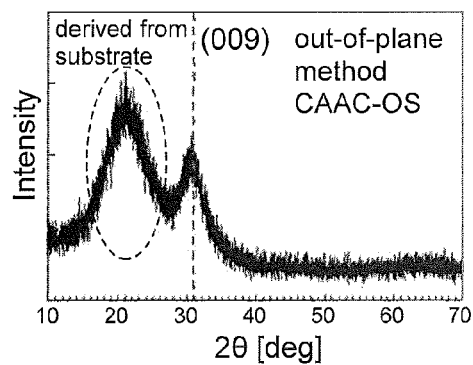
FIGS. 46A to 46C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 46A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 46B:
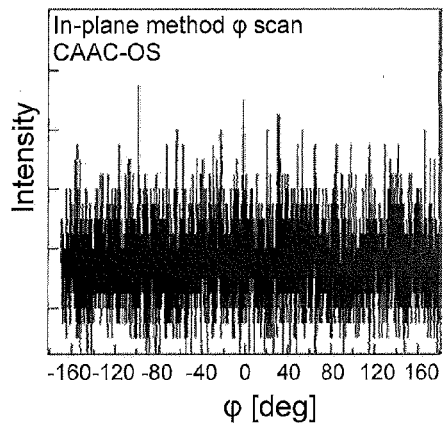
Figure 46C:
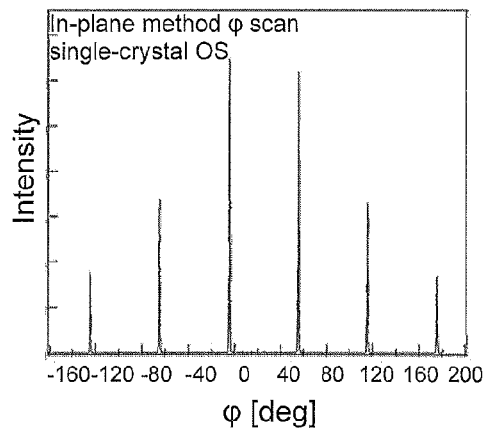

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 46B, a peak is not clearly observed. In contrast, in the case of a single crystal oxide semiconductor of $InGaZnO_4$, when φ scan is performed with 2θ fixed at around 56°, as shown in FIG. 46C, six peaks which are derived from crystal planes equivalent to the (110) plane are observed. Accordingly, the structural analysis using XRD shows that the directions of a-axes and b-axes are different in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 47A might be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 47B shows a diffraction pattern obtained in such a manner that an electron beam with a probe diameter of 300 nm is incident on the same sample in a direction perpendicular to the sample surface. As shown in FIG. 47B, a ring-like diffraction pattern is observed. Thus, the electron diffraction also indicates that the a-axes and b-axes of the pellets included in the CAAC-OS do not have regular alignment. The first ring in FIG. 47B is considered to be derived from the (010) plane, the (100) plane, and the like of the $InGaZnO_4$ crystal. The second ring in FIG. 47B is considered to be derived from the (110) plane and the like.

Moreover, the CAAC-OS is an oxide semiconductor having a low density of defect states. Defects in the oxide semiconductor are, for example, a defect due to impurity and oxygen vacancy. Therefore, the CAAC-OS can be regarded as an oxide semiconductor with a low impurity concentration, or an oxide semiconductor having a small amount of oxygen vacancy.

The impurity contained in the oxide semiconductor might serve as a carrier trap or serve as a carrier generation source. Furthermore, oxygen vacancy in the oxide semiconductor serves as a carrier trap or serves as a carrier generation source when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small amount of oxygen vacancy) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

Next, a microcrystalline oxide semiconductor is described.

A microcrystalline oxide semiconductor has a region in which a crystal part is observed and a region in which a crystal part is not clearly observed in a high-resolution TEM image In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

<Amorphous-like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS) layer.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS, an nc-OS, and a CAAC-OS are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 48:
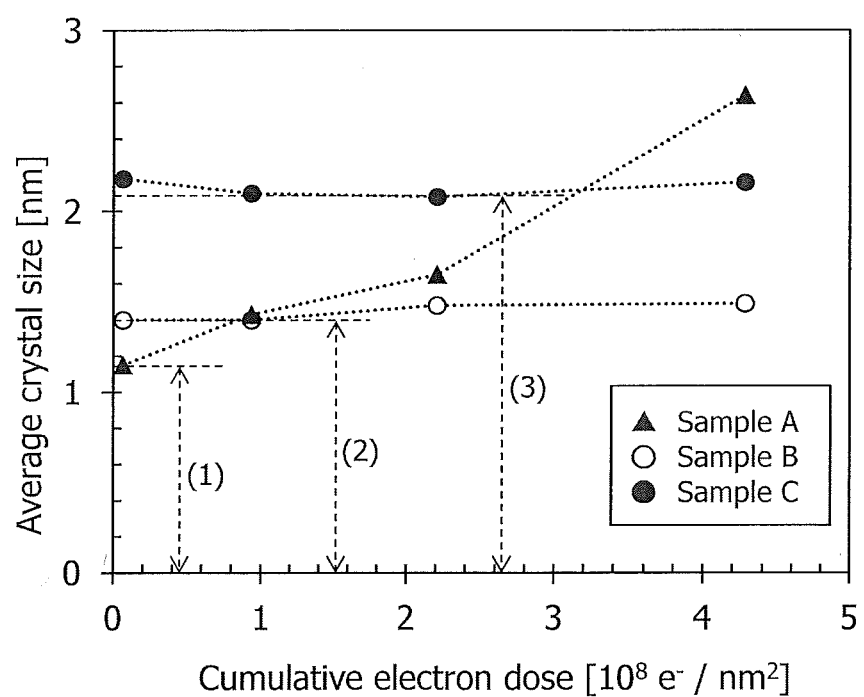
FIG. 48 shows a change of crystal parts of an In—Ga—Zn oxide owing to electron irradiation.

FIG. 48 shows change in the average size of crystal parts (at 22 points to 45 points) in each sample. Note that the crystal part size corresponds to the length of a lattice fringe. FIG. 48 indicates that the crystal part size in the a-like OS increases with an increase in the cumulative electron dose. Specifically, as shown by (1) in FIG. 48, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 48, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga: Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, a microcrystalline oxide semiconductor, and a CAAC-OS, for example.

<Deposition Model>

Examples of deposition models of a CAAC-OS and an nc-OS are described below.

Figure 49A:
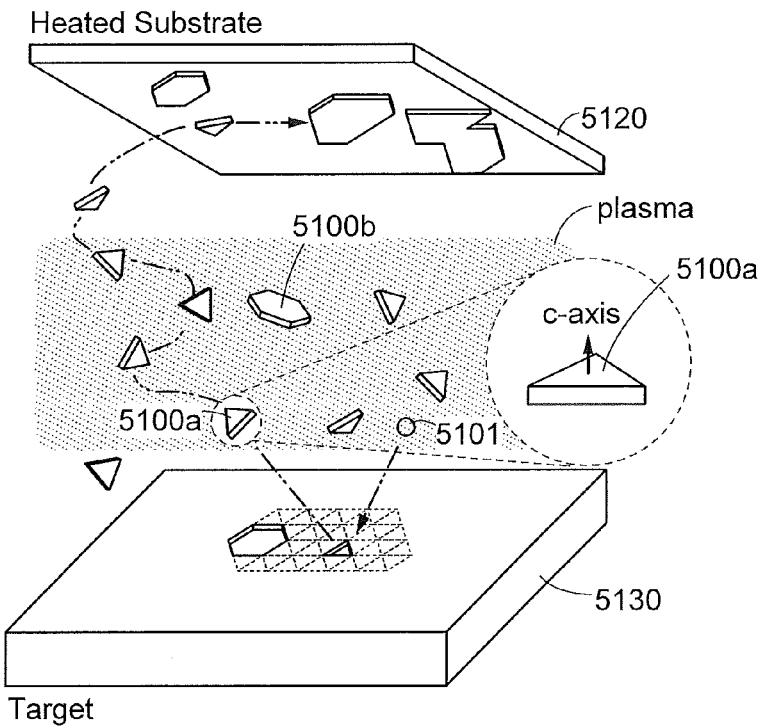
FIGS. 49A and 49B are schematic views illustrating deposition models of a CAAC-OS and an nc-OS.

FIG. 49A is a schematic view of the inside of a deposition chamber where a CAAC-OS is deposited by sputtering.

A target 5130 is attached to a backing plate. A plurality of magnets is provided to face the target 5130 with the backing plate positioned therebetween. The plurality of magnets generates a magnetic field. Sputtering in which the disposition rate is increased by utilizing a magnetic field of magnets is referred to as magnetron sputtering.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation (O$^+$) and an argon cation (Ar$^+$).

Figure 50A:
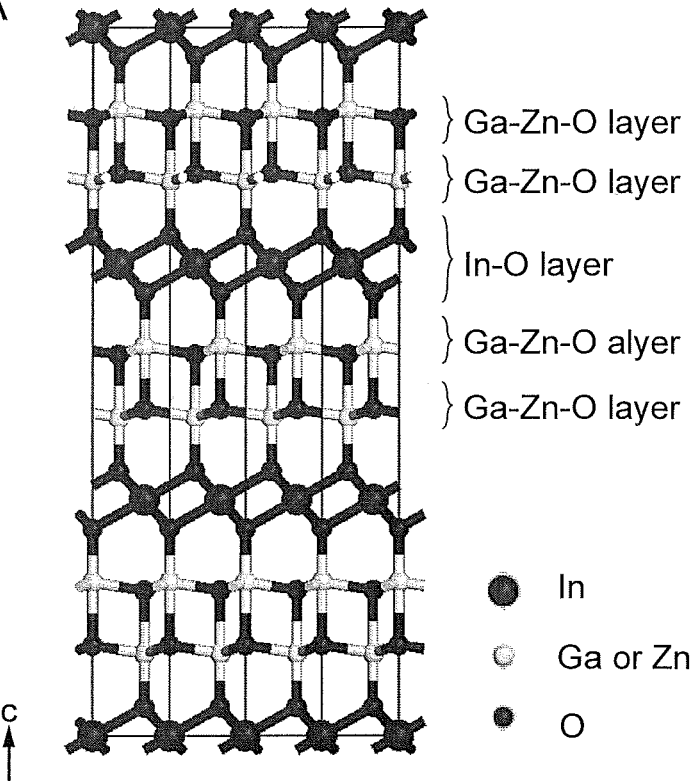
FIGS. 50A to 50C illustrate an $InGaZnO_4$ crystal and a pellet.

Here, the target 5130 has a polycrystalline structure which includes a plurality of crystal grains and in which a cleavage plane exists in at least one crystal grain. FIG. 50A shows a structure of an InGaZnO$_4$ crystal included in the target 5130 as an example. Note that FIG. 50A shows a structure of the case where the InGaZnO$_4$ crystal is observed from a direction parallel to the b-axis. FIG. 50A indicates that oxygen atoms in a Ga—Zn—O layer are positioned close to those in an adjacent Ga—Zn—O layer. The oxygen atoms have negative charge, whereby repulsive force is generated between the two adjacent Ga—Zn—O layers. As a result, the InGaZnO$_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet

5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 50B:
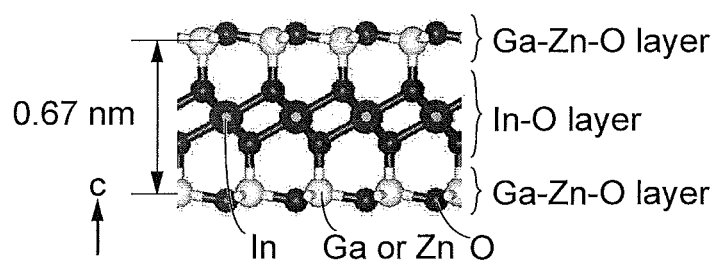
Figure 50C:
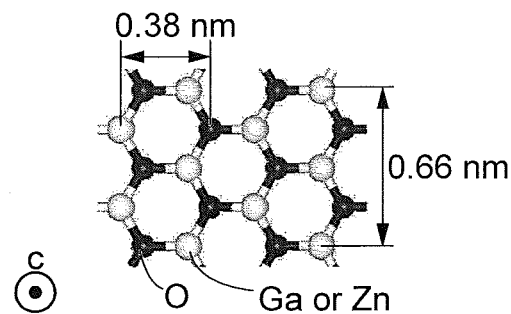

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 48. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 50B is separated. Note that FIG. 50C shows the structure of the separated pellet 5100 which is observed from a direction parallel to the c-axis. The pellet 5100 has a nanometer-sized sandwich structure including two Ga—Zn—O layers and an In—O layer.

The pellet 5100 may receive a charge when passing through the plasma, so that side surfaces thereof are negatively or positively charged. In the pellet 5100, for example, an oxygen atom positioned on its side surface may be negatively charged. When the side surfaces are charged with the same polarity, charges repel each other, and accordingly, the pellet 5100 can maintain a flat-plate (pellet) shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 48 corresponds to the amount of growth in plasma. Here, in the case where the temperature of the substrate 5120 is at around room temperature, the pellet 5100 on the substrate 5120 hardly grows; thus, an nc-OS is formed (see FIG. 49B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 49B:
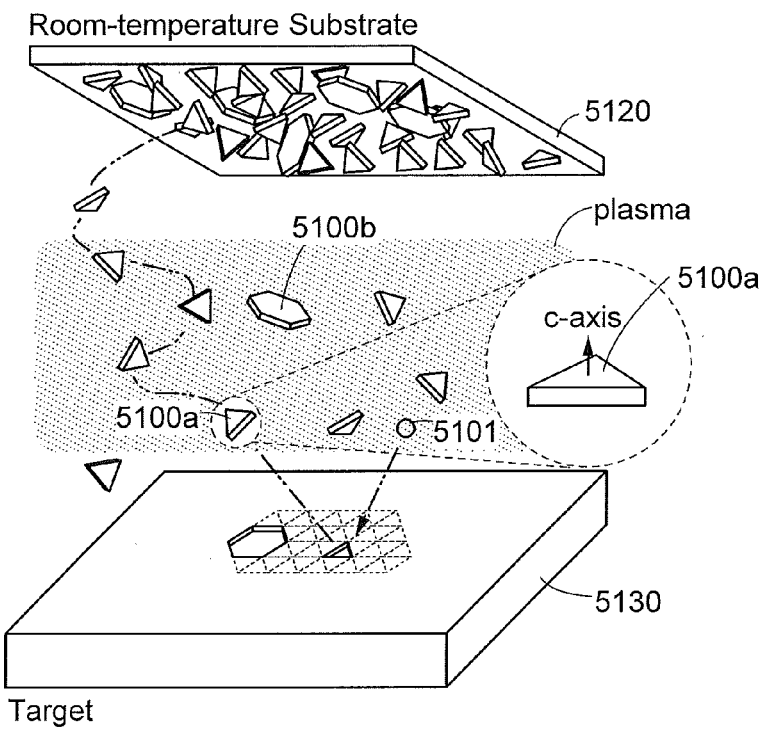

As shown in FIGS. 49A and 49B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 49A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

Figure 51A:
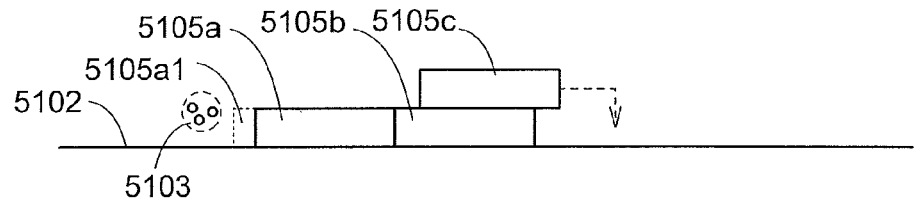
FIGS. 51A to 51D are schematic views illustrating a deposition model of a CAAC-OS.

When the target 5130 is sputtered with the ion 5101, in addition to the pellets 5100, zinc oxide or the like may be separated. The zinc oxide is lighter than the pellet 5100 and thus reaches the top surface of the substrate 5120 before the pellet 5100. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm FIGS. 51A to 51D are cross-sectional schematic views As illustrated in FIG. 51A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 separated from the target together with the zinc oxide is crystallized by heat from the substrate 5120 to form a region 5105a1 on another side surface of the pellet 5105a. Note that the plurality of particles 5103 may contain oxygen, zinc, indium, gallium, or the like.

Figure 51B:
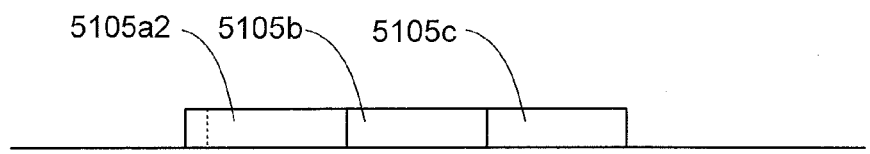

Then, as illustrated in FIG. 51B, the region 5105a1 grows to part of the pellet 5105a to form a pellet 5105a2. In addition, a side surface of the pellet 5105c is in contact with another side surface of the pellet 5105b.

Figure 51C:
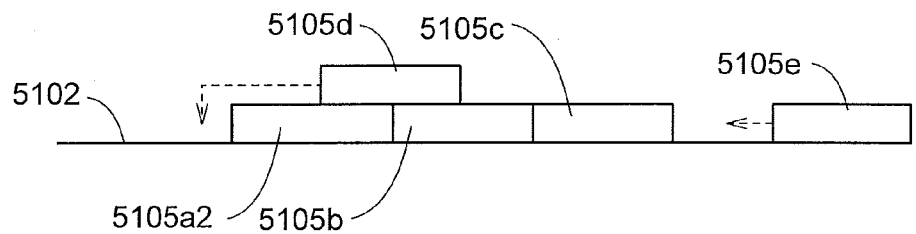

Next, as illustrated in FIG. 51C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 51D:
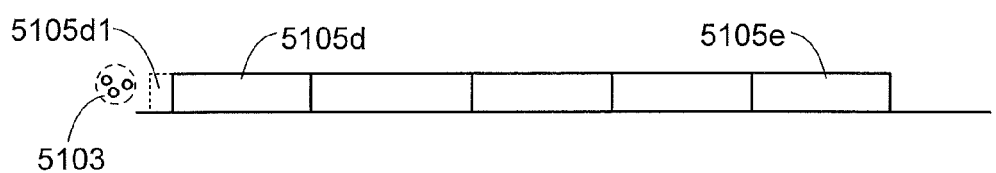

Then, as illustrated in FIG. 51D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 separated from the target 5130 together with the zinc oxide is crystallized by heat from the substrate 5120 to form a region 5105d1 on another side surface of the pellet 5105d.

As described above, deposited pellets are placed to be in contact with each other and then crystal growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 48 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. That is, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure; therefore, a growth mechanism in this case is different from epitaxial growth. In addition, laser crystallization is not needed for formation of a CAAC-OS, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thickness of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases. Note that, even in such a case, owing to intermolecular force, the pellets 5100 are arranged so that a gap between the pellets is as small as possible even on the unevenness surface. Therefore, even when the formation surface has unevenness, a CAAC-OS with high crystallinity can be obtained.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

<Cleavage Plane>

A cleavage plane that has been mentioned in the deposition model of the CAAC-OS is described below.

First, a cleavage plane of a target is described with reference to FIGS. 52A and 52B. FIGS. 52A and 52B show a structure of an $InGaZnO_4$ crystal. Note that FIG. 52A shows a structure of the case where the $InGaZnO_4$ crystal is observed from a direction parallel to the b-axis when the c-axis is in an upward direction. Further, FIG. 52B shows a structure of the case where the $InGaZnO_4$ crystal is observed from a direction parallel to the c-axis.

Energy needed for cleavage at each of crystal planes of the $InGaZnO_4$ crystal is calculated by the first principles calculation. Note that a "pseudopotential" and density functional theory program (CASTEP) using the plane wave basis are used for the calculation. Note that an ultrasoft type pseudopotential is used as the pseudopotential. Further, GGA/PBE is used as the functional. Cut-off energy is 400 eV.

Energy of a structure in an initial state is obtained after structural optimization including a cell size is performed. Further, energy of a structure after the cleavage at each plane is obtained after structural optimization of atomic arrangement is performed in a state where the cell size is fixed.

On the basis of the structure of the InGaZnO$_4$ crystal shown in FIGS. 52A and 52B, a structure cleaved at any one of a first plane, a second plane, a third plane, and a fourth plane is formed and subjected to structural optimization calculation in which the cell size is fixed. Here, the first plane is a crystal plane between a Ga—Zn—O layer and an In—O layer and is parallel to the (001) plane (or the a-b plane) (see FIG. 52A). The second plane is a crystal plane between a Ga—Zn—O layer and a Ga—Zn—O layer and is parallel to the (001) plane (or the a-b plane) (see FIG. 52A). The third plane is a crystal plane parallel to the (110) plane (see FIG. 52B). The fourth plane is a crystal plane parallel to the (100) plane (or the b-c plane) (see FIG. 52B).

Under the above conditions, the energy of the structure at each plane after the cleavage is calculated. Next, a difference between the energy of the structure after the cleavage and the energy of the structure in the initial state is divided by the area of the cleavage plane; thus, cleavage energy which serves as a measure of easiness of cleavage at each plane is calculated. Note that the energy of a structure is calculated based on atoms and electrons included in the structure. That is, kinetic energy of the electrons and interactions between the atoms, between the atom and the electron, and between the electrons are considered in the calculation.

As calculation results, the cleavage energy of the first plane is 2.60 J/m$^2$, that of the second plane is 0.68 J/m$^2$, that of the third plane is 2.18 J/m$^2$, and that of the fourth plane is 2.12 J/m$^2$ (see Table 1).

TABLE 1

| | Cleavage energy [J/m$^2$] |
|---|---|
| First plane | 2.60 |
| Second plane | 0.68 |
| Third plane | 2.18 |
| Fourth plane | 2.12 |

From the calculations, in the structure of the InGaZnO$_4$ crystal shown in FIGS. 52A and 52B, the cleavage energy at the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the cleavage plane is the second plane between a Ga—Zn—O layer and a Ga—Zn—O layer, the InGaZnO$_4$ crystals shown in FIG. 52A can be separated at two planes equivalent to the second plane. Thus, it is considered that when an ion or the like collides with the target, a wafer unit cleaved at the plane with the lowest cleavage energy (we called this unit "pellet") is separated off as the minimum unit. In that cases, a pellet of InGaZnO$_4$ is composed of three layers of a Ga—Zn—O layer, an In—O layer, and a Ga—Zn—O layer.

The cleavage energies of the third plane (crystal plane parallel to the (110) plane) and the fourth plane (crystal plane parallel to the (100) plane (or the b-c plane)) are lower than that of the first plane (crystal plane between the Ga—Zn—O layer and the In—O layer and plane that is parallel to the (001) plane (or the a-b plane)), which suggests that most of the flat planes of the pellets have triangle shapes or hexagonal shapes.

Next, through classical molecular dynamics calculation, on the assumption of an InGaZnO$_4$ crystal having a homologous structure as a target, a cleavage plane in the case where the target is sputtered using argon (Ar) or oxygen (O) is examined. FIG. 53A shows a cross-sectional structure of an InGaZnO$_4$ crystal (2688 atoms) used for the calculation, and FIG. 53B shows a top structure thereof. Note that a fixed layer in FIG. 53A is a layer which prevents the positions of the atoms from moving. A temperature control layer in FIG. 53A is a layer whose temperature is constantly set at a fixed temperature (300 K).

For the classical molecular dynamics calculation, Materials Explorer 5.0 manufactured by Fujitsu Limited. is used. Note that the initial temperature, the cell size, the time step size, and the number of steps are set to be 300 K, a certain size, 0.01 fs, and ten million, respectively. In calculation, an atom to which an energy of 300 eV is applied is made to enter a cell from a direction perpendicular to the a-b plane of the InGaZnO$_4$ crystal under the conditions.

FIG. 54A shows an atomic arrangement when 99.9 picoseconds have passed after argon enters the cell including the InGaZnO$_4$ crystal shown in FIGS. 53A and 53B. FIG. 54B shows an atomic arrangement when 99.9 picoseconds have passed after oxygen enters the cell. Note that in FIGS. 54A and 54B, part of the fixed layer in FIG. 53A is omitted.

According to FIG. 54A, in a period from entry of argon into the cell to when 99.9 picoseconds have passed, a crack is formed from the cleavage plane corresponding to the second plane shown in FIG. 52A. Thus, in the case where argon collides with the InGaZnO$_4$ crystal and the uppermost surface is assumed to be the second plane (the zero-th), a large crack is found to be formed in the second plane (the second).

On the other hand, according to FIG. 54B, in a period from entry of oxygen into the cell to when 99.9 picoseconds have passed, a crack is found to be formed from the cleavage plane corresponding to the second plane shown in FIG. 52A. Note that in the case where oxygen collides with the cell, a large crack is found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a flat-plate-like sputtered particle (pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a way that a defect caused by the damage reacts with oxygen.

Here, difference in size of the pellet depending on atoms which are made to collide is studied.

Figure 55A:
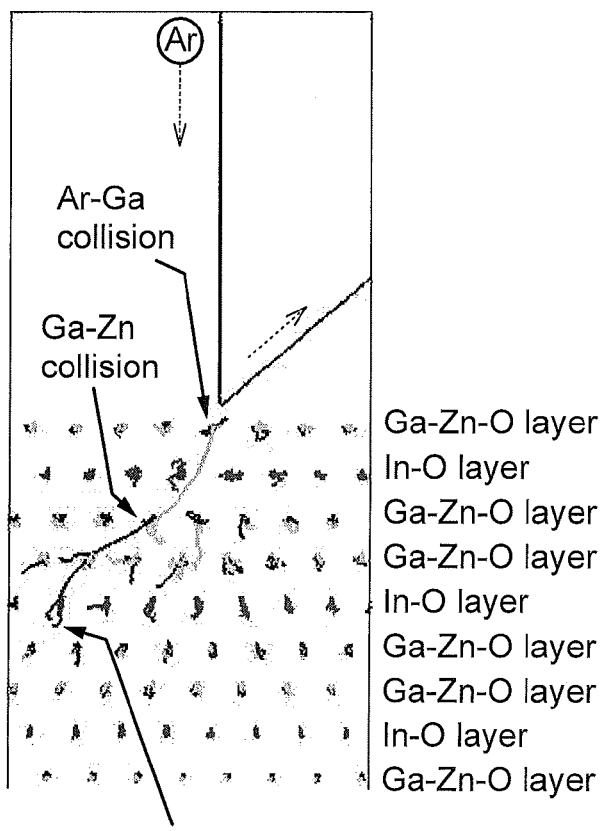
FIGS. 55A and 55B illustrate trajectories of atoms after collision of the atoms.

FIG. 55A shows trajectories of the atoms from 0 picosecond to 0.3 picoseconds after argon enters the cell including the InGaZnO$_4$ crystal shown in FIGS. 53A and 53B. Accordingly, FIG. 55A corresponds to a period from FIGS. 53A and 53B to FIG. 54A.

According to FIG. 55A, when argon collides with gallium (Ga) of the first layer (Ga—Zn—O layer), gallium collides with zinc (Zn) of the third layer (Ga—Zn—O layer) and then, zinc reaches the vicinity of the sixth layer (Ga—Zn—O layer). Note that argon which collides with gallium is sputtered to the outside. Accordingly, in the case where argon collides with the target including the InGaZnO$_4$ crystal, a crack is thought to be formed in the second plane (the second) in FIG. 53A.

Figure 55B:
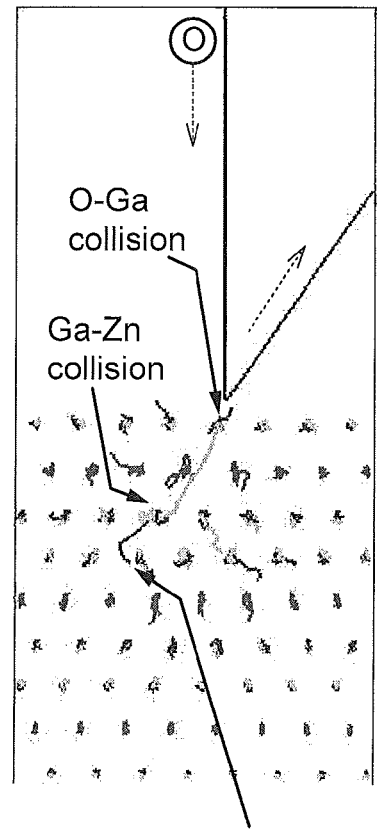

FIG. 55B shows trajectories of the atoms from 0 picosecond to 0.3 picoseconds after oxygen enters the cell including the InGaZnO$_4$ crystal in FIGS. 53A and 53B. Accordingly, FIG. 55B corresponds to a period from FIGS. 53A and 53B and FIG. 54A.

On the other hand, according to FIG. 55B, when oxygen collides with gallium (Ga) of the first layer (Ga—Zn—O layer) counted from the top, the gallium collides with zinc (Zn) of the third layer (Ga—Zn—O layer) counted from the top and then, the zinc does not reach the fifth layer (In—O layer) counted from the top. Note that the oxygen which collides with the gallium is sputtered to the outside. Accordingly, in the case where oxygen collides with the target including the InGaZnO$_4$ crystal, a crack is formed in the second plane (the first) in FIG. 53A.

This calculation also indicates that the InGaZnO$_4$ crystal with which an atom (ion) collides is separated from the cleavage plane.

In addition, a difference in depth of a crack is examined in view of conservation laws. The energy conservation law and the law of conservation of momentum can be represented by the following formula (1) and the following formula (2). Here, E represents energy of argon or oxygen before collision (300 eV), m$_A$ represents mass of argon or oxygen, v$_A$ represents the speed of argon or oxygen before collision, v'$_A$ represents the speed of argon or oxygen after collision, m$_{Ga}$ represents mass of gallium, v$_{Ga}$ represents the speed of gallium before collision, and v'$_{Ga}$ represents the speed of gallium after collision.

$$E = \frac{1}{2}m_A v_A^2 + \frac{1}{2}m_A v_{Ga}^2 \quad \text{[Formula 1]}$$

$$m_A v_A + m_{Ga} v_{Ga} = m'_A v'_A + m'_{Ga} v'_{Ga} \quad \text{[Formula 2]}$$

On the assumption that collision of argon or oxygen is elastic collision, the relationship among V$_A$, V'$_A$, v$_{Ga}$, and v'$_{Ga}$ can be represented by the following formula (3).

$$v'_A - v'_{Ga} = -(v_A - v_{Ga}) \quad \text{[Formula 3]}$$

From the formulae (1), (2), and (3), when v$_{Ga}$ is 0, the speed of gallium v'$_{Ga}$ after collision of argon or oxygen can be represented by the following formula (4).

$$v'_{Ga} = \frac{\sqrt{m_A}}{m_A + m_{Ga}} \cdot 2\sqrt{2E} \quad \text{[Formula 4]}$$

In the formula (4), mass of argon or oxygen is substituted into m$_A$, whereby the speeds of gallium after collision of the atoms are compared. In the case where the argon and the oxygen have the same energy before collision, the speed of gallium in the case where argon collides with the gallium is 1.24 times as high as that in the case where oxygen collides with the gallium. Thus, the energy of the gallium in the case where argon collides with the gallium is higher than that in the case where oxygen collides with the gallium by the square of the speed.

The speed (energy) of gallium after collision in the case where argon collides with the gallium is found to be higher than that in the case where oxygen collides with the gallium. Accordingly, it is considered that a crack is formed at a deeper position in the case where argon collides with the gallium than in the case where oxygen collides with the gallium.

The above calculation shows that when a target including the InGaZnO$_4$ crystal having a homologous structure is sputtered, separation occurs from the cleavage plane to form a pellet. In contrast, when a region of a target having no cleavage plane is sputtered, a pellet is not formed, in which case a sputtered particle at an atomic level that is finer than the pellet is formed. Since the sputtered particle is smaller than the pellet, it is considered that the sputtered particle is removed through a vacuum pump connected to the sputtering apparatus. Thus, it is quite unlikely that when a target including an InGaZnO$_4$ crystal having a homologous structure is sputtered, particles in various sizes and shapes reach the substrate and deposited. The model illustrated in FIG. 49A where sputtered pellets are deposited to form a CAAC-OS is reasonable.

The CAAC-OS deposited in such a manner has a density substantially equal to that of a single crystal OS. For example, the density of the single crystal OS of InGaZnO$_4$ having a homologous structure is 6.36 g/cm$^3$, and the density of the CAAC-OS having substantially the same atomic ratio is approximately 6.3 g/cm$^3$.

Figure 56A:
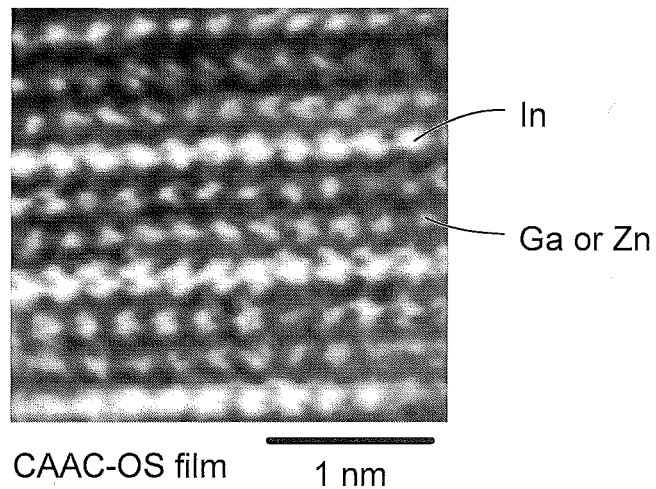
FIGS. 56A and 56B are cross-sectional HAADF-STEM images of a CAAC-OS and a target.
Figure 56B:
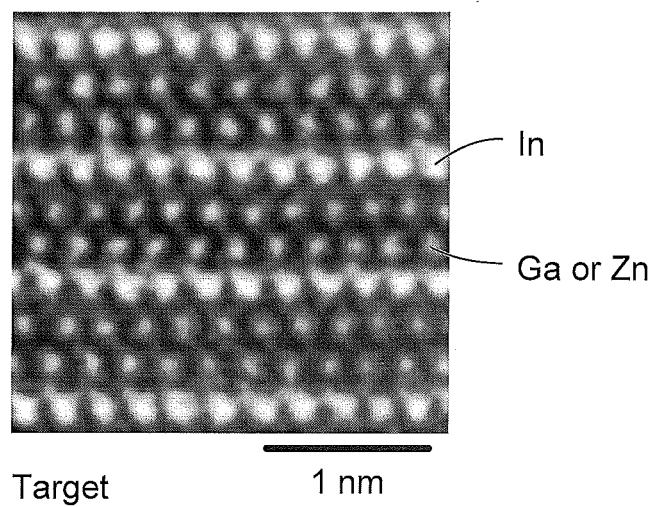

FIGS. 56A and 56B show atomic arrangements of cross sections of an In—Ga—Zn oxide (see FIG. 56A) that is a CAAC-OS deposited by sputtering and a target thereof (see FIG. 56B). For observation of atomic arrangement, a high-angle annular dark field scanning transmission electron microscopy (HAADF-STEM) is used. The contrast of the image of each of the atoms in a HAADF-STEM image is proportional to the square of its atomic number. Therefore, Zn (atomic number: 30) and Ga (atomic number: 31), which have close atomic numbers, are difficult to distinguish from each other. A Hitachi scanning transmission electron microscope HD-2700 is used as the HAADF-STEM.

When FIG. 56A and FIG. 56B are compared, it is found that the CAAC-OS and the target each have a homologous structure and arrangements of atoms in the CAAC-OS correspond to those in the target. This shows that CAAC-OS is formed by transferring the crystal structure of the target as illustrated in the deposition model in FIG. 49A.

<Oxide Semiconductor Film and Metal Oxide Film>

Figure 57:
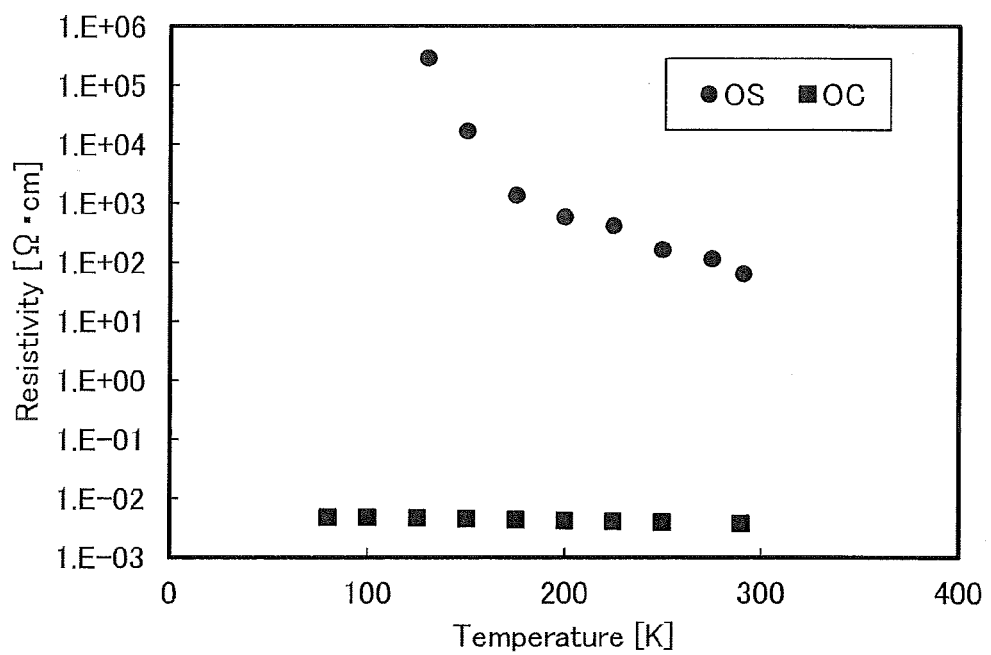
FIG. 57 shows dependence of resistivity on temperature.

Here, the temperature dependence of the resistivities of a film formed using an oxide semiconductor (hereinafter referred to as an oxide semiconductor film (OS)) like the oxide semiconductor film 308b in FIGS. 1A and 1B used in the transistor and a film formed using an oxide conductor (hereinafter referred to as an oxide conductor film (OC)) like the metal oxide film 308c in FIGS. 1A and 1B used as the electrode of the capacitor is described with reference to FIG. 57. In FIG. 57, the horizontal axis represents measurement temperature, and the vertical axis represents resistivity. Measurement results of the oxide semiconductor film (OS) are plotted as circles, and measurement results of the oxide conductor film (OC) are plotted as squares.

Note that a sample including the oxide semiconductor film (OS) is prepared by forming a 35-nm-thick IGZO film over a glass substrate by sputtering using a sputtering target with an atomic ratio of In:Ga:Zn=1:1:1.2, forming a 20-nm-thick IGZO film over the 35-nm-thick In—Ga—Zn oxide film by sputtering using a sputtering target with an atomic ratio of In:Ga:Zn=1:4:5, performing heat treatment at 450° C. in a nitrogen atmosphere and then performing heat treatment at 450° C. in an atmosphere of a mixed gas of nitrogen and oxygen, and forming a silicon oxynitride film over the oxide films by plasma CVD.

A sample including the oxide conductor film (OC) is prepared by forming a 100-nm-thick IGZO film over a glass substrate by sputtering using a sputtering target with an atomic ratio of In:Ga:Zn=1:1:1, performing heat treatment at 450° C. in a nitrogen atmosphere and then performing heat treatment at 450° C. in an atmosphere of a mixed gas of nitrogen and oxygen, and forming a silicon nitride film over the oxide film by plasma CVD.

As can be seen from FIG. 57, the temperature dependence of the resistivity of the oxide conductor film (OC) is lower than the temperature dependence of the resistivity of the oxide semiconductor film (OS). Typically, variation of the resistivity of the oxide conductor film (OC) at temperatures from 80 K to 290 K is more than −20% and less than +20%. Alternatively, variation of the resistivity at temperatures from 150 K to 250 K is more than −10% and less than +10%. In other words, the oxide conductor is a degenerate semiconductor and it is suggested that the conduction band edge agrees with or substantially agrees with the Fermi level. Thus, the oxide conductor film can be used for a resistive element, a wiring, an electrode of a capacitor, a pixel electrode, or a common electrode, for example.

Note that the structures, methods, and the like described in this embodiment can be used as appropriate in combination with any of the structures, methods, and the like described in the other embodiments.

(Embodiment 11)

In the transistor using an oxide semiconductor film, the current in an off state (off-state current) can be made low, as described in Embodiment 2. Accordingly, an electric signal such as a video signal can be held for a longer period and a writing interval can be set longer.

With the use of a transistor with low off-state current, the liquid crystal display device in this embodiment can display images by at least two driving methods (modes). The first driving mode is a conventional driving method of a liquid crystal display device, in which data is rewritten sequentially every frame. The second driving mode is a driving method in which data rewriting is stopped after data writing is executed, i.e., a driving mode with a reduced refresh rate.

Moving images are displayed in the first driving mode. A still image can be displayed without change in image data every frame; thus, it is not necessary to rewrite data every frame. When the liquid crystal display device is driven in the second driving mode in displaying still images, power consumption can be reduced with fewer screen flickers.

A liquid crystal element used in the liquid crystal display device in this embodiment has a large-area capacitor that can accumulate a large capacitance. Thus, it is possible to make the retention period of potentials on the pixel electrode longer and to apply such a driving mode with a reduced refresh rate. In addition, a change in voltage applied to the liquid crystal layer can be inhibited for a long time even when the liquid crystal display device is used in the driving mode with a reduced refresh rate. This makes it possible to prevent screen flickers from being perceived by a user more effectively. Accordingly, the power consumption can be reduced and the display quality can be improved.

An effect of reducing the refresh rate is described here.

The eye strain is divided into two categories: nerve strain and muscle strain. The nerve strain is caused by prolonged looking at light emitted from a liquid crystal display device or blinking images. This is because the brightness stimulates and fatigues the retina and nerve of the eye and the brain.

The muscle strain is caused by overuse of a ciliary muscle which works for adjusting the focus.

Figure 58A:
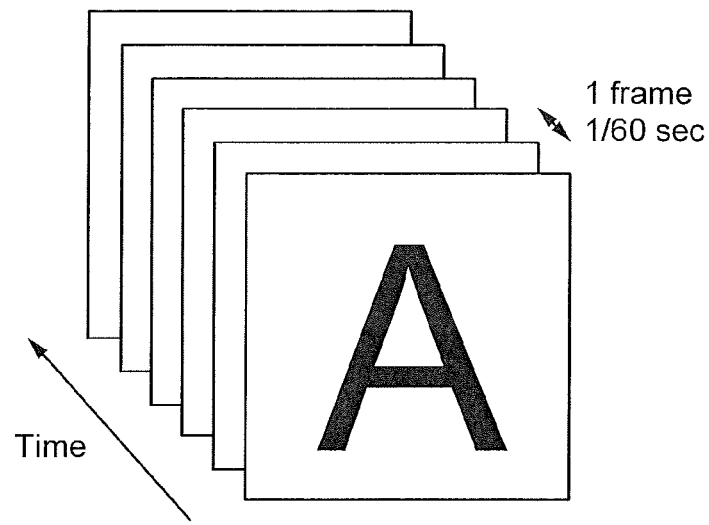
FIGS. 58A and 58B are conceptual views illustrating examples of a driving method of a display device.

FIG. 58A is a schematic diagram illustrating display of a conventional liquid crystal display device. As illustrated in FIG. 58A, for the display of the conventional liquid crystal display device, image rewriting is performed 60 times per second. A prolonged looking at such a screen might stimulate a retina, optic nerves, and a brain of a user and lead to eye strain.

In one embodiment of the present invention, a transistor with an extremely low off-state current (e.g., a transistor using an oxide semiconductor) is used in a pixel portion of a liquid crystal display device. In addition, the liquid crystal element has a large-area capacitor. With these components, leakage of electrical charges accumulated on the capacitor can be inhibited, whereby the luminance of a liquid crystal display device can be kept even at a lower frame frequency.

Figure 58B:
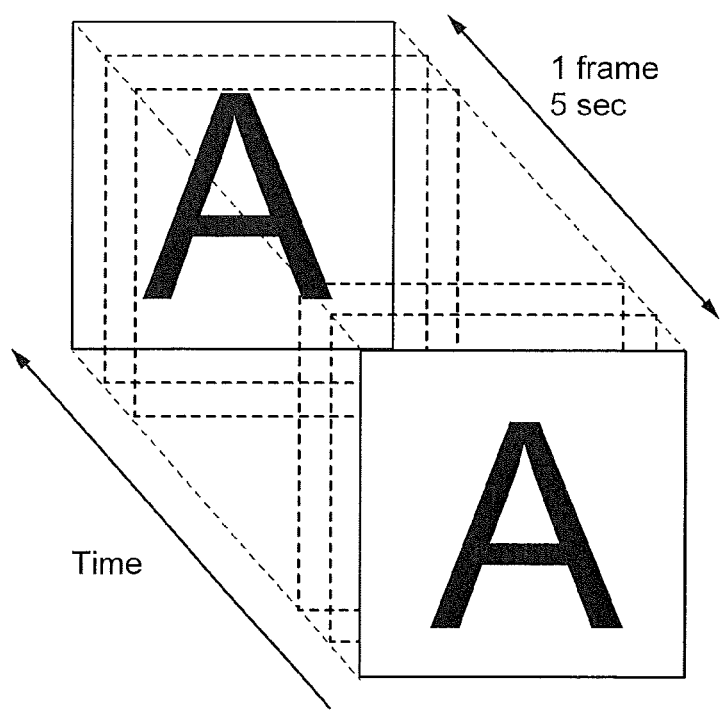

That is, as shown in FIG. 58B, an image can be rewritten as less frequently as once every five seconds, for example. This enables the user to see the same one image as long as possible, so that flickers on the screen recognized by the user are reduced. Consequently, a stimulus to the retina or the nerve of an eye or the brain of the user is relieved, resulting in less nervous fatigue.

One embodiment of the present invention can provide an eye-friendly liquid crystal display device.

Note that the structures, methods, and the like described in this embodiment can be used as appropriate in combination with any of the structures, methods, and the like described in the other embodiments.

(Embodiment 12)

In this embodiment, structural examples of electronic devices each using a display device of one embodiment of the present invention are described. In addition, in this embodiment, a display module using a display device of one embodiment of the present invention is described with reference to FIG. 59.

Figure 59:
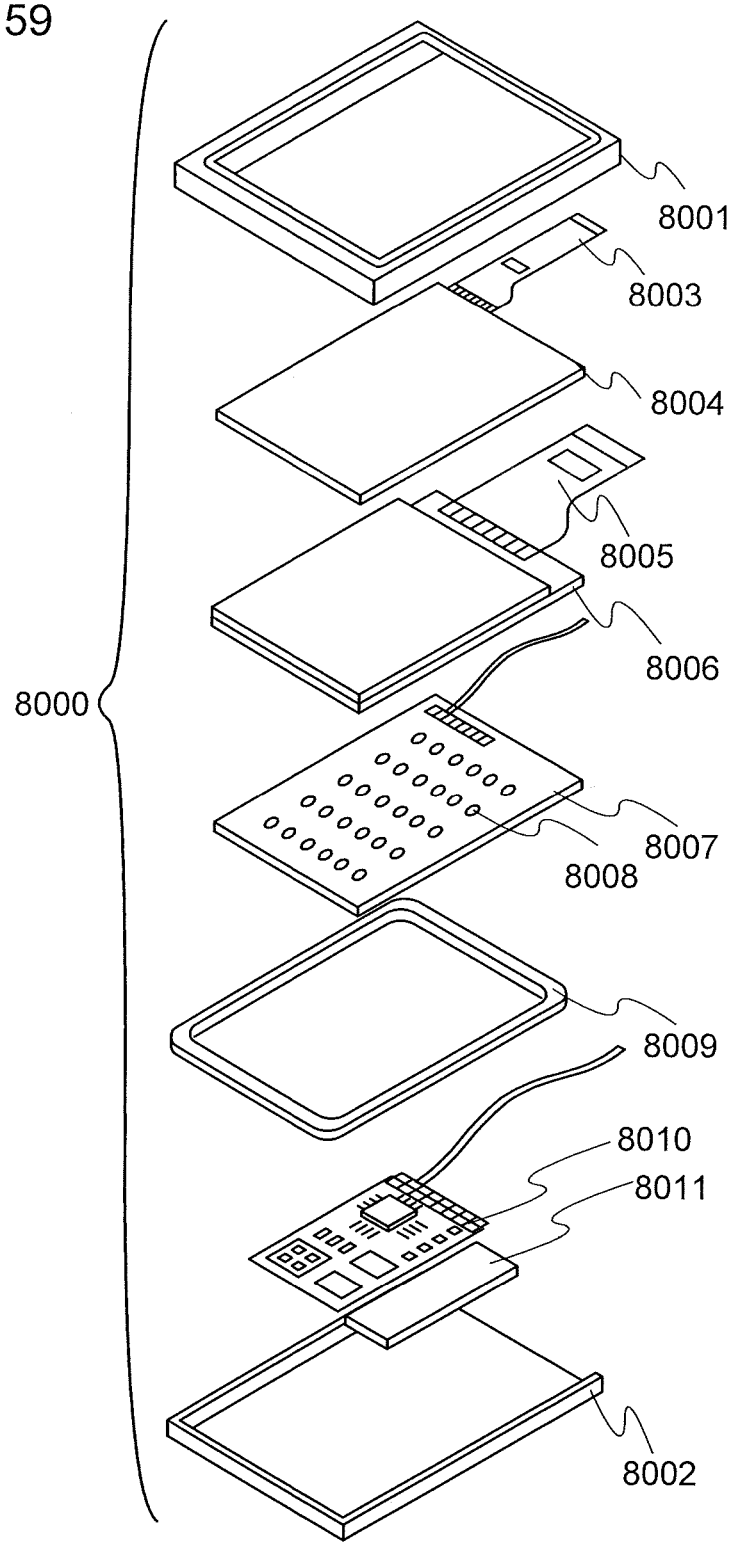
FIG. 59 illustrates a display module.

In a display module 8000 in FIG. 59, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The display device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed so as to overlap with the display panel 8006. A counter substrate (sealing substrate) of the display panel 8006 can have a touch panel function. A photosensor may be provided in each pixel of the display panel 8006 to form an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 can function as a radiator plate too.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 60A to 60D are each an external view of an electronic device including a display device of one embodiment of the present invention.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 60A:
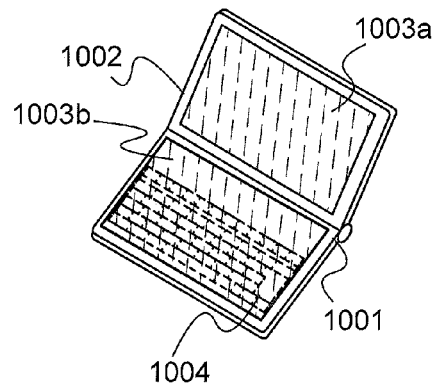
FIGS. 60A to 60D are external views of electronic devices of one embodiment of the present invention.

FIG. 60A illustrates a portable information terminal including a main body 1001, a housing 1002, display portions 1003*a* and 1003*b*, and the like. The display portion 1003*b* is a touch panel. By touching a keyboard button 1004 displayed on the display portion 1003*b*, a screen can be operated, and text can be input. It is needless to say that the display portion 1003*a* may be a touch panel. A liquid crystal panel or an organic light-emitting panel is fabricated using any of the transistors described in the above embodiments as a switching element and used in the display portion 1003*a* or 1003*b*, whereby a highly reliable portable information terminal can be provided.

The portable information terminal illustrated in FIG. 60A can have a function of displaying a variety of information (e.g., a still image, a moving image, and a text image) on the display portion; a function of displaying a calendar, a date, the time, and the like on the display portion; a function of operating or editing the information displayed on the display portion; a function of controlling processing by various kinds of software (programs); and the like. Furthermore, an external connection terminal (an earphone terminal, a USB terminal, or the like), a recording medium insertion portion, and the like may be provided on the back surface or the side surface of the housing.

The portable information terminal illustrated in FIG. 60A may transmit and receive data wirelessly. Through wireless communication, desired book data or the like can be purchased and downloaded from an e-book server.

Figure 60B:
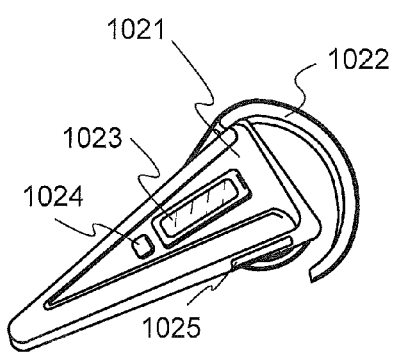

FIG. 60B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is fabricated using any of the transistors described in the above embodiments as a switching element and used in the display portion 1023, whereby a highly reliable portable music player can be provided.

Furthermore, when the portable music player illustrated in FIG. 60B has an antenna, a microphone function, or a wireless communication function and is used with a mobile phone, a user can talk on the phone wirelessly in a hands-free way while driving a car or the like.

Figure 60C:
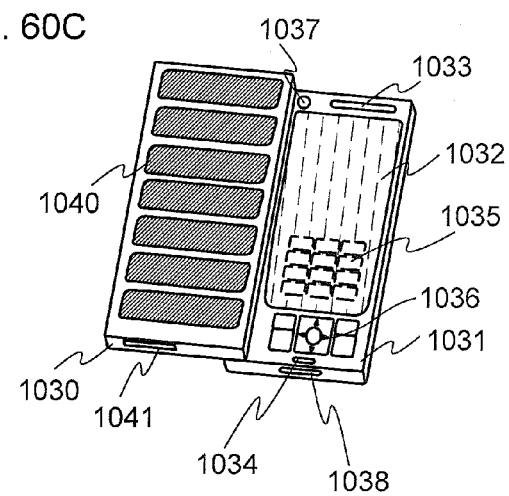

FIG. 60C illustrates a mobile phone, which includes two housings, a housing 1030 and a housing 1031. The housing 1031 includes a display panel 1032, a speaker 1033, a microphone 1034, a pointing device 1036, a camera lens 1037, an external connection terminal 1038, and the like. The housing 1030 is provided with a solar cell 1040 for charging the mobile phone, an external memory slot 1041, and the like. In addition, an antenna is incorporated in the housing 1031. Any of the transistors described in the above embodiments is used in the display panel 1032, whereby a highly reliable mobile phone can be provided.

Furthermore, the display panel 1032 includes a touch panel. A plurality of operation keys 1035 that are displayed as images are indicated by dotted lines in FIG. 60C. Note that a boosting circuit by which voltage output from the solar cell 1040 is increased to be sufficiently high for each circuit is also included.

In the display panel 1032, the direction of display is changed as appropriate depending on the application mode. In addition, the mobile phone has the camera lens 1037 and the display panel 1032 on the same surface side, and thus it can be used as a video phone. The speaker 1033 and the microphone 1034 can be used for videophone calls, recording, and playing sound, etc., as well as voice calls. Moreover, the housings 1030 and 1031 in a state where they are developed as illustrated in FIG. 60C can shift, to a state where one is lapped over the other by sliding. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Furthermore by inserting a recording medium into the external memory slot 1041, a larger amount of data can be stored and moved.

In addition, in addition to the above functions, an infrared communication function, a television reception function, or the like may be provided.

Figure 60D:
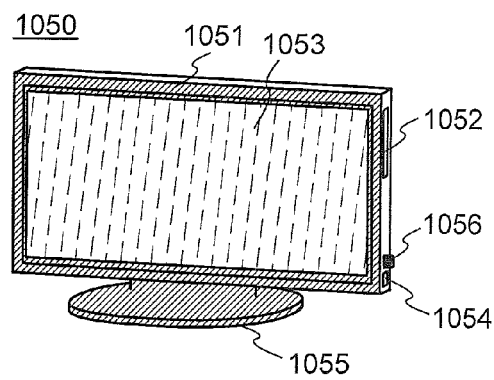

FIG. 60D illustrates an example of a television set. In a television set 1050, a display portion 1053 is incorporated in a housing 1051. Images can be displayed on the display portion 1053. Moreover, a CPU is incorporated in a stand 1055 supporting the housing 1051. Any of the transistors described in the above embodiments is used in the display portion 1053 and the CPU, whereby the television set 1050 can have high reliability.

The television set 1050 can be operated with an operation switch of the housing 1051 or a separate remote controller. In addition, the remote controller may be provided with a display portion for displaying data output from the remote controller.

Note that the television set 1050 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Furthermore, the television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

Furthermore, in the case where the off-state leakage current of the transistor described in the above embodiments is extremely small, when the transistor is used in the external memory 1056 or the CPU, the television set 1050 can have high reliability and sufficiently reduced power consumption.

Note that the structures, methods, and the like described in this embodiment can be used as appropriate in combination with, any of the structures, methods, and the like described in the other embodiments.

This application is based on Japanese Patent Application serial No. 2013-219685 filed with Japan Patent Office on Oct. 22, 2013, Japanese Patent Application serial No. 2013-219678 filed with Japan Patent Office on Oct. 22, 2013, Japanese Patent Application serial No. 2014-038696 filed with Japan Patent Office on Feb. 28, 2014, and Japanese Patent Application serial No. 2014-038564 filed with Japan Patent Office on Feb. 28, 2014, the entire contents of which are hereby incorporated by reference.

What is claimed is:
1. A display device comprising:
a transistor over a substrate, the transistor comprising:
   a gate electrode over the substrate;
   an oxide semiconductor film overlapping with the gate electrode;
   a gate insulating film in contact with one surface of the oxide semiconductor film; and
   a pair of conductive films in electrical contact with the oxide semiconductor film;
an inorganic insulating film over the transistor;
an organic insulating film over the inorganic insulating film;
a capacitor electrically connected to the transistor, the capacitor comprising:
   a metal oxide film over the gate insulating film;
   the inorganic insulating film over the metal oxide film; and
   a first light-transmitting conductive film over the inorganic insulating film, and
a pixel electrode over the organic insulating film and the first light-transmitting conductive film, the pixel electrode including a second light-transmitting conductive film in electrical contact with one of the pair of conductive films and the first light-transmitting conductive film,
wherein the pixel electrode overlaps the first light-transmitting conductive film with the organic insulating film interposed therebetween.

2. The display device according to claim 1, wherein the inorganic insulating film includes an oxide insulating film in contact with the other surface of the oxide semiconductor film and a nitride insulating film in contact with the oxide insulating film.

3. The display device according to claim 2, wherein the metal oxide film is in contact with the nitride insulating film, and contains a same metal element as a metal element contained in the oxide semiconductor film.

4. The display device according to claim 1, wherein the oxide semiconductor film contains at least one of In—Ga oxide, In—Zn oxide, and In-M-Zn oxide, where M is one of Al, Ti, Ga, Y, Zr, Sn, La, Ce, Nd, Sn, and Hf.

5. The display device according to claim 1,
wherein the oxide semiconductor film has a multilayer structure including a first film and a second film, and
wherein an atomic ratio of metal elements in the first film is different from an atomic ratio of metal elements in the second film.

6. The display device according to claim 1, wherein the display device is incorporated in one selected from the group consisting of a portable information terminal, a portable music player, a mobile phone, and a television set.

7. A display device comprising:
a transistor over a substrate, the transistor comprising:
   a gate electrode over the substrate;
   an oxide semiconductor film overlapping with the gate electrode;
   a gate insulating film in contact with one surface of the oxide semiconductor film; and
   a pair of conductive films in electrical contact with the oxide semiconductor film;
an inorganic insulating film over the transistor;
an organic insulating film over the inorganic insulating film;
a capacitor electrically connected to the transistor, the capacitor comprising:
   a metal oxide film over the gate insulating film, and in contact with one of the pair of conductive films;
   the inorganic insulating film over the metal oxide film; and
   a first light-transmitting conductive film over the inorganic insulating film, and
a pixel electrode over the organic insulating film and the first light-transmitting conductive film, the pixel electrode including a second light-transmitting conductive film in electrical contact with the one of the pair of conductive films,
wherein the pixel electrode overlaps the first light-transmitting conductive film with the organic insulating film interposed therebetween.

8. The display device according to claim 7, wherein the inorganic insulating film includes an oxide insulating film in contact with the other surface of the oxide semiconductor film and a nitride insulating film in contact with the oxide insulating film.

9. The display device according to claim 8, wherein the metal oxide film is in contact with the nitride insulating film, and contains a same metal element as a metal element contained in the oxide semiconductor film.

10. The display device according to claim 7, wherein the oxide semiconductor film contains at least one of In—Ga oxide, In—Zn oxide, and In-M-Zn oxide, where M is one of Al, Ti, Ga, Y, Zr, Sn, La, Ce, Nd, Sn, and Hf.

11. The display device according to claim 7,
wherein the oxide semiconductor film has a multilayer structure including a first film and a second film, and
wherein an atomic ratio of metal elements in the first film is different from an atomic ratio of metal elements in the second film.

12. The display device according to claim 7, wherein the display device is incorporated in one selected from the group consisting of a portable information terminal, a portable music player, a mobile phone, and a television set.

* * * * *